United States Patent [19]

Maruyama et al.

[11] Patent Number: 5,515,000
[45] Date of Patent: May 7, 1996

[54] FEED-FORWARD AMPLIFIER OF A TYPE PREVENTING UNWANTED WAVES FROM BEING OUTPUTTED IN THE INITIAL OPERATION

[75] Inventors: Satoshi Maruyama; Fumihiko Kobayashi; Junichi Hasegawa, all of Kawasaki, Japan

[73] Assignee: Fujitsu Limited, Kanagawa, Japan

[21] Appl. No.: 346,637

[22] Filed: Nov. 30, 1994

[30] Foreign Application Priority Data

May 31, 1994 [JP] Japan .................................. 6-118099
Jul. 28, 1994 [JP] Japan .................................. 6-177320

[51] Int. Cl.$^6$ ..................................................... H03F 1/32
[52] U.S. Cl. ................... 330/52; 330/2; 330/151
[58] Field of Search ............................. 330/2, 51, 149, 330/151

[56] References Cited

U.S. PATENT DOCUMENTS 4,926,134  5/1990  Olver .
5,155,448  10/1992  Powell .................... 330/151 X

FOREIGN PATENT DOCUMENTS 0466123   1/1992  European Pat. Off. .
0557929   9/1993  European Pat. Off. .
1198809   8/1989  Japan .
86/04469  7/1986  WIPO .
93/19524  9/1993  WIPO .

OTHER PUBLICATIONS

U.S. application Ser. No. 08/150,087 filed Mar. 17, 1993.

*Primary Examiner*—James B. Mullins

[57] ABSTRACT

A feed-forward amplifier of a type preventing unwanted waves from being outputted in an initial operation suitable to a use in a radio transmitter-receiver in a radio communication system, aimed to reduce a loss in the course from an output of a main amplifier to an output of the apparatus by implementing an output control during the initial operation in the front stage of the main amplifier without switches having been heretofore used, further reducing a power consumption of the apparatus. The feed-forward amplifier of this invention is provided with a control unit which controls a pilot signal variably attenuating unit so as to gradually decrease an attenuation quantity of a pilot signal with use of results of detection conducted by a power source start-up detecting means and a main signal detecting means as timing information after a start-up of a power source of a main amplifier, and controls a main signal variably attenuating unit so as to gradually decrease an attenuation quantity of a main signal after the pilot signal variable attenuating unit has decreased the attenuation quantity of the pilot signal.

16 Claims, 33 Drawing Sheets

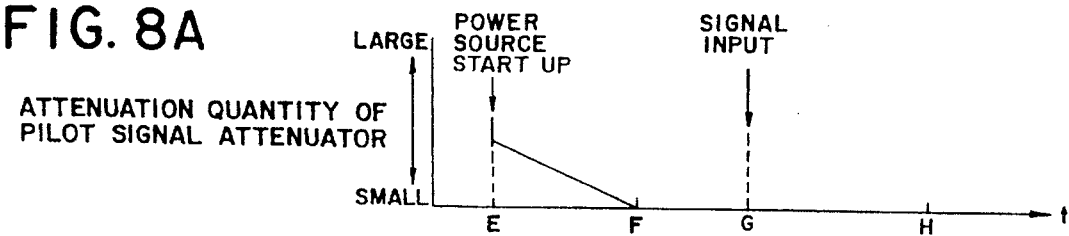
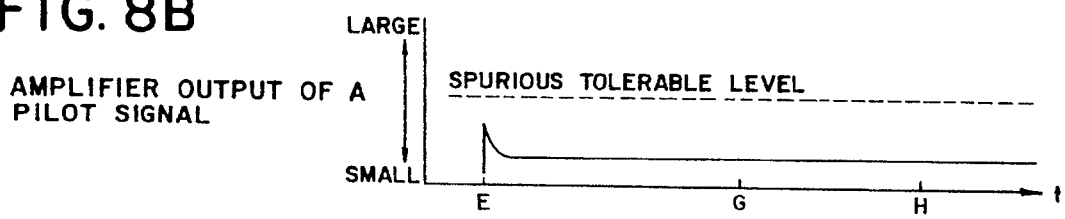
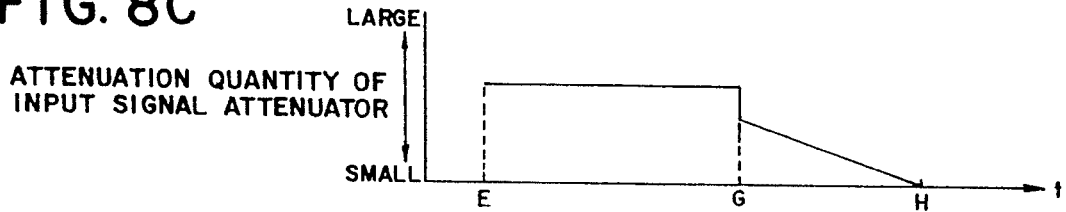
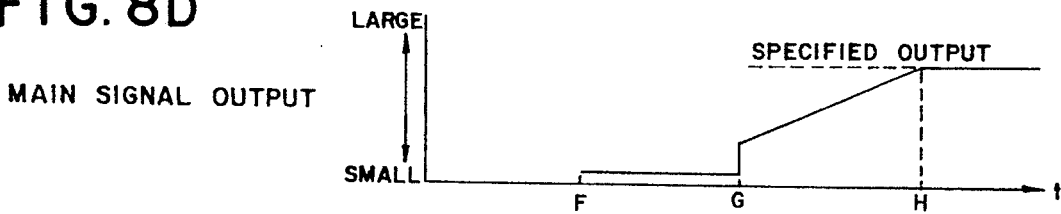
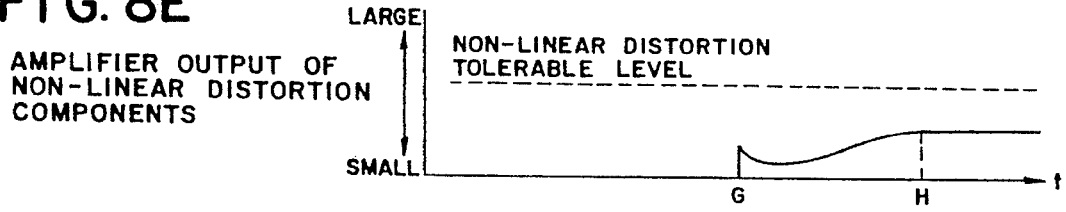

CHARACTERISTIC OF MAIN SIGNAL CANCEL DETECTOR

CHARACTERISTIC OF AN OUTPUT DETECTOR

CHARACTERISTIC OF MAIN SIGNAL CANCEL DETECTOR

FEED-FORWARD AMPLIFIER OF A TYPE PREVENTING UNWANTED WAVES FROM BEING OUTPUTTED IN THE INITIAL OPERATION

BACKGROUND OF THE INVENTION

The present invention relates to a feed-forward amplifier of a type preventing unwanted waves from being outputted in an initial operation of the amplifier, suitable for use in a radio transmitter-receiver in a radio communication system.

In recent years, an amplifier of a feed-forward type (a feed-forward amplifier) has been developed for the purpose of remedy for non-linear distortion appearing in the amplifier. This amplifier, however, could not ensure a sufficient distortion compensating quality until a feed-forward control becomes stable after a start-up of the amplifier, and is not able to sufficiently suppress a pilot signal used for control.

The unwanted waves are contained in an output of the amplifier, causing signal waves at unnecessary frequencies to be outputted. In particular, if the feed-forward amplifier is used as a power amplifier for a radio transmitter-receiver, it is necessary to provide a function to prevent such unwanted waves from being outputted in an initial operation after a start-up of the system until the feed-forward control becomes stable.

A typical feed-forward amplifier includes, for example, a switch disposed at an output of the amplifier functioning to prevent such unwanted waves from being outputted. During an initial operation from a start-up of the amplifier until the feed-forward control becomes stable, the switch is OFF, in order to prevent unwanted waves from being outputted. After the feed-forward control becomes stable, the switch is controlled to be ON to start a transmission.

If such typical feed-forward amplifier is used as a power amplifier in a radio transmitter-receiver, a transmitting output level of the power amplifier is specified by an output of the radio transmitter-receiver. If a switch to prevent unwanted waves from being outputted is interposed somewhere on the side of an output of the amplifier, it is necessary to increase an output level of the amplifier in order to compensate for a power loss caused by the interposition of the switch. The increased output level next, causes an increase in a saturated output level of the amplifier and an increase in power consumption.

SUMMARY OF THE INVENTION

To overcome the above problem, an object of the present invention is to provide a feed-forward amplifier where an output control during an initial operation of the apparatus is implemented in a first stage of a main amplifier without a switch heretofore employed, thereby reducing a power loss in the course from an output of the main amplifier to an output of the apparatus and reducing power consumption ill the apparatus.

The present invention therefore provides a feed-forward amplifier of the type preventing unwanted waves from being outputted in an initial operation, which amplifier includes a main amplifier amplifying a main signal in a main signal path, a distortion extracting loop circuit supplying a pilot signal fed from a pilot signal generator to said main signal path and generating a main signal cancelling signal to cancel said main signal outputted from said main amplifier, and a distortion eliminating loop circuit for obtaining a signal in which components of said main signal in an output of said main amplifier have been cancelled on the basis of an output of said main amplifier and said main signal cancelling signal fed from said distortion extracting loop circuit in a rear stage of said main amplifier and outputting the components of said main signal obtained from a signal in said main signal path in a rear stage of said main amplifier using said signal in which tile components of said main signal have been cancelled, said feed-forward amplifier comprising a pilot signal variably atttenuating unit for attenuating said pilot signal supplied to said main signal path in a front stage of said main amplifier, a main signal variably attenuating unit for attenuating said main signal in said main signal path in said front stage of said main amplifier, a power source start-up detecting means for detecting a start-up of a power source of said main amplifier, a main signal detecting means for detecting an input of said main signal, and a control unit for controlling said pilot signal variably attenuating unit so as to gradually decrease an attenuation quantity of the pilot signal using results of detection by said power source start-up detecting means and said main signal detecting means as timing information after a start-up of said power source of said main amplifier, and controlling said main signal variably attenuating unit so as to gradually decrease an attenuation quantity of the main signal after said pilot signal variably attenuating unit has decreased an attenuation quantity of the pilot signal.

The feed-forward amplifier of the type preventing unwanted waves from being outputted in an initial operation according to the present invention, may also comprise a pilot signal variably attenuating unit for attenuating said pilot signal supplied to said main signal path in a front stage of said main amplifier, a main signal variably attenuating unit for attenuating said main signal in said main signal path in said front stage of said main amplifier, a power source start-up detecting means for detecting a start-up of a power source of said main amplifier, a first main signal detecting means having a main signal cancelling signal detecting means detecting a main signal cancelling signal fed from said distortion extracting loop circuit and a judging means for judging an input of the main signal when the main signal cancelling signal detected by said main signal cancelling signal detecting means exceeds a fourth reference value set to a level smaller than a signal cancelling marginal level at the time of a minimum input, a second main signal detecting means having an output signal detecting means for detecting an output signal from the rear stage of said main amplifier and a judging means for judging an input of the main signal when the output signal detected by said output signal detecting means exceeds a fifth reference value set to a level smaller than a level of the output signal at the time of the minimum input, an initial operation control unit for controlling said pilot signal variably attenuating unit so as to gradually decrease an attenuation quantity of the pilot signal using results of detection by said power source start-up detecting means and said first main signal detecting means after a start-up of said power source of said main amplifier, and controlling said main signal variably attenuating unit so as to gradually decrease an attenuation quantity of the main signal after said pilot signal variably attenuating unit has decreased the attenuation quantity of the pilot signal, and a main control unit for controlling said distortion extracting loop circuit and said distortion eliminating loop circuit on the basis of a result of detection by said second main signal detecting means after a control by said initial operation control unit while watching a failure condition of said main amplifier.

The feed-forward amplifier of the type preventing unwanted waves from being outputted in an initial operation, of another embodiment comprises a pilot signal variably attenuating unit for attenuating said pilot signal supplied to said main signal path in a front stage of said main amplifier, a main signal variably attenuating unit for attenuating said main signal in said main signal path in said front stage of said main amplifier, a power source start-up detecting means for detecting a start-up of a power source of said main amplifier, a first main signal detecting means having a main signal cancelling signal detecting means for detecting a main signal cancelling signal fed from said distortion extracting loop circuit, and a judging means for judging an input of the main signal when the main signal cancelling signal detected by said main signal cancelling signal detecting means exceeds a sixth reference value set to a level smaller than an initial operation level set larger than a signal cancellation marginal level at the time of a minimum input, a second main signal detecting means having an output signal detecting for detecting an output signal from the rear stage of said main amplifier and a judging for judging an input of the main signal when the output signal detected by said output signal detecting means exceeds a seventh reference value set to a level smaller than a level of the output signal at the time of the minimum input, an initial operation control unit for altering a control setting mode in said distortion extracting loop circuit so that said initial operation level is a signal cancelling marginal level after said first main signal detecting means has detected an input of the main signal with use of results of detection by said power source start-up detecting means and said first main signal detecting means, under such condition, said initial operation control unit controlling said pilot signal variably attenuating unit so as to gradually decrease an attenuation quantity of the pilot signal, and controlling said main signal variably attenuating unit so as to gradually decrease an attenuation quantity of the main signal after said pilot signal variably attenuating unit has decreased the attenuation quantity of the pilot signal, and a main control unit for controlling said distortion extracting loop circuit and said distortion eliminating loop circuit on the basis of a result of detection by said second main signal detecting means after a control by said initial operation control unit, while watching a failure condition of said main amplifier.

As above, in the feed-forward amplifier according to this invention, an output control of the pilot signal and the main signal in the initial operation is conducted in the front stage of the main amplifier, thereby reducing a power loss in the course from the output of the main amplifier to the output of the apparatus, reducing a power consumption in the apparatus, and enabling the initial operation without unwanted waves exceeding the specified value being outputted from the apparatus.

Further, in the feed-forward amplifier according to this invention, the pilot signal variably attenuating unit is disposed in a part on a side of the output of the pilot signal generator branched from the main signal path in the front stage of the main amplifier, thereby reducing a loss in the main signal path, and decreasing a gain of the main amplifier and a delay time in the delay circuit.

Still further, in the feed-forward amplifier according to this invention, the attenuation control of the pilot signal may be carried out immediately after a start-up of the power source so that it is necessary to operate only the main signal variably attenuating unit upon a signal input, thereby decreasing a time required from the signal input until the feed-forward control becomes stable.

Still further, in the feed-forward amplifier according to this invention, the control unit disposed in the front stage of the main amplifier carries out the output control of the pilot signal and the main signal in the initial operation, thereby reducing a loss in the course from the output of the main amplifier to the output of the apparatus and a power consumption of the apparatus, and enabling the initial operation of the feed-forward amplifier without unwanted waves above the specified value being outputted from the amplifier.

Still further, in the feed-forward amplifier according to this invention, the attenuating control of the pilot signal may be carried out immediately after a start-up of the power source so that it is necessary to operate only the input signal variably attenuating unit upon a signal input, thereby reducing a time required from the signal input until the feed-forward control becomes stable.

Still further, in the feed-forward amplifier according to this invention, the main signal detecting means detects presence of an input of the main signal so that, when the input of the main signal is interrupted in the normal operation, the main signal cancelling control is deviated from the optimal point for the control under the main signal interrupted condition, thereby preventing an increase in transmitted output distortion in a transient operation upon a re-input of the main signal.

Still further, in the feed-forward amplifier according to this invention, it is possible to omit the input signal detecting means since the main signal detecting means may be served to detect an input of the main signal. This contributes to a reduction in dimensions of the apparatus.

Still further, in the feed-forward amplifier according to this invention, employment of the main signal cancelling signal detecting means and the output signal detecting means may accomplish a highly-accruate detection of an input of the main signal. This contributes to a reduction in dimensions, and an improvement in performance of the apparatus.

Still further, in the feed-forward amplifier according to this invention, it is possible to employ a failure alarming means. The employment of the failure alarming means enables a highly-accurate detection of an input of the main signal while watching a trouble of the apparatus.

BRIEF DESCRIPTION OF THE DRAWING

FIGS. 8A through 8E are a timing chart illustrating the operation of the feed-forward amplifier according to the first embodiment;

DESCRIPTION OF THE PREFERRED EMBODIMENTS (a) Description of Aspects of the Invention FIG. 1 is a block diagram of a feed-forward amplifier according to a first aspect of this invention, where reference numeral 1 denotes a main amplifier which amplifies a main signal in a main signal path.

Figure 1:
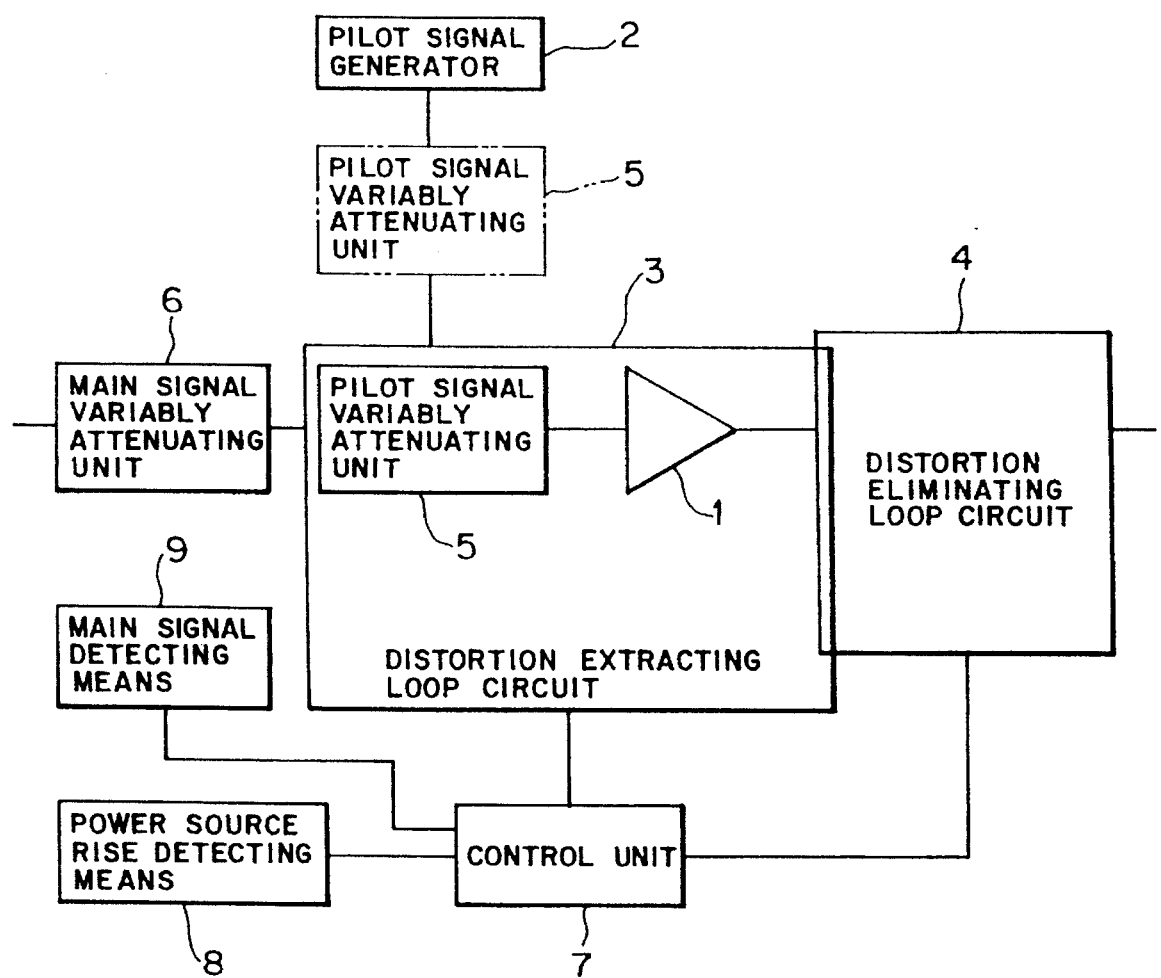
FIG. 1 is a block diagram of a feed-forward amplifier illustrating a first aspect of this invention.

Reference numeral 3 denotes a distortion extracting loop circuit which supplies a pilot signal fed from a pilot signal generator 2 to the main signal path, and generates a main signal cancelling signal to cancel the main signal outputted from the main amplifier 1.

Reference numeral 4 denotes a distortion eliminating loop circuit which obtains a signal, in which components of the main signal in an output of the main amplifier 1 have been cancelled on the basis of an output of the main amplifier 1 and the main signal cancelling signal from the distortion extracting loop circuit 3, and outputs components of the main signal obtained from a signal in the main signal path in the rear stage of the main amplifier 1.

The feed-forward amplifier according to the first aspect of this invention further comprises a pilot signal variably attenuating unit 5 which can attenuate the pilot signal fed to the main signal path in the front stage of the main amplifier 1, a main signal variably attenuating unit 6 which can attenuate the main signal in the main signal path in the front stage of the main amplifier 1, a power source start-up detecting means 8 which detects a start-up of a power source of the main amplifier 1, a main signal detecting means 9 which detects an input of the main signal, and a control unit 7 which controls the pilot signal variably attenuating unit 5 so as to gradually decrease an attenuation quantity of the pilot signal after a start-up of the power source of the main amplifier 1 with use of results of detection conducted by the power source start-up detecting means 8 and the main signal detecting means 9 as timing information, then controls the main signal variably attenuating unit 6 so as to gradually decrease an attenuation quantity of the main signal after the pilot signal variably attenuating unit 5 has decreased an attenuation quantity of the pilot signal.

The pilot signal variably attenuating unit 5 is positioned in the main signal path in the front stage of the main amplifier as indicated by a solid line in FIG. 1. It is also possible to position the pilot signal variably attenuating unit 5 in a part on a side of the output of the pilot signal generator 2 branched from the main signal path in the front stage of the main amplifier 1 as indicated by a dot-dash line in FIG. 1.

In the feed-forward amplifier according to the first aspect of this invention, the control unit 7 includes a pilot signal attenuation quantity control means which controls the pilot signal variably attenuating unit 5 so as to gradually decrease an attenuation quantity of the pilot signal when the power source start-up detecting means detects a start-up of the power source of the main amplifier 1 and the main signal detecting means detects an input of the main signal, and a main signal attenuation quantity control means which controls the main signal variably attenuating unit 6 so as to gradually decrease an attenuation quantity of the main signal after the pilot signal attenuation quantity control means has decreased an attenuation quantity of the pilot signal.

The control unit 7 may, otherwise, include a pilot signal attenuation quantity control means which controls the pilot signal variably attenuating unit 5 so as to gradually decrease an attenuation quantity of the pilot signal when the power source start-up detecting means 8 detects a start-up of the power source of the main amplifier 1, and a main signal attenuation quantity control means which controls the main signal variably attenuating unit 6 so as to gradually decrease an attenuation quantity of the main signal when the main signal detecting means 9 detects an input of the main signal after the pilot signal attenuation quantity control means has initiated an operation to decrease an attenuation quantity of the pilot signal.

In the above case, if the main signal detecting means 9 detects an input of the main signal before an attenuation quantity of the pilot signal decreased by the pilot signal attenuation quantity control means drops below a predetermined value, the main signal attenuation quantity control means so controls the main signal variably attenuating unit 6 as to gradually decrease an attenuation quantity of the main signal after an attenuation quantity of the pilot signal decreased by the pilot signal attenuation quantity control means has dropped below the predetermined value.

The power source start-up detecting means 8 may be formed as a power-on reset circuit which detects a start-up of the power source of the main amplifier 1, and the main signal detecting means 9 may be formed as a main signal detecting circuit which detects an input of the main signal. The control unit 7 may include a pilot signal attenuation quantity control circuit having a first switch-type control circuit and a first time-constant circuit controls the pilot signal variably attenuating unit so as to gradually decrease an attenuation quantity of the pilot signal when the power-on reset circuit detects a start-up of the power source of the main amplifier i and the main signal detecting circuit detects an input of the main signal, and a main signal attenuation quantity control circuit having a second switch-type control circuit and a second time-constant circuit controls the main signal variably attenuating unit 6 so as to gradually decrease an attenuation quantity of the main signal after the pilot signal attenuation quantity control unit has decreased an attenuation quantity of the pilot signal. Otherwise, the power source start-up detecting means 8 may be formed as a power-on reset circuit which detects a start-up of the power source, and the main signal detecting means 9 may be formed as a main signal detecting circuit which detects an input of the main signal. The control unit 7 may include a pilot signal attenuation quantity control circuit having a first switch-type control circuit and a first time-constant circuit controls the pilot signal variably attenuating unit 5 so as to gradually decrease an attenuation quantity of the pilot signal when the power-on reset circuit detects a start-up of the power source of the main amplifier 1, and a main signal attenuation quantity control circuit having a second switch-type control circuit and a second time-constant circuit controls the main signal variably attenuating unit 6 so as to gradually decrease an attenuation quantity of the main signal when the main signal detecting circuit detects an input of the main signal after the pilot signal attenuation quantity control circuit has decreased an attenuation quantity of the pilot signal.

In the above case, if the main signal detecting circuit detects an input of the main signal before an attenuation quantity of the pilot signal decreased by the pilot signal attenuation quantity control circuit drops below a predetermined value, the main signal attenuation quantity control circuit so controls the main signal variably attenuating unit 6 as to gradually decrease an attenuation quantity of the main signal after the attenuation quantity of the pilot signal decreased by the pilot signal attenuation quantity control circuit has dropped below the predetermined value.

The main signal detecting means 9 may have an input signal detecting means which detects an input signal inputted to the front stage of the main amplifier 1, a judging means which judges that the main signal has been inputted when the input signal detected by the input signal detecting means exceeds a first reference value set to a level smaller than a level of the input signal at the time of the minimum input. The main signal detecting means 9 may also have an output signal detecting means which detects an output signal from the rear stage of the main amplifier 1, and a judging means which judges that the main signal has been inputted when the output signal detected by the output signal detecting means exceeds a second reference value set to a level smaller than a level of the output signal at the time of the minimum input. The main signal detecting means 9 may also have a main signal cancelling signal detecting means which detects a main signal cancelling signal fed from the distortion extracting loop circuit, and a judging means which judges that the main signal has been inputted when the main signal cancelling signal detected by the main signal cancelling signal detecting means exceeds a third reference value set to a level smaller than a signal cancelling marginal level at the time of the minimum input.

In the feed-forward amplifier according to the first aspect, as shown in FIG. 1, the distortion extracting loop circuit 3 supplies the pilot signal fed from the pilot signal generator 2 to the main signal path and generates the main signal cancelling signal to cancel the main signal outputted from the main amplifier 1. The distortion eliminating loop circuit 4 disposed in the rear stage of the main amplifier 1 obtains a signal in which components of the main signal in an output of the main amplifier 1 have been cancelled on the basis of the output of the main amplifier 1 and the main signal cancelling signal from the distortion extracting loop circuit 3, and outputs the components of the main signal obtained from a signal in the main signal path in the rear stage of the main amplifier 1, with use of the signal in which the components of the main signal have been cancelled.

The control unit 7 controls the pilot signal variably attenuating unit 5 so as to gradually decrease an attenuation quantity of the pilot signal with use of results of detection conducted by the power source stat-up detecting means and the signal detecting means 9 as timing information after a start-up of the power source of the main amplifier 1, then controls the main signal variably attenuating unit 6 so as to gradually decrease an attenuation quantity of the main signal after an attenuation quantity of the pilot signal has been decreased, thereby preventing unwanted waves from being outputted in an initial operation of the feed-forward amplifier.

In the feed-forward amplifier according to this invention, when the power source start-up detecting means 8 detects a start-up of the power source and the main signal detecting means 9 detects an input of the main signal, the control unit 7 so controls the pilot signal variably attenuating unit 5 as to gradually decrease an attenuation quantity of the pilot signal. After the pilot signal attenuation quantity control means has decreased an attenuation quantity of the pilot signal, the main signal attenuation quantity control means so controls the main signal variably attenuating unit 6 as to gradually decrease an attenuation quantity of the main signal, thereby preventing unwanted waves from being outputted in the initial operation of the feed-forward amplifier.

In the feed-forward amplifier according to this invention, when the power source start-up detecting means 8 detects a start-up of the power source of the main amplifier 1, the pilot signal attenuation quantity control means so controls the pilot signal variably attenuating unit 5 as to gradually decrease an attenuation quantity of the pilot signal, the main signal attenuation quantity control means then so controls the main signal variably attenuating unit 6 as to gradually decrease an attenuation quantity of the main signal when the main signal detecting means detects an input of the main signal after the pilot signal attenuation quantity control means has initiated an operation to decrease an attenuation quantity of the pilot signal.

In the above case, if the main signal detecting means detects an input of the main signal before an attenuation quantity of the pilot signal decreased by the pilot signal attenuation quantity control means drops below a predetermined value, the main signal attenuation quantity control means so controls the main signal variably attenuating unit 6 as to gradually decrease an attenuation quantity of the main signal after an attenuation quantity of the pilot signal decreased by the pilot signal attenuation quantity control means has dropped below the predetermined value.

In the feed-forward amplifier according to this invention, when the power-on reset circuit detects a start-up of the power source of the main amplifier 1 and the main signal detecting circuit detects an input of the main signal, the control unit 7 so controls the pilot signal variably attenuating unit 5 as to gradually decrease an attenuation quantity of the pilot signal, then so controls the main signal variably attenuating unit 6 as to gradually decrease an attenuation quantity of the main signal after the pilot signal attenuation quantity control circuit has decreased an attenuation quantity of the pilot signal, thereby preventing unwanted waves from being outputted in the initial operation of the feed-forward amplifier.

In the feed-forward amplifier according to this invention, when the power-on reset circuit detects a start-up of the power source of the main amplifier 1, the pilot signal variably attenuating unit 5 is so controlled as to gradually decrease an attenuation quantity of the pilot signal. On the other hand, when the main signal detecting circuit detects an input of the main signal after the pilot signal attenuation quantity control circuit has initiated an operation to decrease an attenuation quantity of the pilot signal, the main signal attenuation quantity control circuit so controls the main signal variably attenuating unit 6 as to gradually decrease an attenuation quantity of the main signal.

In the above case, if the main signal detecting circuit detects an input of the main signal before an attenuation quantity of the pilot signal decreased by the pilot signal attenuation quantity control circuit drops below a predetermined value, the main signal attenuation quantity control circuit so controls the main signal variably attenuating unit 6 as to gradually decrease an attenuation quantity of the main signal after an attenuation quantity of the pilot signal decreased by the pilot signal attenuation quantity control circuit has dropped below the predetermined value.

In the main signal detecting means 9, the input signal detecting means detects an input signal to the front stage of the main amplifier 1. The judging means judges an input of the main signal when an input signal detected by the input signal detecting means exceeds a first reference value set to level smaller than a level of the input signal at the time of the minimum input, whereby a highly-accurate detection of the main signal is feasible.

Further, the output signal detecting means detects an output signal from the rear stage of the main amplifier 1. The judging means judges an input of the main signal when the output signal detected by the output signal detecting means exceeds a second reference value set to a level smaller than a level of the output signal at the time of the minimum input, whereby a highly-accruate detection of the main signal is feasible.

Still further, the main signal cancelling signal detecting means detects the main signal cancelling signal outputted from the distortion extracting loop circuit 3. The judging means judges an input of the main signal when the main signal cancelling signal exceeds a third reference value set to a level smaller than a signal cancelling marginal level at the time of the minimum input, whereby a highly-accurate detection of the main signal is feasible.

Figure 2:
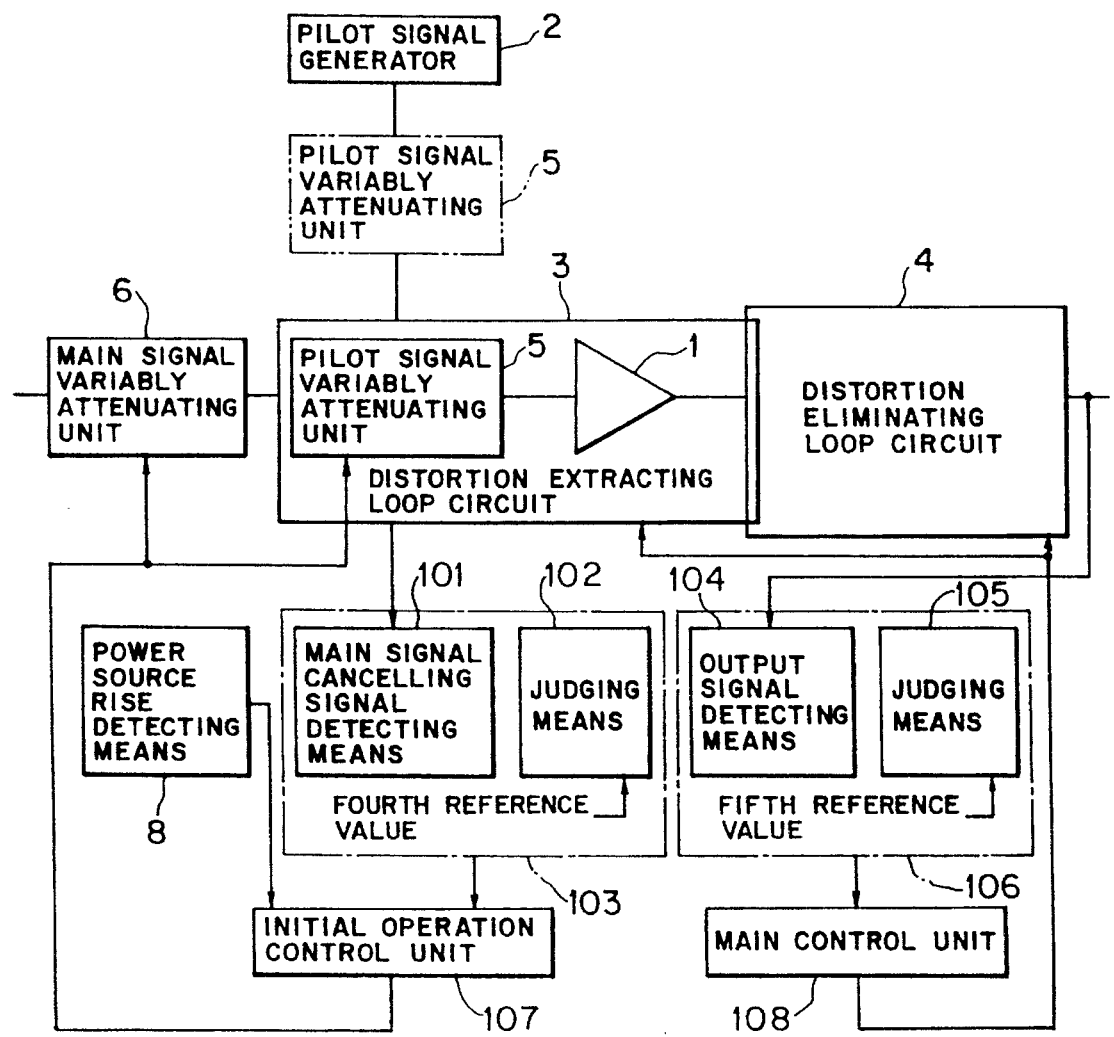
FIG. 2 is a block diagram of a feed-forward amplifier illustrating a second aspect of this invention.

FIG. 2 is a block diagram showing another feed-forward amplifier according to a second aspect of this invention. The feed-forward amplifier shown in FIG. 2 comprises a main amplifier 1, a pilot signal generator 2, a distortion extracting loop circuit 3, a distortion eliminating loop circuit 4, a pilot signal variably attenuating unit 5, a main signal variably attenuating unit 6, and a power source start-up detecting means 8, which have the same functions as those in the feed-forward amplifier according to the first aspect of this invention (referring to FIG. 1).

In FIG. 2, reference numeral 103 denotes a first main signal detecting means. The first main signal detecting means 103 comprises a main signal cancelling signal detecting means 101 which detects a main signal cancelling signal fed from the distortion extracting loop circuit 3, and a judging means 102 which judges an input of the main signal when the main signal cancelling signal detected by the main signal cancelling signal detecting means 101 exceeds a fourth reference value set to a level smaller than a signal cancelling marginal level at the time of the minimum input.

Reference numeral 107 denotes an initial operation control unit. The initial operation control unit 107 so controls the pilot signal variably attenuating unit 5 as to gradually decrease an attenuation quantity of the pilot signal with use of results of detection conducted by the power source start-up detecting means 8 and the first main signal detecting means 103 as timing information after a start-up of the power source of the main amplifier 1, then so controls the main signal variably attenuating unit 6 as to gradually decrease an attenuation quantity of the main signal after the pilot signal variably attenuating unit 5 has decreased an attenuation quantity of the pilot signal.

Reference numeral 108 denotes a main control unit. The main control unit 108 controls the distortion extracting loop circuit 3 and the distortion eliminating loop circuit 4 after a control by the initial operation control unit 107, while watching a failure condition of the main amplifier i on the basis of a result of detection by the second main signal detecting means 106.

It is possible to additionally provide a failure alarming means which outputs information that the main amplifier i is in trouble depending on results of the detection by the first main signal detecting means 103 and the second main signal detecting means 106.

In the feed-forward amplifier according to the second aspect of this invention, as shown in FIG. 2, the distortion extracting loop circuit 3 supplies the pilot signal fed from the pilot signal generator 2 to the main signal path and generates the main signal cancelling signal to cancel components of the main signal outputted from the main amplifier 1, the distortion eliminating loop circuit 4 disposed in the rear stage of the main amplifier 1 obtains a signal in which the components of the main signal in an output of the main amplifier 1 have been cancelled on the basis of the output of the main amplifier 1 and the main signal cancelling signal from the distortion extracting loop circuit 3 and outputs the components of the main signal obtained from a signal in the main signal path in the rear stage of the main amplifier with use of the signal in which the components of the main signal have been cancelled.

The main signal cancelling signal detecting means 101 in the first main signal detecting means 103 detects the main signal cancelling signal fed from the distortion extracting loop circuit 3. The judging means 102 judges that the main signal has been inputted when the main signal cancelling signal detected by the main signal cancelling signal detecting means 101 exceeds a fourth reference value set to a level smaller than the signal cancelling marginal level at the time of the minimum input.

The output signal detecting means 104 in the second main signal detecting means 106 detects an output signal from the rear stage of the main amplifier 1. The judging means 105 judges that the main signal has been inputted when the output signal detected by the output signal detecting means 104 exceeds a fifth reference value set to a level smaller than a level of the output signal at the time of the minimum input.

The initial operation control unit 107 controls the pilot signal variably attenuating unit 5 so as to gradually decrease an attenuation quantity of the pilot signal with use of results of detection by the power source start-up detecting means 8 and the first main signal detecting means 103 as timing information after a start-up of the power source of the main amplifier 1, then controls the main signal variably attenuating unit 6 so as to gradually decrease an attenuation quantity of the main signal after the attenuation quantity of the pilot signal has been decreased by the pilot signal variably attenuating unit 5.

After control by the initial operation control unit 107, the main control unit 108 controls the distortion extracting loop circuit 3 and the distortion eliminating loop circuit 4 on the basis of a result of detection by the second main signal detecting means 106, while watching a failure condition of the main amplifier 1.

During the control by the main control unit 108, a failure alarming means may output information that the main amplifier 1 is in trouble, depending on results of detection by the first main signal detecting means 103 and the second main signal detecting means 106.

Figure 3:
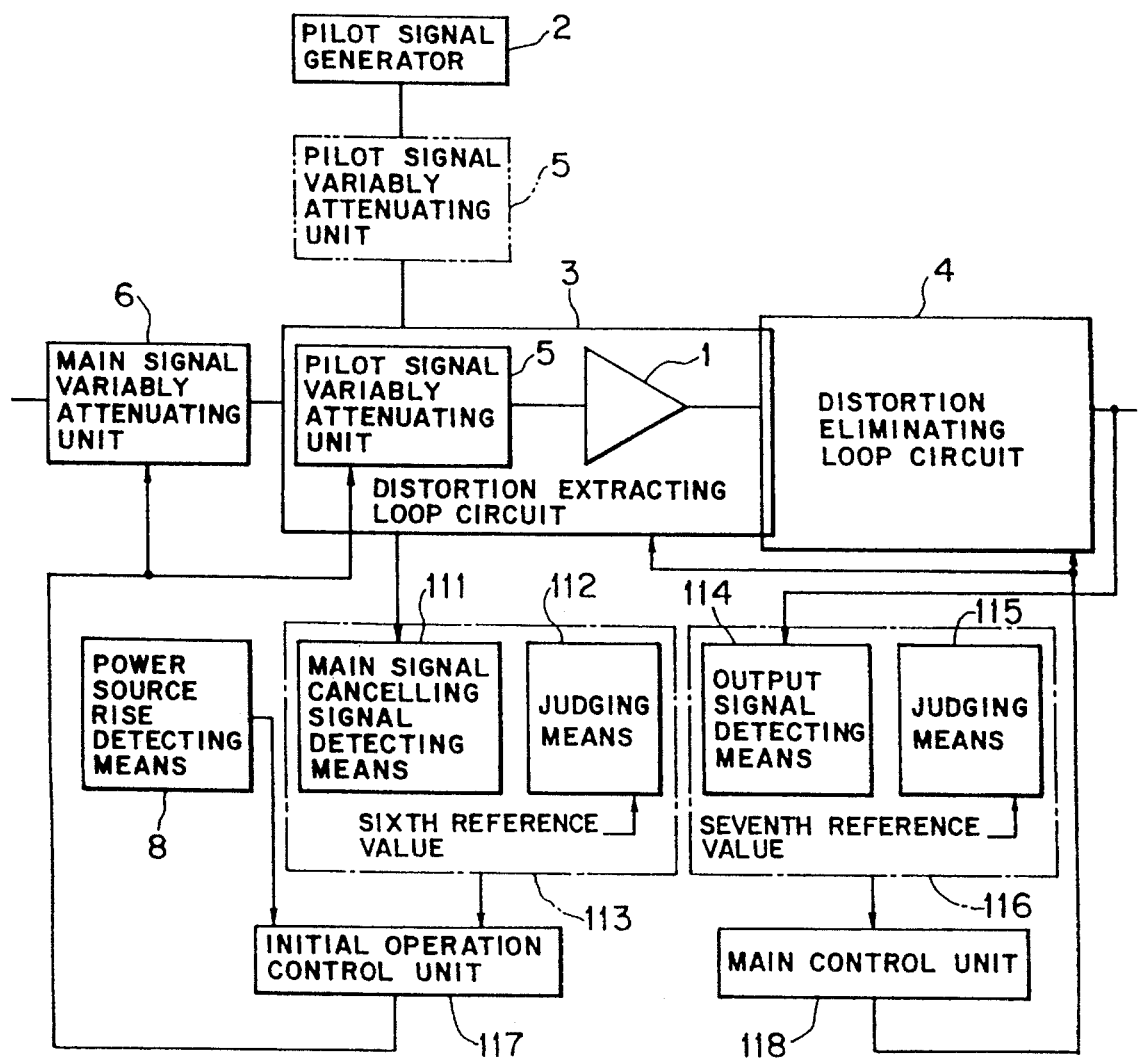
FIG. 3 is a block diagram of a feed-forward amplifier illustrating a third aspect of this invention.

FIG. 3 is a block diagram of another feed-forward amplifier according to a third aspect of the invention. The feed-forward amplifier shown in FIG. 3 comprises a main amplifier 1, a pilot signal generator 2, a distortion extracting loop circuit 3, a distortion eliminating loop circuit 4, a pilot signal variably attenuating unit 5, a main signal variably attenuating unit 6 and a power source start-up detecting means 8, which have the same functions as those in the feed-forward amplifier according to the first and second aspects of this invention (referring to FIGS. 1 and 2).

In FIG. 3, reference numeral 113 denotes a third main signal detecting means. The third main signal detecting means has a main signal cancelling signal detecting means 111 which detects a main signal cancelling signal fed from the distortion extracting loop circuit 3, and a judging means 112 which judges an input of a main signal when the main signal cancelling signal detected by the main signal cancelling signal detecting means 111 exceeds a sixth reference value set to a level smaller than an initial operation level set larger than a signal cancelling marginal level at the time of the minimum input.

Reference numeral 116 denotes a fourth main signal detecting means. The fourth main signal detecting means 116 has an output signal detecting means 114 which detects an output signal from the reap stage of the main amplifier 1, and a judging means 15 which judges an input of the main signal when the output signal detecting by the output signal detecting means 114 exceeds a seventh reference value set to a level smaller than a level of the output signal at the time of the minimum input.

Reference numeral 117 denotes an initial operation control unit. The initial operation control unit 117 alters a control setting mode in the distortion extracting loop circuit 3 so that an initial operation level is a signal cancelling marginal level at the time of the minimum input with use of results of detection by the power source detecting means 8 and the third main signal detecting means 113 as timing information after the third main signal detecting means 113 has detected an input of the main signal. Under such condition, the initial operation control unit 117 so controls the pilot signal variably attenuating unit 5 as to gradually decrease an attenuation quantity of the pilot signal after a start-up of the power source of the main amplifier 1, then so controls the main signal variably attenuating unit 6 as to gradually decrease an attenuation quantity of the main signal after an attenuation quantity of the pilot signal has been decreased by the pilot signal variably attenuating unit Reference numeral 118 denotes a main control unit. The main control unit 118 controls the distortion extracting loop circuit 3 and the distortion eliminating loop circuit 4 on the basis of a result of detection by the fourth main signal detecting means after the control by the initial operation control unit 117, while watching a failure condition of the main amplifier 1.

The feed-forward amplifier according to the third aspect of this invention may further comprise a fifth main signal detecting means having a main signal cancelling signal detecting means which detects a main signal cancelling signal fed from the distortion extracting loop circuit 3 and a judging means which judges that the main signal has been inputted when the main signal cancelling signal detected by the main signal cancelling signal detecting means exceeds an eighth reference value set to a level smaller than the signal cancelling marginal level at the time of the minimum input, and a failure alarming means which outputs information that the main amplifier is in trouble depending on results of detection by the fourth main signal detecting means 116 and the fifth main signal detecting means.

In the feed-forward amplifier according to the third aspect, as shown in FIG. 3, the distortion extracting loop circuit 3 supplies the pilot signal fed from the pilot signal generator 2 to the main signal path and generates the main signal cancelling signal to cancel the main signal outputted from the rear stage of the main amplifier 1, and the distortion eliminating loop circuit 4 obtains a signal in which components of the main signal in an output of the main amplifier have been cancelled on the basis of the output of the main amplifier 1 and the main signal cancelling signal from the distortion extracting loop circuit 3 and outputs the components of the main signal obtained from a signal in the main signal path in the rear stage of the main amplifier 1 with use of the signal in which the components of the main signal have been cancelled.

The main signal cancelling signal detecting means 111 in the third main signal detecting means 113 detects the main signal cancelling signal fed from the distortion extracting loop circuit 3, and the judging means 112 judges that the main signal has been inputted when the main signal cancelling signal detected by the main signal cancelling signal detecting means 111 exceeds a sixth reference value set to a level smaller than an initial operation level set larger than the signal cancelling marginal level at the time of the minimum input.

The output signal detecting means 114 in the fourth main signal detecting means 116 detects an output signal from the rear stage of the main amplifier 1, and the judging means 115 judges that the main signal has been inputted when the output signal detected by the output signal detecting means 114 exceeds a seventh reference value set to a level smaller than a level of the output signal at the time of the minimum input.

The initial operation control unit 117 alters a control setting mode in the distortion extracting loop circuit 3 so that an initial operation level is the signal cancelling marginal level at the time of the minimum input when results of detection conducted by the power source start-up detecting means 8 and the third main signal detecting means 113 after an input of the main signal has been detected by the third main signal detecting means 113 are used. Under such condition, the initial operation control unit 117 so controls the pilot signal variably attenuating unit 5 as to gradually decrease an attenuation quantity of the pilot signal after a start-up of the power source of the main amplifier 1, then so controls the main signal variably attenuating unit 6 as to gradually decrease an attenuation quantity of the main signal after an attenuation quantity of the pilot signal has been decreased by the pilot signal variably attenuating unit 5.

The main control unit 118 controls the distortion extracting loop circuit 3 and the distortion eliminating loop circuit 4 on the basis of a result of detection by the fourth main signal detecting means 116 after a control by the initial operation control unit 7, while watching a failure condition of the main amplifier 1.

During the control by the main control unit 1, a failure alarming means may output information that the main amplifier 1 is in trouble depending on results of detection by the fourth main signal detecting means 116 and the fifth main signal detecting means.

(b) Description of a First Embodiment

Hereinafer, description will be made of a first embodiment according to this invention referring to the accompanying drawings.

Figure 4:
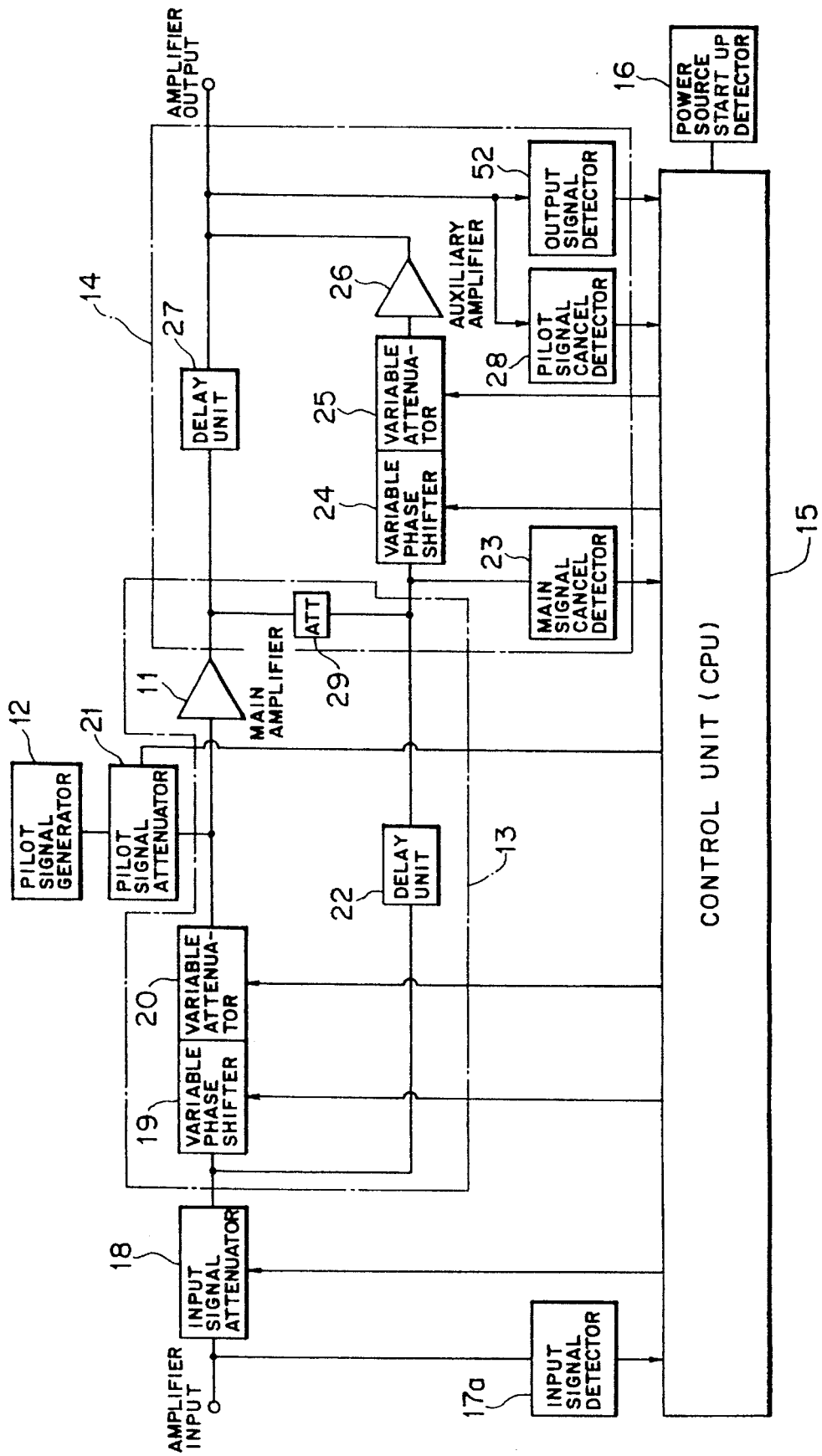
FIG. 4 is a block diagram of a feed-forward amplifier according to a first embodiment of this invention.

FIG. 4 is a block diagram of a feed-forward amplifier according to a first embodiment of this invention. In FIG. 4, reference numeral 11 denotes a main amplifier, which amplifies a signal from a main signal system.

Reference numeral 16 denotes a power source start-up detector (a power source start-up detecting means), which detects an ON/OFF state of a power source of the main amplifier 11.

Reference numeral 12 denotes a pilot signal generator, which generates a pilot signal.

Reference numeral 17a denotes an input signal detector. The input signal detector 17a detects an input signal to a front stage of the main amplifier 11. An input signal attenuator (a main signal variably attenuating unit) 18 attenuates a main signal (an input signal) applied to the front stage of the main amplifier 1 on the basis of control information supplied from a control unit 15.

Reference numeral 13 denotes a distortion extracting loop circuit. The distortion extracting loop circuit 13 is disposed in the front stage of the main amplifier 11, supplying a pilot signal outputted from a pilot signal generator 12 to a main signal path, and generating a main signal cancelling signal whose phase is inverted with the same magnitude of the main signal in the main signal path. The distortion extracting loop circuit 13 is provided with a variable phase shifter 19, a variable attenuator 20, a delay unit 22 and the main amplifier 11.

The variable phase shifter 19 variably changes a phase of the main signal outputted from the input signal attenuator 18 on the basis of control information supplied from the control unit 15. The variable attenuator 20 attenuates the main signal from the input signal attenuator 18 on the basis of the control information supplied from the control unit 15. The variable phase shifter 19 and the variable attenuator 20 are served to generate a main signal cancelling signal to cancel the main signal outputted from the main amplifier 11 in the front stage of a main signal cancel detector 23, which will be described later.

The delay unit 22 delays the main signal branched from the input signal attenuator 18 for a predetermined period.

Reference numeral 21 denotes a pilot signal attenuator (a pilot signal variably attenuating unit). The pilot signal attenuator 21 is arranged on an output side of the pilot signal generator 12 branched from the main signal system in the front stage of the main amplifier 11 to attenuate a pilot signal supplied from the pilot signal generator 12 to the main signal system in the front stage part of the main amplifier 11 on the basis of control information supplied from the control unit 15.

Reference numeral 14 denotes a distortion eliminating loop circuit. The distortion eliminating loop circuit 14 is disposed in a rear stage of the main amplifier 11 to obtain a signal in which components of the main signal in an output of the main amplifier 11 have been cancelled on the basis of an output of the main amplifier 11 and a main signal cancelling signal fed from the distortion extracting loop circuit 13, and outputs components of the main signal obtained from a signal in the main signal path in the rear stage of the main amplifier 11 with use of the signal in which the components of the main signal have been cancelled. The distortion eliminating loop circuit 14 comprises a main signal cancel detector 23, a variable phase shifter 24, a variable attenuator 25, an auxiliary amplifier 26, a delay unit 27, a pilot signal cancel detector 28, an output signal detector 52 and attenuator 29.

The attenuator 29 is applied the main signal cancelling signal from the main amplifier 11, a noise signal of the main signal cancelling signal, a pilot signal, and a noise signal of the pilot signal, and attenuates these signals to a level before the amplification.

Therefore, the components of the main signal can be cancelled by composing a signal from the attenuator 29 and the main signal in the main signal path from the delay unit 22.

The main signal cancel detector 23 detects components of the main signal that have not been cancelled in the composed signal of the signal from the attenuator 29 and the main signal from the delay unit 22. The control unit 15 such controls the variable phase shifter 19 and the variable attenuator 20 that the uncancelled components of the main signal are detected by the main signal cancel detector 23.

With the above configuration, the main signal can be cancelled at a composing point, and distortion components generating in the main amplifier 11 and the pilot signal can be extracted.

The variable phase shifter 24 is applied a signal composed of a signal from the attenuator 29 and the main signal from the delay unit 22 to compose a pilot signal with an inverse phase passing through the delay unit 27 and the variable phase shifter 24 on the basis of the control information from the control unit 15. The variable attenuator 25 attenuates a signal from the variable phase shifter 24 on the basis of the control information from the control unit 15.

The auxiliary amplifier 26 amplifies a signal from the variable attenuator 25 with the same amplification factor as the main amplifier 11. The delay unit 27 is applied the main signal from the main amplifier 11, distorted components developing in the main amplifier 11 and the pilot signal to delay these signals for a predetermined period, and outputs a signal with an inverted phase of a signal from the auxiliary amplifier 26.

In consequence, components other than components of the main signal, that is, distorted components developing in the main amplifier 11 and the pilot signal can be cancelled by composing a signal from the above auxiliary amplifier 26 and a signal from the delay unit 27.

The pilot signal cancel detector 28 detects components of the pilot signal that have not been cancelled in the composed signal of the signal from the auxiliary amplifier 26 and the signal from the delay unit 27. The control unit 15 so controls the variable phase shifter 24 and the variable attenuator 25 as to minimize a level of the pilot signal detected by the pilot signal cancel detector 28 in the ordinary operation.

Incidentally, the output signal detector 52 is served to detect an output signal.

Figure 5:
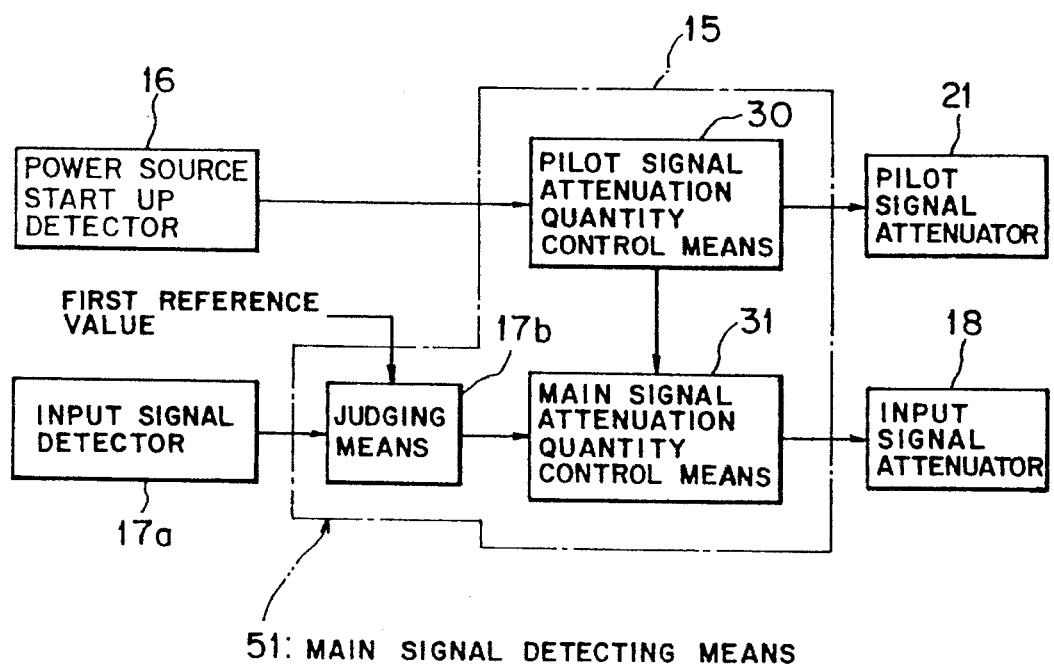
FIG. 5 is a block diagram of a control unit of the feed-forward amplifier according to the first embodiment.

The control unit 15 controls the above variable phase shifters 19,24 and the variable attenuators 20,25, comprising a judging means 17b, a pilot signal attenuation quantity control means 30 and the main signal attenuation quantity control means 31, as shown in FIG. 5.

Figure 6:
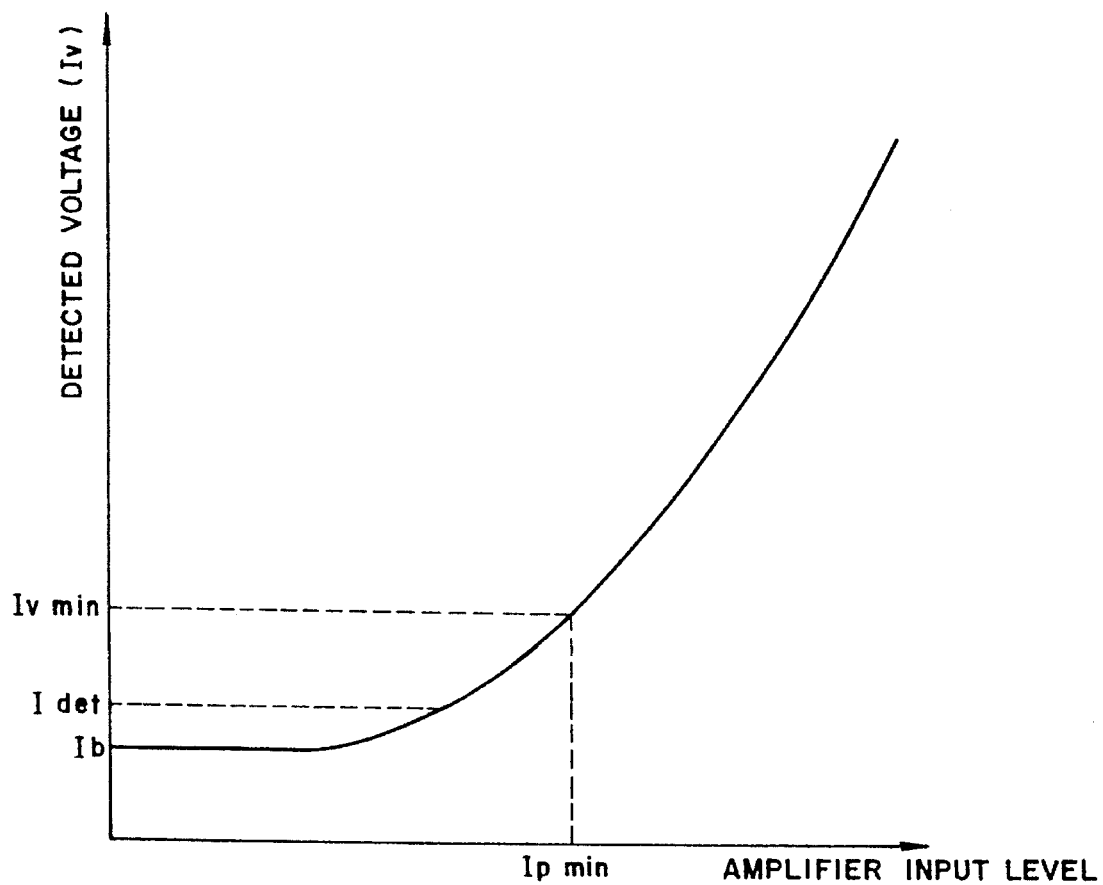
FIG. 6 is a graph showing a reference used to judge an input of the main signal in the feed-forward amplifier according to the first embodiment.

More specifically, the judging means 17b judges that the main signal has been inputted when an input signal $I_v$ detected by the input signal detector 17a exceeds a first reference value $I_{det}$ set to a level smaller than an input signal level $I_{Umin}$ at the time of the minimum input in the normal operation, as shown in FIG. 6. The input signal detector 17a mentioned before and the judging means 17b, therefore, form a main signal detecting means 51.

In FIG. 6, $I_{pmin}$ represents the minimum input level in the normal operation, while $I_b$ represents a detected voltage due to a floor noise.

When the power source start-up detector 16 detects a start-up of the power source of the main amplifier 11, the control unit 15 so controls the pilot signal attenuator 21 as to gradually decrease an attenuation quantity of the pilot signal. When the judging means 17b detects an input of the main signal after initiation of the operation to decrease an attenuation quantity of the pilot signal, the control unit 15 so controls the input signal attenuator 18 as to gradually decrease an attenuation quantity of the main signal.

In other words, when the power source start-up detector 16 detects a start-up of the power source of tile main amplifier 11, the pilot signal attenuation quantity control means 30 so controls the pilot signal attenuator 21 to gradually decrease an attenuation quantity of the pilot signal.

When the judging means 17b judges an input of the main signal after the pilot signal attenuation quantity control means 30 has initiated the pilot signal attenuation quantity decreasing operation, the main signal attenuation quantity control means 31 so controls the input signal attenuator 18 as to gradually decreases an attenuation quantity of the main signal.

Next, an operation of the feed-forward amplifier of a type which can prevent unwanted waves from being outputted in an initial operation with the above configuration according to the first embodiment of this invention will be described, referring to a flowchart shown in FIG. 7 and a timing chart shown in FIGS. 8A through 8E.

When the power source start-up detector 16 throws a power source of tile main amplifier 11 to 'on' (Step A1, referring to time E in FIGS. 8A through 8C), the control unit 15 implements initialization of control information for a feed-forward control of the apparatus (Step A2). That is, in order to prevent unwanted waves from outputting in a transient condition of the apparatus immediately after the throw-on of the power source, attenuation quantity to be attenuated by the input signal attenuator 18 and the pilot signal attenuator 21 are set to large values (referring to time E in FIGS. 8A and 8C).

Therefore, at a point of time of the throw-on of the power source of the main amplifier 11, the pilot signal is being outputted from the pilot signal generator 12. However, an attenuation quantity of the pilot signal to be decreased by the pilot signal attenuator 21 is set at a large value so that an output signal outputted from the apparatus may be sufficiently smaller than a spurious permissible level (referring to time E in FIG. 8B).

Until an attenuation quantity of the pilot signal attenuator 21 becomes a minimum under a control of the pilot signal attenuation quantity control means 30, a cancelling control over the pilot signal attenuator 21 is continued to gradually decrease an attenuation quantity of the pilot signal (referring to time E-F at Steps A3-A5 in FIG. 8A).

Thereafter, when an attenuation quantity of the pilot signal attenuator 21 reaches the minimum (YES route at Step A5), the same cancelling control of the pilot signal as Step A4 above mentioned is conducted until the judging means 17b in the main signal detecting means 51 judges that the main signal has been inputted as an input signal to the apparatus (NO route at Steps A6 and A7).

Figure 7:
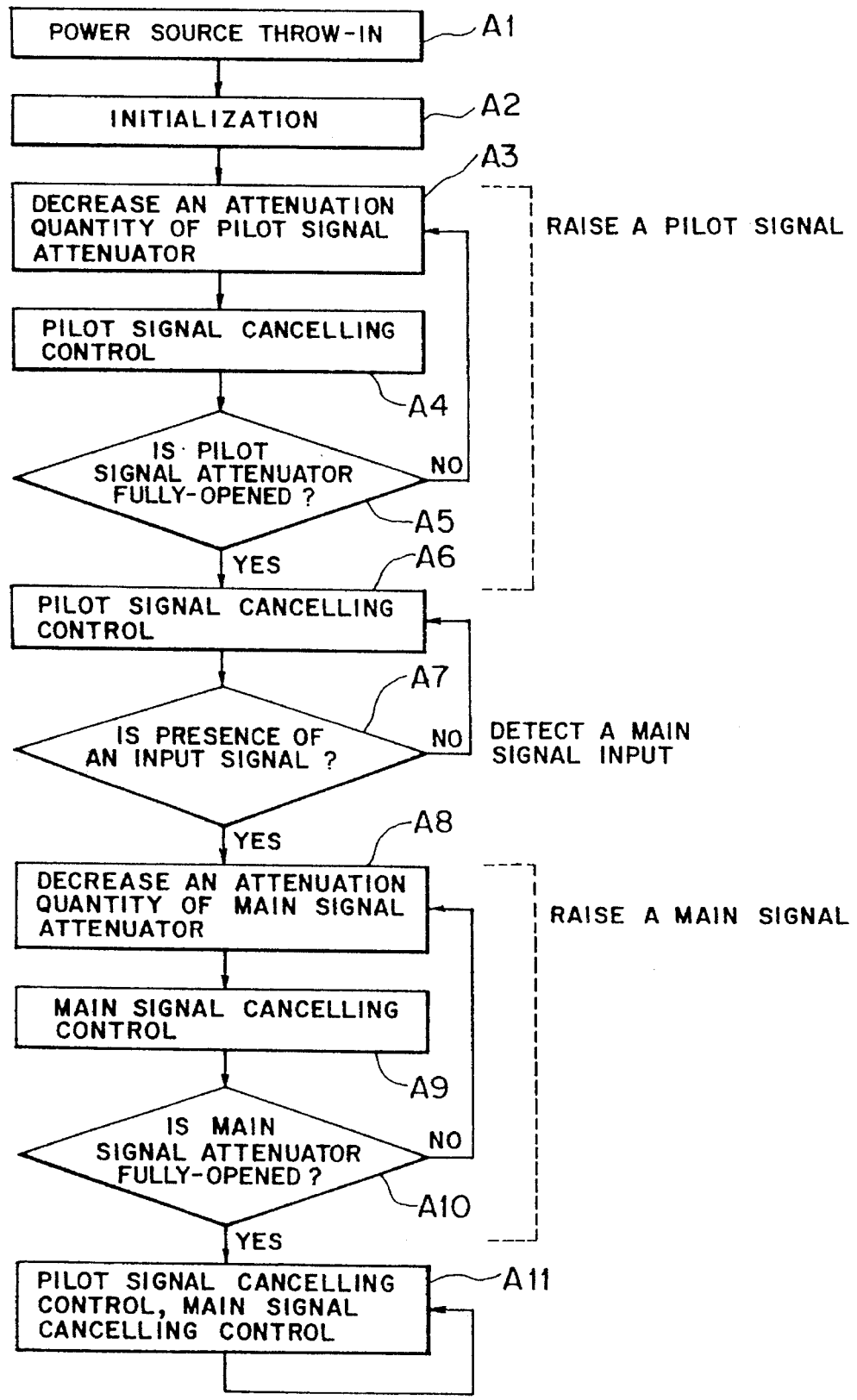
FIG. 7 is a flowchart illustrating an operation of the feed-forward amplifier according to the first embodiment.

If the judging means 17b judges that the main signal has been inputted as an input signal to the apparatus (YES route at STEP A7 in FIG. 7, referring to time G in FIGS. 8A–8E), an attenuation quantity of the main signal is decreased by the the main signal attenuation quantity control means 31 (Step 8A in FIG. 7, referring to time G-H in FIG. 8C). Referring to detection information about the main signal supplied from the main signal cancel detector 23, the control unit 15 controls the variable phase shifter 19 and the variable attenuator 20, thereby conducting a cancelling control of the main signal (Step A9).

As above, it is possible to increase a level of the main signal outputted as an apparatus output (referring to time G-H in FIG. 8D). On the other hand, it is also possible to suppress non-linear distortion components contained in the apparatus output to a level sufficiently lower than the permissible level by virtue of the cancelling control of the main signal (referring to time G-H in FIG. BE).

In the cancelling control of the main signal, an attenuation quantity of the input signal attenuator 18 is gradually decreased until the attenuation quantity in the input signal attenuator 18 becomes the minimum (from NO route at Step A1 to Steps A8 and A8 in FIG. 7, referring to time G-H in FIG. 8C).

Thereafter, when an attenuation quantity of the main signal attenuator 18 reaches the minimum (YES route at Step A10 in FIG. 7, referring to time H in FIG. 8C), a cancelling control of the pilot signal and the main signal, that is, a feed-forward control, is successively conducted in the same manner as in the process at Steps A6 and A9 set forth above (Step A11).

Whereby, attenuation quantities of the pilot signal attenuator 21 and the input signal attenuator 18 become minimum (referring to time H in FIGS. 8A and 8C). Therefore, the pilot signal and the main signal as an apparatus output are outputted both in a stable state (referring to time H ill FIGS. 8B and 8D). In addition, the non-linear distortion components contained in the apparatus output can be suppressed to a level sufficiently lower than the permissible level (referring to time H in FIG. 8E).

If the main signal is inputted during a process at Steps A3 through A5, that is, before the cancelling control on the pilot signal has been completed, a process at Steps A8 through A10, that is, a feed-forward control, is initiated, not immediately, but after completion of the cancelling control of the pilot signal.

As above, in the feed-forward amplifier according to the first embodiment of this invention, it is possible to control outputs of the pilot signal and the main signal during the initial operation in the front stage, that is, under a condition of a small power before amplified so that it is possible to reduce a loss occurring in the course from the output of the main amplifier 11 to the output of the apparatus and a power consumption in the apparatus.

Since an attenuating control of tile pilot signal is capable immediately after a start-up of the power source, it is sufficient to operate only the input signal attenuator 18 upon an input of a signal, thereby decreasing a time period from the input of the signal to a stable feed-forward control.

According to this embodiment, the pilot signal attenuator 21 is positioned in a part on the side of the output of the pilot signal generator 12 branched from the main signal path in the front stage of the main amplifier 11. It is thus possible to set a gain of the main amplifier 11 and a delay time in the delay unit 22 to smaller values.

Further, the input signal detector 17a detects the presence of an input signal. This is helpful to prevent occurrence of a phenomenon that, if an input of the main signal is interrupted in the normal operation condition, distortion in a transmitted output increases in a transient operation in the even of the re-input of the signal since the main signal cancelling control has been deviated from the optimal point during the interruption of the main signal.

(b1) Description of First Modification of the First Embodiment

Figure 9:
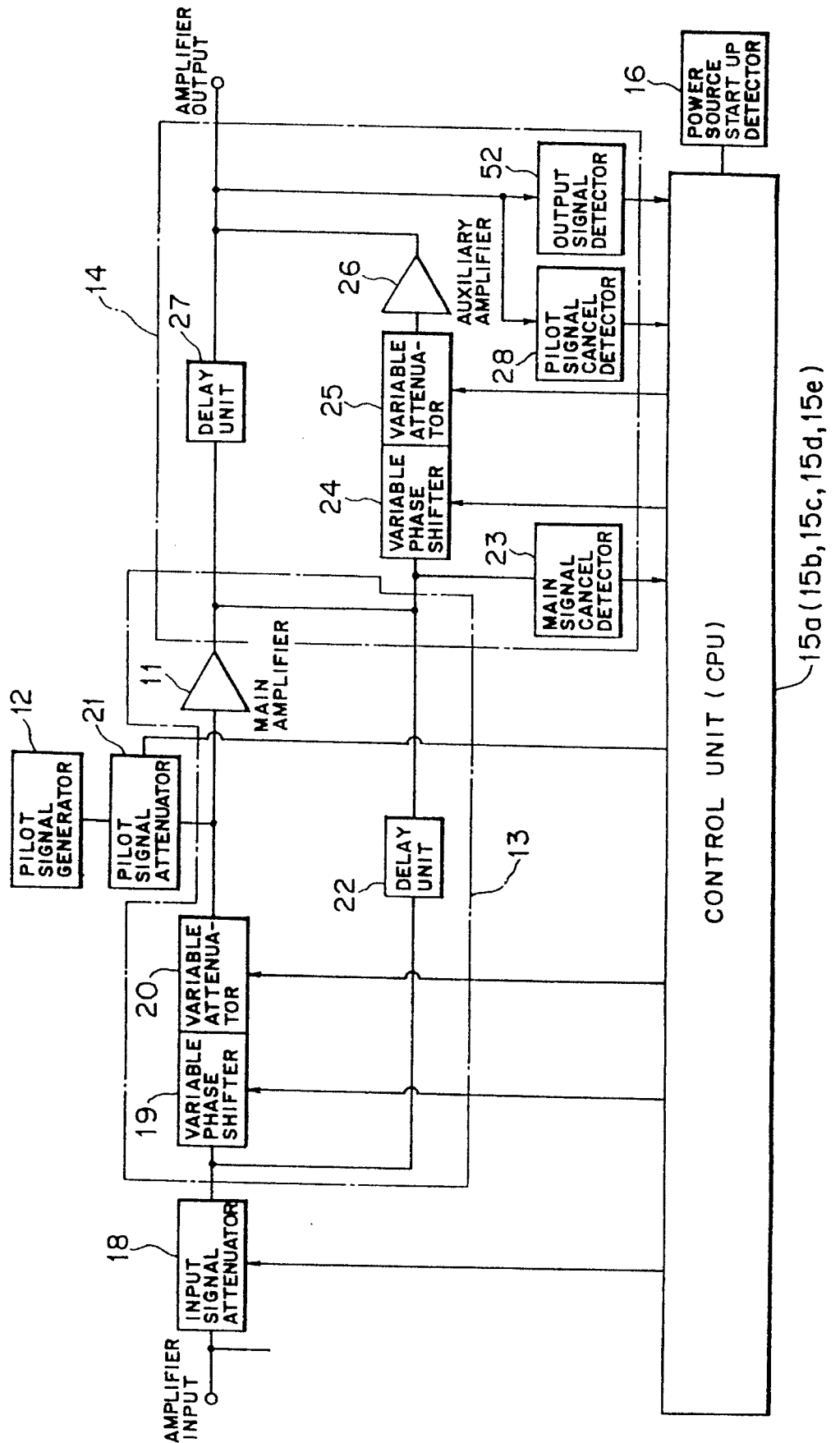
FIG. 9 is a block diagram of a feed-forward amplifier according to a first modification of the first embodiment of this invention.

FIG. 9 is a block diagram of a first modified example of the feed-forward amplifier according to the first embodiment of this invention. In FIG. 9, the input signal detector 17a is omitted from the feed-forward amplifier of the first embodiment above described. An input of the main signal is detected from, not detected information supplied by the input signal detector 17a, but detected information supplied from an output signal detector (an output signal detecting means) 52. The first modified example has basically the same configuration as the feed-forward amplifier of the first embodiment, except the above point.

Figure 10:
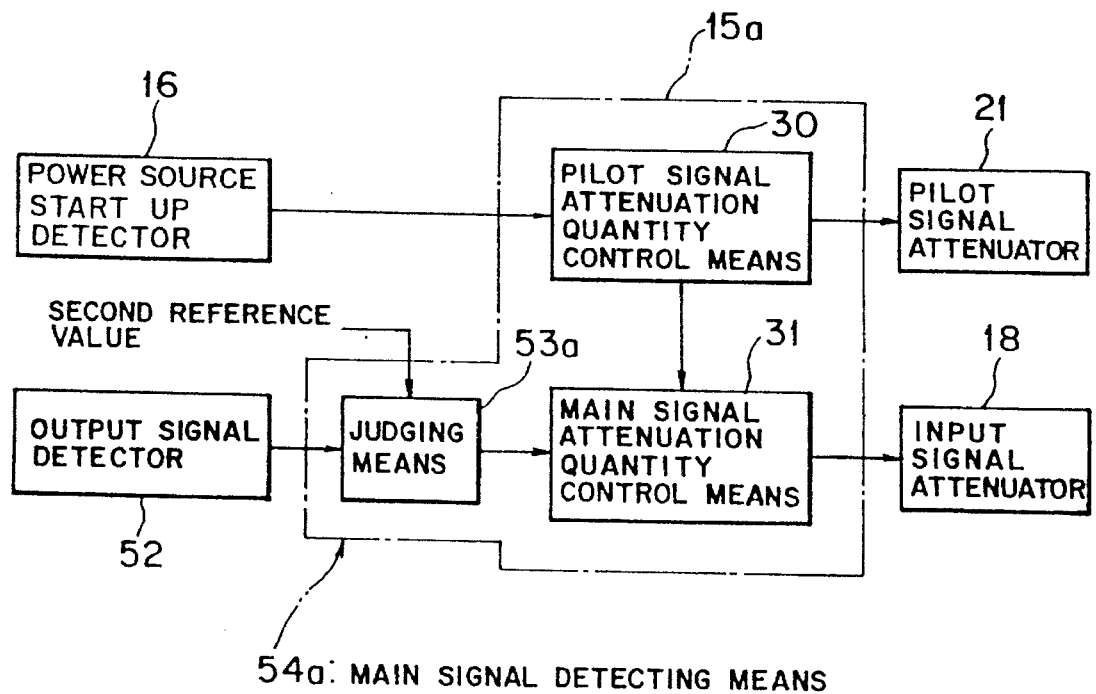
FIG. 10 is a block diagram of a control unit of the feed-forward amplifier according to the first modification of the first embodiment.

FIG. 10 is a block diagram of a control unit of the first modified example according to the first embodiment. As shown in FIG. 10, a control unit 15a has a pilot signal attenuation quantity control means 30, a main signal attenuation quantity control means 31 and a judging means 53a.

Figure 11:
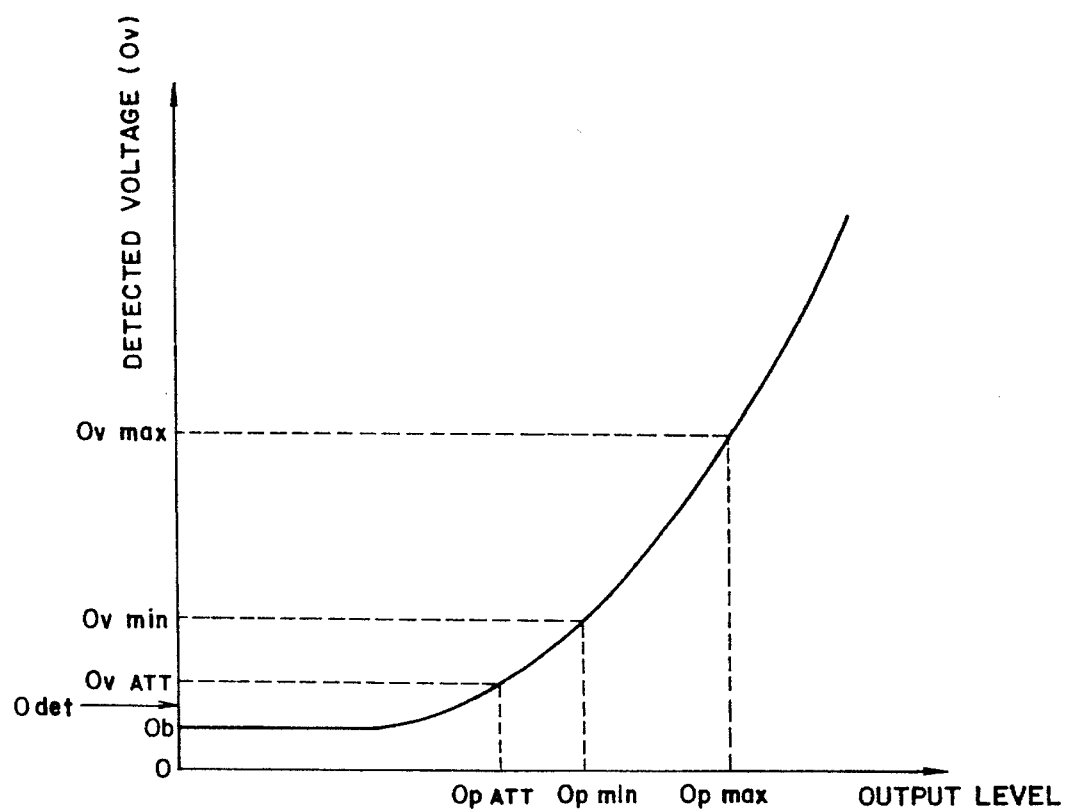
FIG. 11 is a graph illustrating an operation of the feed-forward amplifier according to the first modification of the first embodiment.

The judging means 53a is, as shown in FIG. 11, applied a detected voltage as detected information about an output signal from the output signal detector 52 to make a judgement that the main signal has been inputted when a detected output signal voltage $O_U$ exceeds a second reference value $O_{det}$ set to a level smaller than an output signal level $O_{Umin}$ at the time of the minimum input in the normal operation (that is, a detected voltage when an output of the main amplifier 11 is at the lowest level).

The output signal detector 52 and the judging means 53a mentioned above form a main signal detecting means 54a served to detect an input of the main signal.

In FIG. 11, $O_{Umin}$ represents an output signal level when an input is at the maximum level in the normal operation, that is a detected voltage when an output of the main amplifier 11 is at the maximum level. $O_{Uau}$ represents a voltage obtained by detecting an output signal of a level in which the maximum attenuation quantity of the main signal attenuator has been reduced in the initial operation, that is, an output signal level at the time of the minimum input level in a state of the initial operation.

As shown in FIG. 11, a second reference value $O_{det}$ is set to a value smaller than an output signal level at the time of the minimum input in the initial operation. Whereby, the judging means 53a can make a judgement that the main signal was inputted at an appropriate time to reach the minimum input level in the initial operation.

When the power source start-up detector 16 detects a start-up of the power source of the main amplifier 11, the pilot signal attenuation quantity control means 30 so controls the pilot signal attenuator 21 as to gradually decrease an attenuation quantity of the pilot signal, as same as in the first embodiment. When the judging means 53a judges that the main signal has been inputted after the pilot signal attenuation quantity control means 30 initiated a decreasing operation of the attenuation quantity of the pilot signal, the main signal attenuation quantity control means 31 so controls the input signal attenuator 18 as to gradually decrease an attenuation quantity of the main signal, as also same as in the first embodiment.

Figure 12:
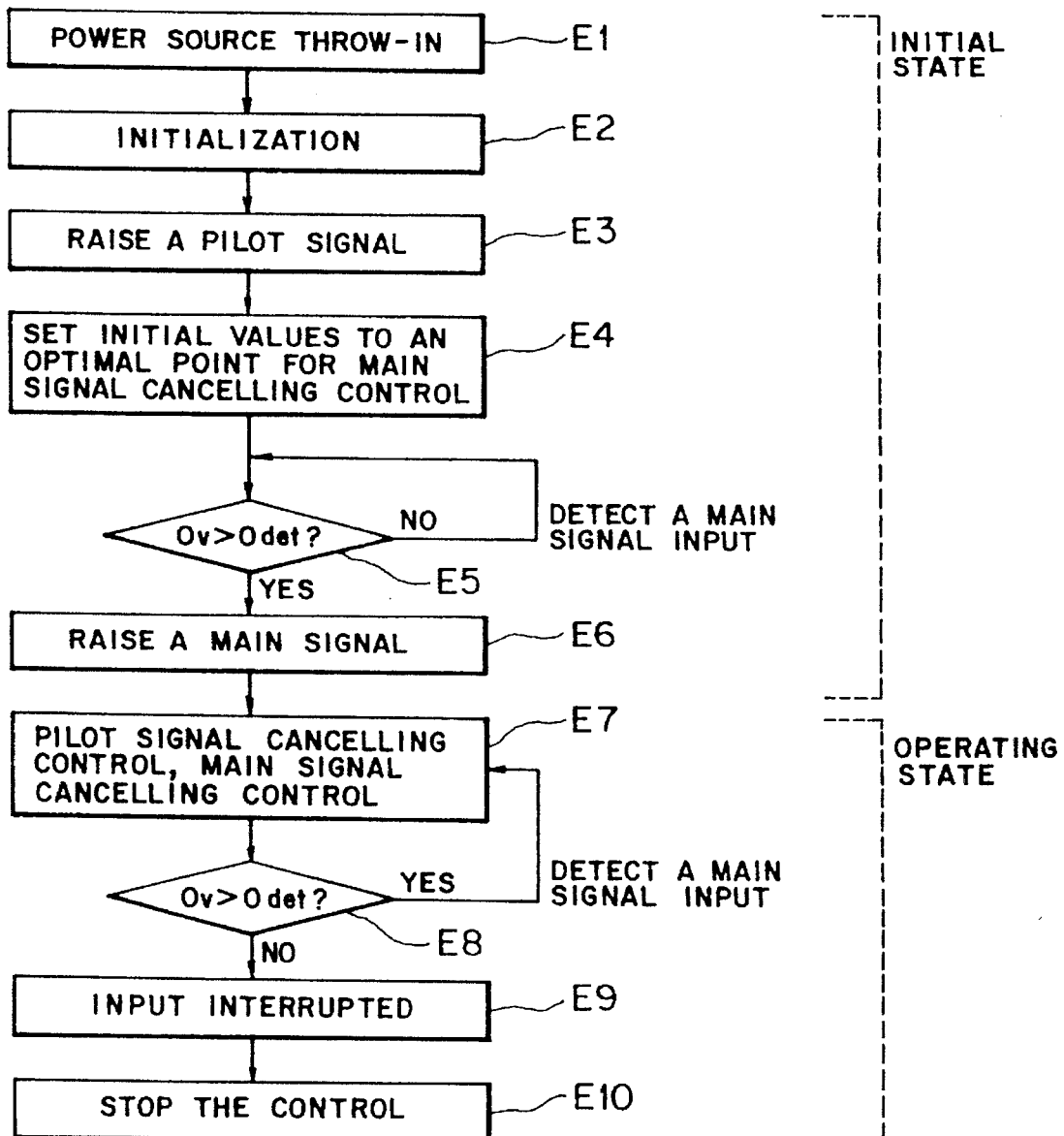
FIG. 12 is a flowchart illustrating the operation of the feed-forward amplifier according to the first modification of the first embodiment.

The operation of the first modified example with the above configuration of the feed-forward amplifier according to the first embodiment of this invention will be now described, referring to a flowchart shown in FIG. 12.

First, when the power source start-up detector 16 detects a throw-on of the power source of the amplifier (Step E1), an initialization is executed (Step E2), and the pilot signal generator 12 generates a pilot signal (Step E3).

The pilot signal is attenuated by the pilot signal attenuator 21, then inputted to the main amplifier 11. An attenuation quantity of the pilot signal is so controlled by the pilot signal attenuation quantity control means 30 as to be at the maximum when generated, gradually decreased thereafter.

A signal from the auxiliary amplifier 26 and a signal from the delay unit 27 are composed, thereby cancelling components except those of the main signal, that is, distortion components generating in the main amplifier 11 and the pilot signal.

The control unit 15a sets an initial value that is optimal for the cancellation control of the main signal (Step E4). More specifically, the control unit 15a sets a phase shifting value for the phase shifter 19 and an attenuation value to the variable attenuator 20, thereby carrying out the most efficiently the main signal cancellation control at the composing point in the front stage of the main signal cancel detector 23.

The judging means 53a in the control unit 15a is applied with an output signal voltage $O_U$ from the output signal detector 52. When this output signal voltage $O_U$ exceeds the second reference value $O_{det}$ (YES route at Step E5), it is judged that the main signal has been inputted and the main signal is raised up (Step E6).

In other words, the main signal is attenuated by the input signal attenuator 18. An attenuation quantity of the main signal decreased by the input signal attenuator 18 is so controlled by the main signal attenuation quantity control means 31 as to be at the maximum when the main signal is raised and gradually decreased thereafter.

In the normal operation state after the above steps, a cancelling control of the main signal and the pilot signal, that is, a feed-forward control, is carried out (Step E7). By virtue of this control, components except components of the main signal, that is, non-linear distortion components generating in the main amplifier 11 and the components of the pilot signal are cancelled so that only the main signal can be outputted with less noise as an output of the apparatus.

When the output signal voltage $O_U$ outputted from the output signal detector 52 is smaller than the second reference value $O_{det}$ while the cancelling control is being conducted on the main signal and the pilot signal (NO route at Step E8), the judging means 53a judges that the input signal has been interrupted (Step E9). The control unit 15a stops the cancelling control operation on the main signal and the pilot signal described above (Step E10) although holding the initial values such as a shifting value for the variable phase shifter 19, an attenuation value for the variable attenuator 20, etc. having been set at Step E4.

In the feed-forward amplifier according to the first modification of the first embodiment, use of the output signal detector 52 makes it possible to detect an input of the main signal without the input signal detector 17a in order to control the apparatus. This is helpful to diminish the dimensions of the apparatus.

(b2) Description of Second Modification of the First Embodiment

Next, description will be made of a second modified example of the feed-forward amplifier according to the first embodiment of this invention. The feed-forward amplifier of the second modification according to the first embodiment has substantially the same configuration shown in FIG. 9. A different point between the second modified feed-forward amplifier and the first modified feed-forward amplifier is that a judging means 53b in a control unit 15b judges an input of the main signal from, not detected information of an output signal supplied from the output signal detector 52, but detected information of the main signal cancelling signal supplied from the main signal cancel detector 23. The other elements are basically the same.

Figure 13:
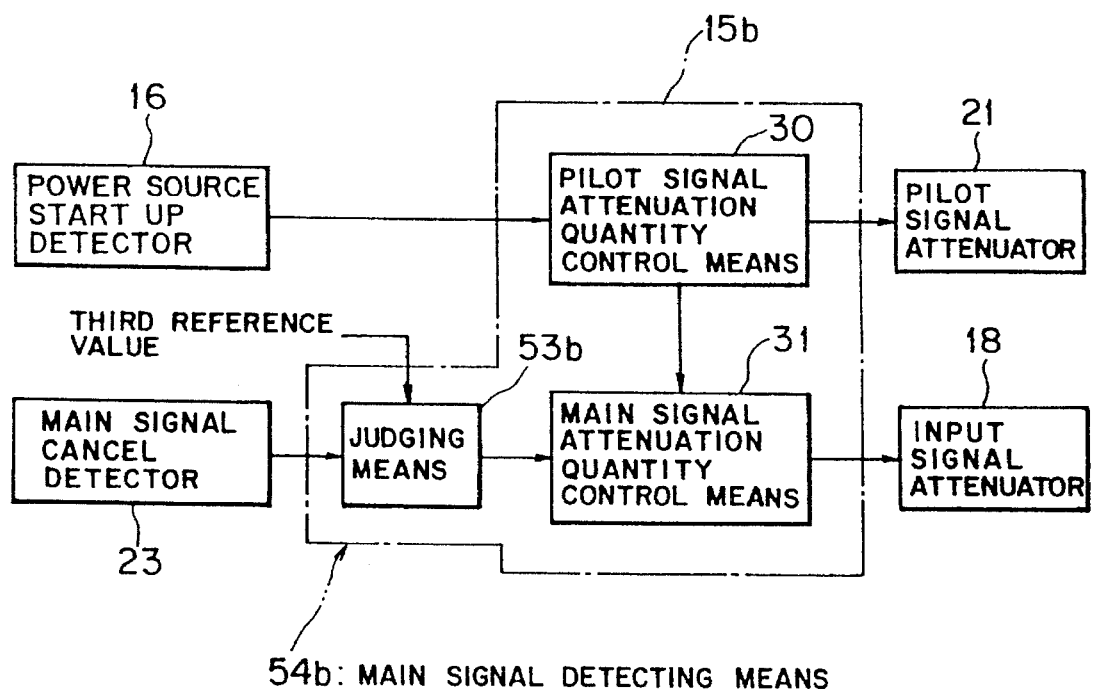
FIG. 13 is a block diagram of a control unit of a feed-forward amplifier according to a second modification of the first embodiment of this invention.

FIG. 13 is a block diagram of a control unit in the second modified feed-forward amplifier according to the first embodiment of this invention. As shown in FIG. 13, the control unit 15b has a pilot signal attenuation quantity control means 30, a main signal attenuation quantity control means 31 and a judging means 53b, which have substantially the same functions as the feed-forward amplifier according to the first embodiment described hereinbefore.

Figure 14:
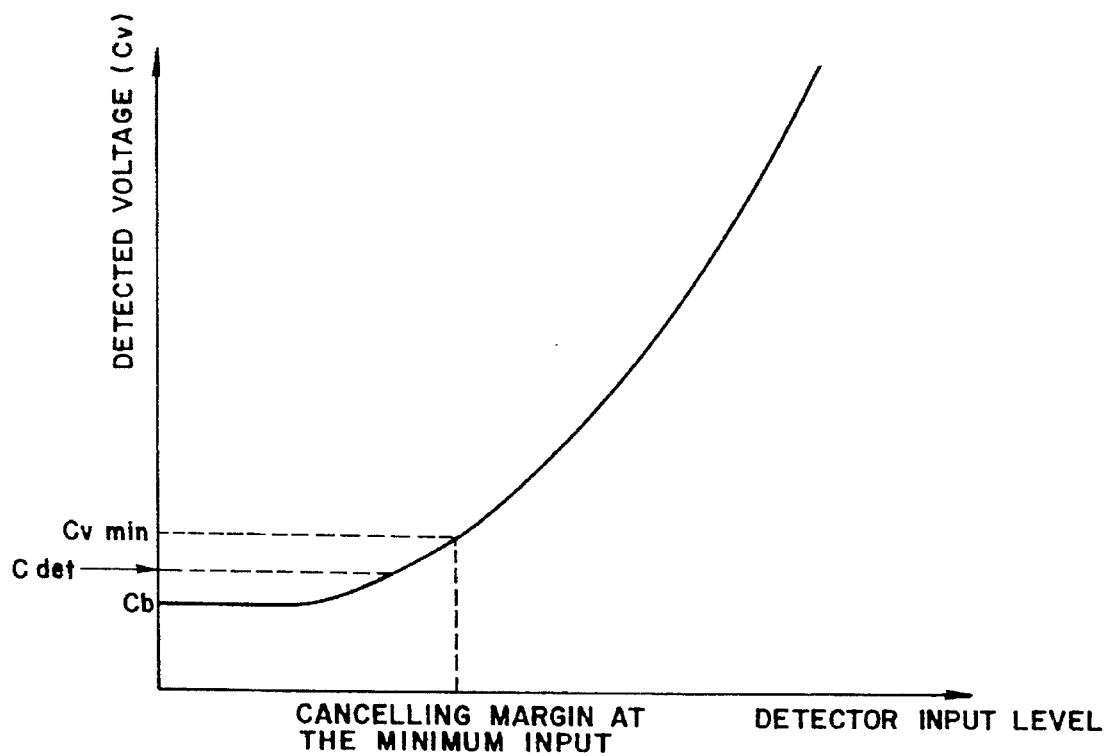
FIG. 14 is a graph illustrating an operation of the feed-forward amplifier according to the second modification of the first embodiment.

The judging means 53b is, as shown in FIG. 14, applied with a main signal cancelling signal $C_U$ detected by the main signal cancel detector 23. The judging means 53b judges that the main signal has been inputted when the main signal cancelling signal $C_U$ exceeds a third reference value $C_{det}$ at a level smaller than a signal cancelling marginal level $C_{Umin}$ at the time of the minimum input in the normal operation.

In FIG. 14, $C_b$ represents a detector output voltage of a floor noise outputted from the main signal cancel detector 23.

The above judging means 53b and the main signal cancel detector 23 form a main signal detecting means 54b which detects an input of the main signal.

Figure 15:
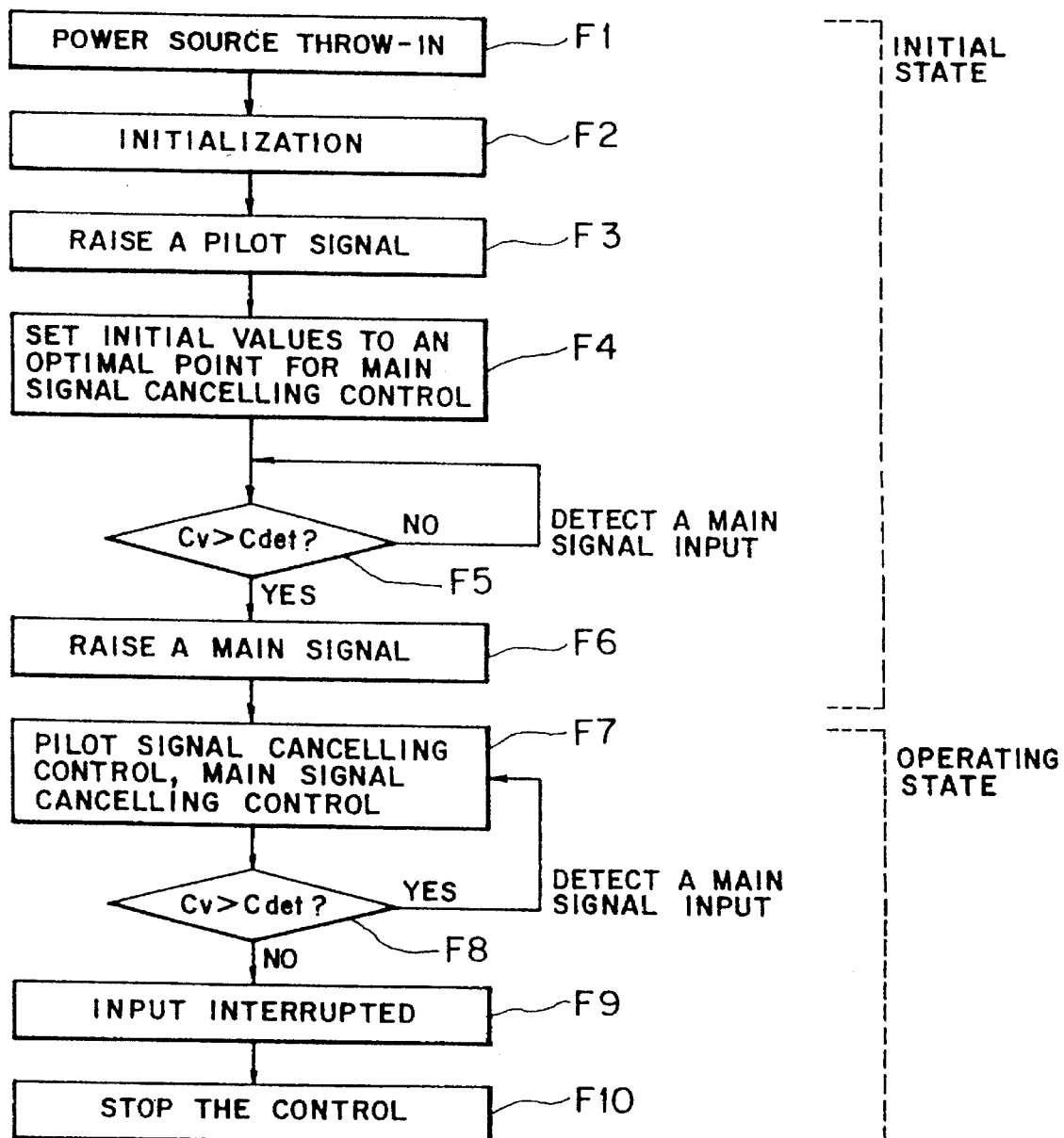
FIG. 15 is a flowchart illustrating the operation of the feed-forward amplifier according to the second modification of the first embodiment.

An operation of the second modified feed-forward amplifier according to the first embodiment of this invention with the above configuration will be next described, referring to a flowchart shown in FIG. 15.

When the power source start-up detecting means 16 detects a throw-on of the power source of the apparatus (Step F1), an initialization of the apparatus is executed (Step F2). The pilot signal generator 12 then generates a pilot signal (Step F3).

The pilot signal is attenuated by the pilot signal attenuator 21, then fed to the main amplifier 11. An attenuation quantity of the pilot signal decreased by the pilot signal attenuator 21 is so controlled by the pilot signal attenuation quantity control means 30 as to be at the maximum when generated, then gradually decreased thereafter.

The control unit 15b sets initial values at an optimal point for the main signal cancelling control (Step F4). More specifically, the control unit 15b sets a phase shifting value for the phase shifter 19 and an attenuation value for the variable attenuator 20 to respective optimal points, thereby conducting the most effectively the main signal cancelling control in a composing point in the front stage in the main signal cancel detector 23.

The judging means 53b in the control unit 15b is applied with a main signal cancelling signal $C_U$ from the main signal cancel detector 23 to judge that the main signal has been inputted when a value of the main signal cancelling signal $C_U$ exceeds the third reference value $C_{det}$ (YES route at Step F5), then detects a rise of the main signal (Step F6).

The inputted main signal is attenuated by the input signal attenuator 18. An attenuation quantity of the main signal decreased by the input signal attenuator 18 is so controlled by the main signal attenuation quantity control means 31 as to be at the maximum when generated, then gradually decreased thereafter.

In the normal operation state after the above process, cancelling control of the main signal and the pilot signal, that is, a feed-forward control, is conducted (Step F7). Whereby, components except components of the main signal, that is, non-linear distortion components generating in the main amplifier 11 and components of the pilot signal, are cancelled so that the main signal can be outputted as an output of the apparatus in a state with less noise.

If the main signal cancelling signal $C_U$ becomes a smaller value than the third reference value $C_{det}$ supplied from the main signal cancel detector 23 while the cancelling control is being conducted on the main signal and the pilot signal (NO route at Step F8), the judging means 53b judges that the input signal has been interrupted (Step F9). The control unit 15b stops the cancelling control operation of the main signal and the pilot signal described above (Step F10), although holding initial setting values such as a phase shifting value for the variable phase shifter 19, an attenuation quantity for the variable attenuator 20 and the like having been set at Step F4.

In the second modified feed-forward amplifier according to the first embodiment of this invention, use of the main signal cancel detector 23 enables detection of an input of the main signal without the input signal detector 17a, further enabling control of the apparatus and a decrease in dimensions of the apparatus.

(b3) Description of Third Modification of the First Embodiment

Next, description will be made of a third modified example of the feed-forward amplifier according to the first embodiment of this invention. The third modified feed-forward amplifier according to the first embodiment has substantially the same configuration shown in FIG. 9. A different point of the third modified examples from the first and second modified feed-forward amplifiers is that a control unit 15c carries out a control in a different mode.

Another elements are basically the same as the first and the second modified examples.

Figure 16:
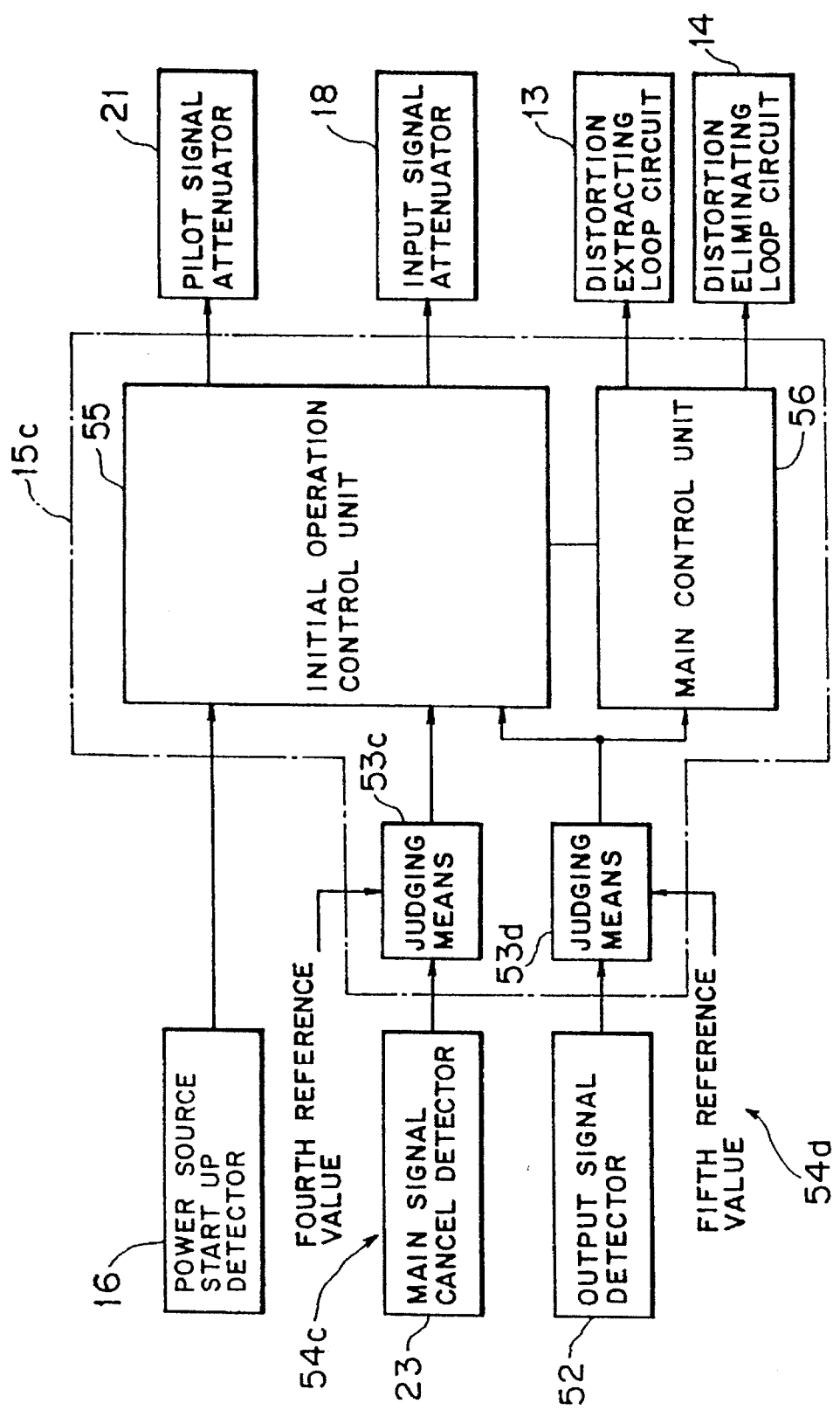
FIG. 16 is a block diagram of a control unit of a feed-forward amplifier according to a third modification of the first embodiment of this invention.

FIG. 16 is a block diagram of the third modified feed-forward amplifier according to the first embodiment of this invention. In FIG. 16, the control unit 15c comprises judging means 53c and 53d, an initial operation control unit 55 and a main control unit 56.

The judging means 53c is applied with the main signal cancelling signal from the main signal cancel detector 23 in an initial state immediately after a star-up of the power source to judge that the main signal has been inputted when the detected main signal cancelling signal exceeds a fourth reference value $C_{det}$ set to a level smaller than the signal cancelling marginal level at the time of the minimum input.

The judging means 53d is applied with an output signal detected by the output signal detector 52 in the normal operation to judge that the main signal has been inputted when the output signal exceeds a fifth reference value $O_{det}$ set to a level smaller than an output signal level at the time of the minimum input.

Here, an input of the main signal is judged by the judging means 53c, not the judging means 53d, in the initial state. A reason of the above is that the fifth reference value $O_{det}$ that is an input detecting point being set under a condition of $O_{Uatt} > O_{det} > O_b$ by the judging means 53d is occasionally unstable since the input signal attenuator 18 is at the maximum, causing a small voltage difference between $O_{Uatt}$ and $O_b$. Here, $O_b$ represents a detector output voltage of a floor noise outputted from the output signal detector 52.

In the normal operation, the main signal is detected by the judging means 53d, not the judging means 53c. In the detection by the judging means 53d, it is possible to set the fifth reference value $O_{det}$ stably since an attenuation quantity for the input signal attenuator 18 is at the minimum, a difference in voltage between $O_{Uatt}$ and $O_b$ being thus large. In contrast, the main signal cancelling control is so conducted as to always minimize $C_U$ in the detection by the judging means 53c. As above, use of the judging means 53d enables more stable detection of the main signal.

The judging means 53c and the main signal cancel detector 23 form a first main signal detecting means 54c, while the judging means 53d and the output signal detector 52 form a second main signal detecting means 54d.

After the power source start-up detector 16 detected a start-up of the power source of the main amplifier 11, the initial operation control unit 55 so controls, with use of results of the judgements made by the power source detector 16 and the judging means 53c as timing information, the pilot signal attenuator 21 as to gradually decrease an attenuation quantity of the pilot signal. After the attenuation quantity of the pilot signal has been gradually decreased by the pilot signal attenuator 21, the initial operation control unit 55 so controls the input signal attenuator 18 as to gradually decrease an attenuation quantity of the main signal.

The initial operation control unit 55 outputs a control signal to the variable phase shifter 19 and the variable attenuator 20 to set initial values for the main signal cancelling control to an optimal point in an input awaiting state upon a throw-on of the power source.

The main control unit 56 outputs a control signal to the variable phase shifters 19,24, and the variable attenuators 20,25 to control the distortion extracting loop circuit 13, the distortion eliminating loop circuit 14 after a control by the initial operation control unit 55, while watching a failure condition of the main amplifier 11 on the basis of a result of the detection by the judging means 53d.

Figure 17:
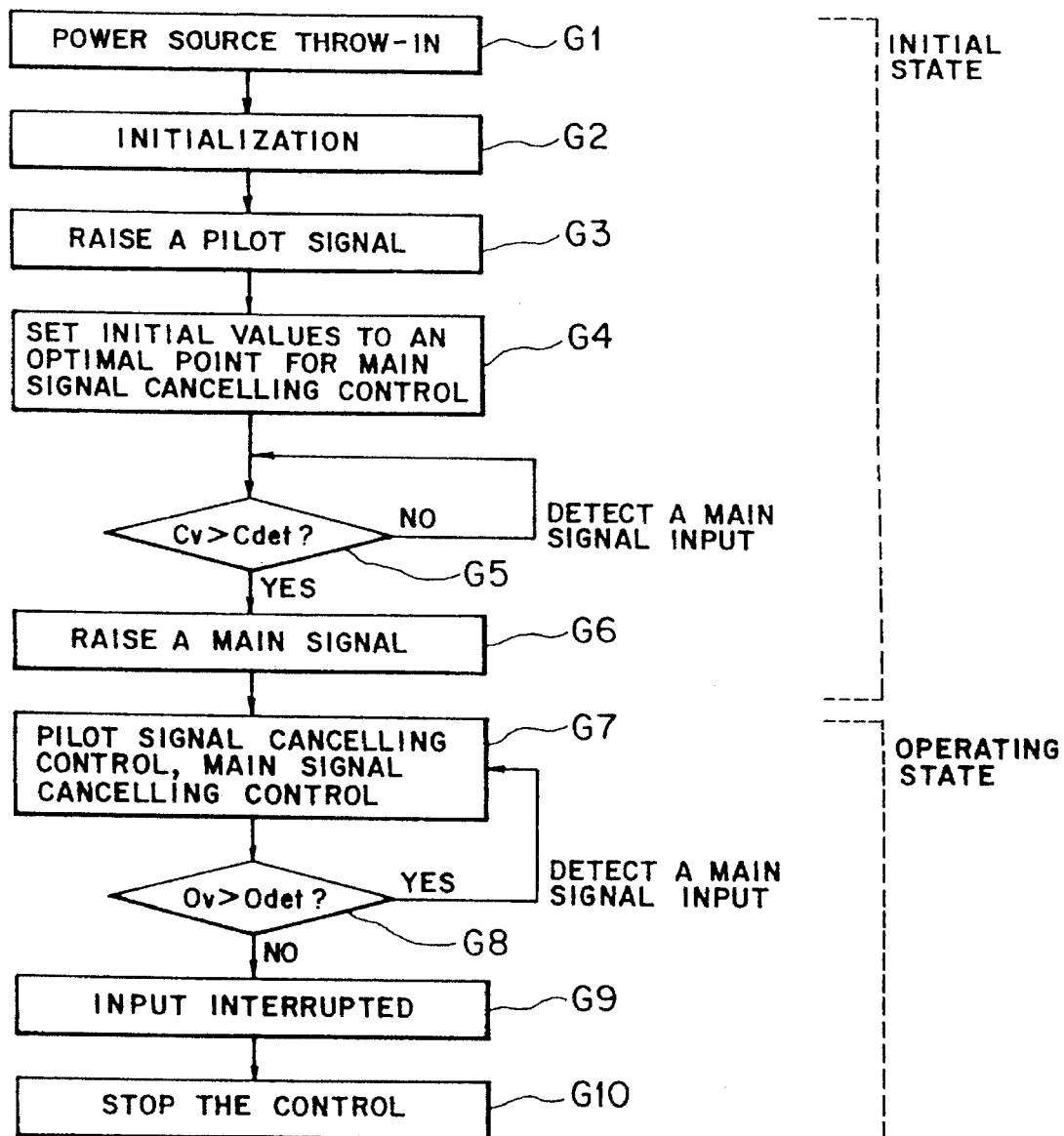
FIG. 17 is a flowchart illustrating an operation of the feed-forward amplifier according to the third modification of the first embodiment.

An operation of the third modified feed-forward amplifier according to the first embodiment of this invention will be next described, referring to a flowchart shown in FIG. 17.

When the power source start-up detector 16 detects a throw-on of the power source of the apparatus (Step G1), an intialization for the apparatus is executed (Step G2). After the intialization, the pilot signal generator 12 generates the pilot signal (Step G3). The pilot signal is attenuated by the pilot signal attenuator 21, then fed to the main amplifier 11. An attenuation quantity of the pilot signal is controlled by the initial operation control unit 55 so as to be at the maximum when generated, then gradually decreased thereafter.

The initial operation control unit 55 sets initial values for an optimal point in the main signal cancelling control (Step G4).

The judging means 53c is applied with the main signal cancelling signal $C_U$ from the main signal cancel detector 23. When the main signal cancelling signal $C_U$ exceeds the fourth reference value $C_{det}$ that has been set (YES route at Step G5), the judging means 53c judges that the main signal has been inputted, and raises the main signal (Step G6).

More specifically, the inputted main signal is attenuated by the input signal attenuator 18. An attenuation quantity of the main signal attenuated by the input signal attenuator 18 is so controlled by the initial operation control unit 55 as to be at the maximum when raised, then gradually decreased thereafter.

In the normal operation after the initial control, the cancelling control of the main signal and the pilot signal, that is, a feed-forward control, is carried out under a control by the main control unit 56 (Step G7). By virtue of the cancelling control of the main signal and the pilot signal, components except components of the main signal, that is, non-linear distortion components generating in the main amplifier 11 and components of the pilot signal, are cancelled so that the main signal can be outputted as an output of the apparatus in a state with less noise.

When the output signal voltage $O_U$ applied to the judging means 53d drops below the fifth reference value $O_{det}$ while the cancelling control is being conducted on the main signal and the pilot signal (NO route at Step G8), the judging means 53d judges that the input signal has been interrupted (Step G9). The control unit 15a stops the cancelling operation of the main signal and the pilot signal (Step G10).

In the third modified feed-forward amplifier according to the first embodiment of this invention, it is possible to highly accurately detect an input of the main signal with use of the man signal cancel detector 23 and the output signal detector 52 without the input signal detector 17a, thereby reducing dimensions of the apparatus and improving the performance of the same.

(b4) Description of Fourth Modification of the First Embodiment

Figure 18:
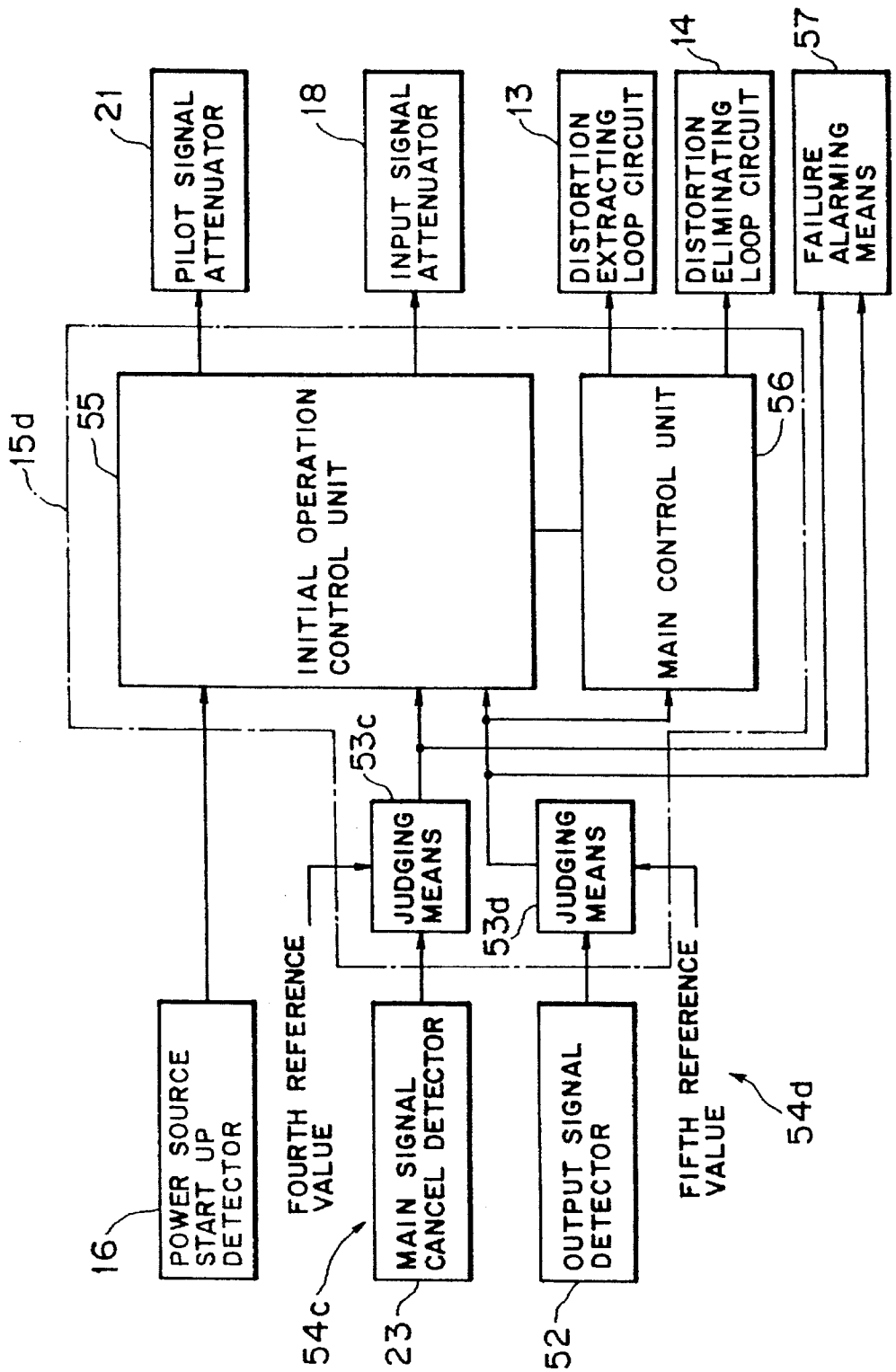
FIG. 18 is a block diagram of a control unit of a feed-forward amplifier according to a fourth modification of the first embodiment of this invention.

FIG. 18 is a block diagram of a control unit of a fourth modified example of the feed-forward amplifier according to the first embodiment of this invention. As shown in FIG. 18, the fourth modified feed-forward amplifier has substantially the same configuration as the third modification mentioned above, excepting that there is provided a failure alarming means 57 which outputs information that the main amplifier 11 is in trouble during a control by the main control unit 56 according to results of the detection by the first main signal detecting means 54c and the second main signal detecting means 54d. Another elements are basically the same as the third modification.

Figure 19:
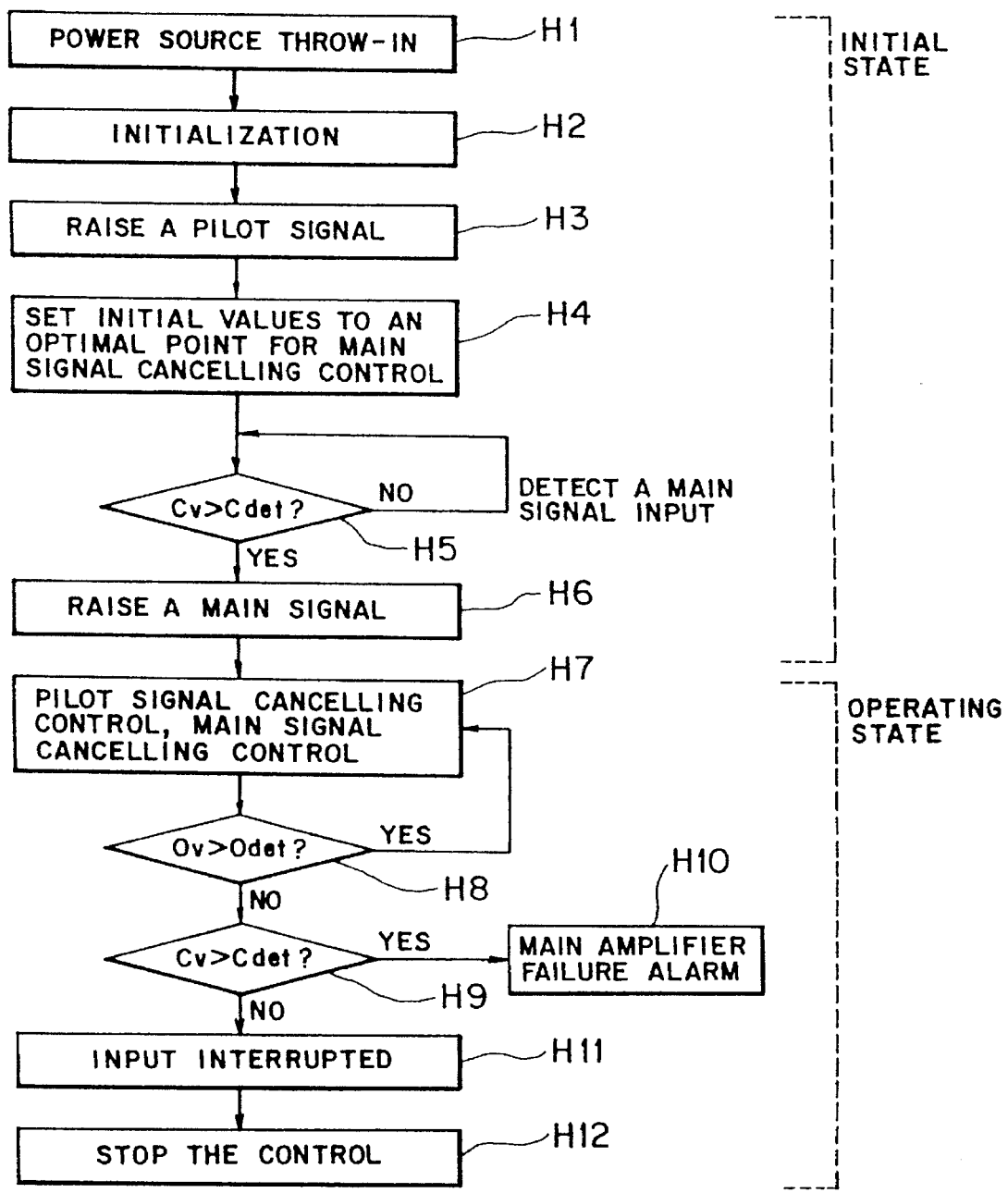
FIG. 19 is a flowchart illustrating an operation of the feed-forward amplifier according to the fourth modification of the first embodiment.

The fourth modified amplifier according to the first embodiment of this invention with such configuration operates as shown in a flowchart in FIG. 19.

Namely, processes from a detection of a throw-on of the power source of the apparatus by the power source start-up detector 16 (Step H1) to a cancelling control of the main signal and the pilot signal under a control by the main control unit 56 in the normal operation (Step H7) are carried out as same as in the firth modification of the first embodiment described hereinbefore.

If the judging means 53d judges that a value of an output signal voltage $O_U$ is smaller than the fifth reference value $O_{det}$ while the cancelling control of the main signal and the pilot signal is being conducted (NO route at Step H8), the judging means 53c compares the main signal cancelling signal $C_U$ applied from the main signal cancel detector 23 with the fourth reference value $C_{det}$ (Step H9).

If a value of the main signal cancelling signal $C_U$ is larger than the fourth reference value $C_{det}$ (YES route at Step H9), it means that the judging means 53c detects an input of the main signal although the judging means 53d detects no input of the main signal. It is, therefore, judged that the main amplifier 11 is in trouble so that information about the trouble is outputted to the failure alarming means 57 (Step H10).

When a value of the main signal cancelling signal $C_U$ becomes smaller than a value of the fourth reference value $C_{det}$ (NO route at Step H9), it is judged that the input signal has been interrupted (Step H11). The control unit 15a stops the cancelling control operation on the main signal and the pilot signal (Step H12).

As above, in the fourth modified feed-forward amplifier according to the first embodiment of this invention, use of the main signal cancel detector 23, the output signal detector 52 and the failure alarming means 57 enables highly accurate detection of the main signal even without the input signal detector 17a while watching a failure of the apparatus, thus contributing a reduction in dimensions, and improvement in performance and reliability of the apparatus.

(b5) Description of Fifth Modification of the First Embodiment

Next description will be of a fifth modified example of the feed-forward amplifier according to the first embodiment of this invention. The fifth modified feed-forward amplifier has substantially the same configuration shown in FIG. 9 as the third modification of the first embodiment, except a mode of a control conducted by a control unit 15e.

In practice, the third modified feed-forward amplifier uses the fourth reference value $C_{det}$ when the judging means 53c judges an input of the main signal. In contrast, in the fifth modification, the judging means 53c in the control unit 15e judges an input of the main signal on the basis of the main signal cancelling signal in a different mode.

Figure 21:
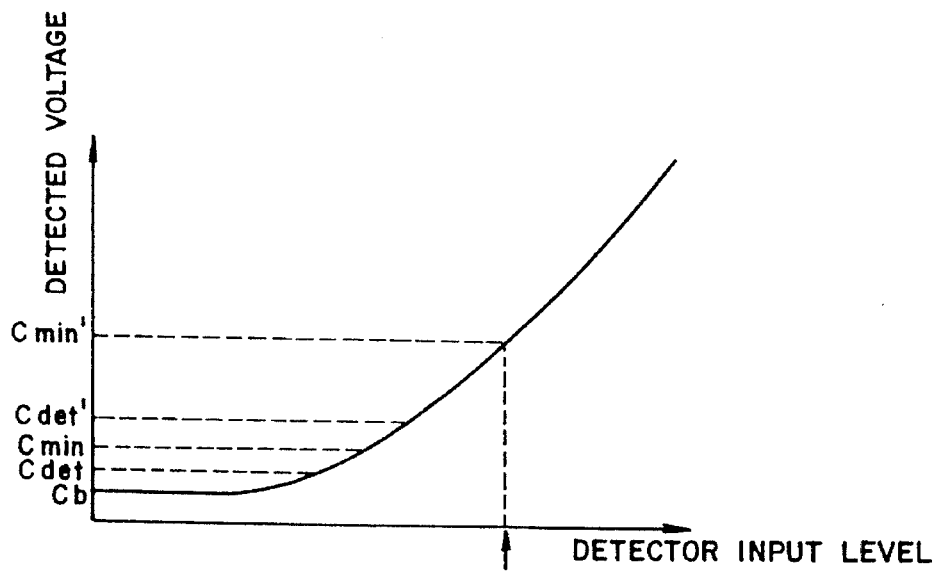
FIG. 21 is a graph showing the reference used to judge an input of the main signal in the feed-forward amplifier according to the fifth modification of the first embodiment.

More specifically, in the fifth modification, the judging means 53c judges an input of the main signal when the main signal cancelling signal detected by the main signal cancel detector 23 exceeds a sixth reference value $C_{det}'$ ($>C_{det}$) that has been set to a level smaller than a level at the time of the initial operation $C_{min}'$ ($>C_{min}$) where the main signal cancelling signal has shifted from the signal cancelling marginal level at the time of the minimum input to a larger level, as shown in FIG. 21. Another elements are basically the same.

Figure 20:
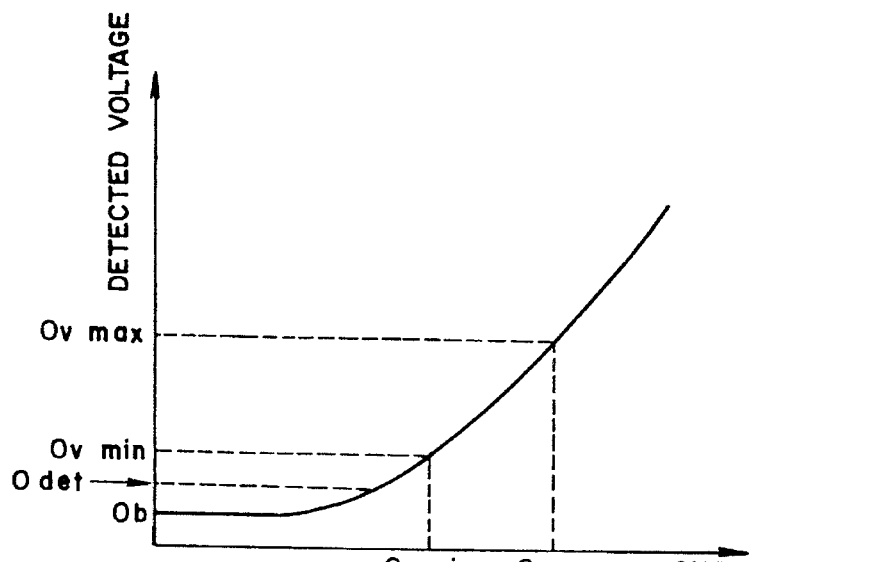
FIG. 20 is a graph showing a reference used to judge an input of the main signal in a feed-forward amplifier according to a fifth modification of the first embodiment of this invention.

The judging means 53d judges that the main signal has been inputted when an output signal detected by the output signal detector 52 exceeds a seventh reference value $O_{det}$ that has been set to a level smaller than an output signal level at the time of the minimum input, as shown in FIG. 20, as same as in the third modification described before.

The judging means 53c and the main signal cancel detector 23 mentioned above form a third main signal detecting means which detects the main signal cancelling signal, and judges an input of the main signal when the main signal cancelling signal exceeds the sixth reference value $C_{det}'$. On the other hand, the judging means 53d and the output signal detector 52 form a fourth main signal detecting means which detects an output signal, and judges an input of the main signal when the output signal exceeds the seventh reference value $O_{det}'$.

In FIG. 20, $O_{Umax}$, represents a detected voltage corresponding to an output signal level $O_{pmax}$ at the time of the maximum input in the normal operation, $O_{Umin}$ represents a detected voltage corresponding to an output signal level $O_{Pmin}$ at the time of the minimum input in the normal operation, and $O_b$ represents a detector output voltage of a floor noise detected by the output signal detector 52.

The initial operation control unit 55 uses results of the detection conducted by the power source start-up detector 16 and the judging means 53 as timing information. When the judging means 53c judges an input of the main signal, the initial operation control unit 55 alters a control setting mode in the variable phase shifter 19 and the variable attenuator 20 so that an initial operation level $C_{min}$ becomes a signal cancelling marginal level $C_{Umin}$ at the time of the minimum input. Under such condition, the initial operation control unit 55 so controls the pilot signal attenuator 21 as to gradually decrease an attenuation quantity of the pilot signal after the start-up of the power source of the main amplifier 11. After the pilot signal attenuator 21 has decreased the attenuation quantity of the pilot signal, the initial operation control unit 55 so controls the pilot signal attenuator 21 and the input signal attenuator 18 as to gradually decrease an attenuation quantity of the main signal.

In other words, by outputting the control signal to the variable phase shifter 19 and the variable attenuator 20, the initial operation control unit 55 shifts a setting value from an optimal point for the main signal cancelling control in an input awaiting state at the time of the throw-on of the power source, then sets again the initial value for the main signal cancelling control to the optimal point after the detection of an input of the main signal.

In an initial state immediately after the signal input, the main signal cancelling signal $C_U$ gets greater so that it is possible to obtain a large difference in voltage between a threshold value $C_{det}$ for the input detection and $C_b$. At the same time, an attenuation quantity of the input signal attenuator 18 is at the maximum so that distortion in a transmitted output is not increased. This enables more stable input detection in the initial state.

Figure 22:
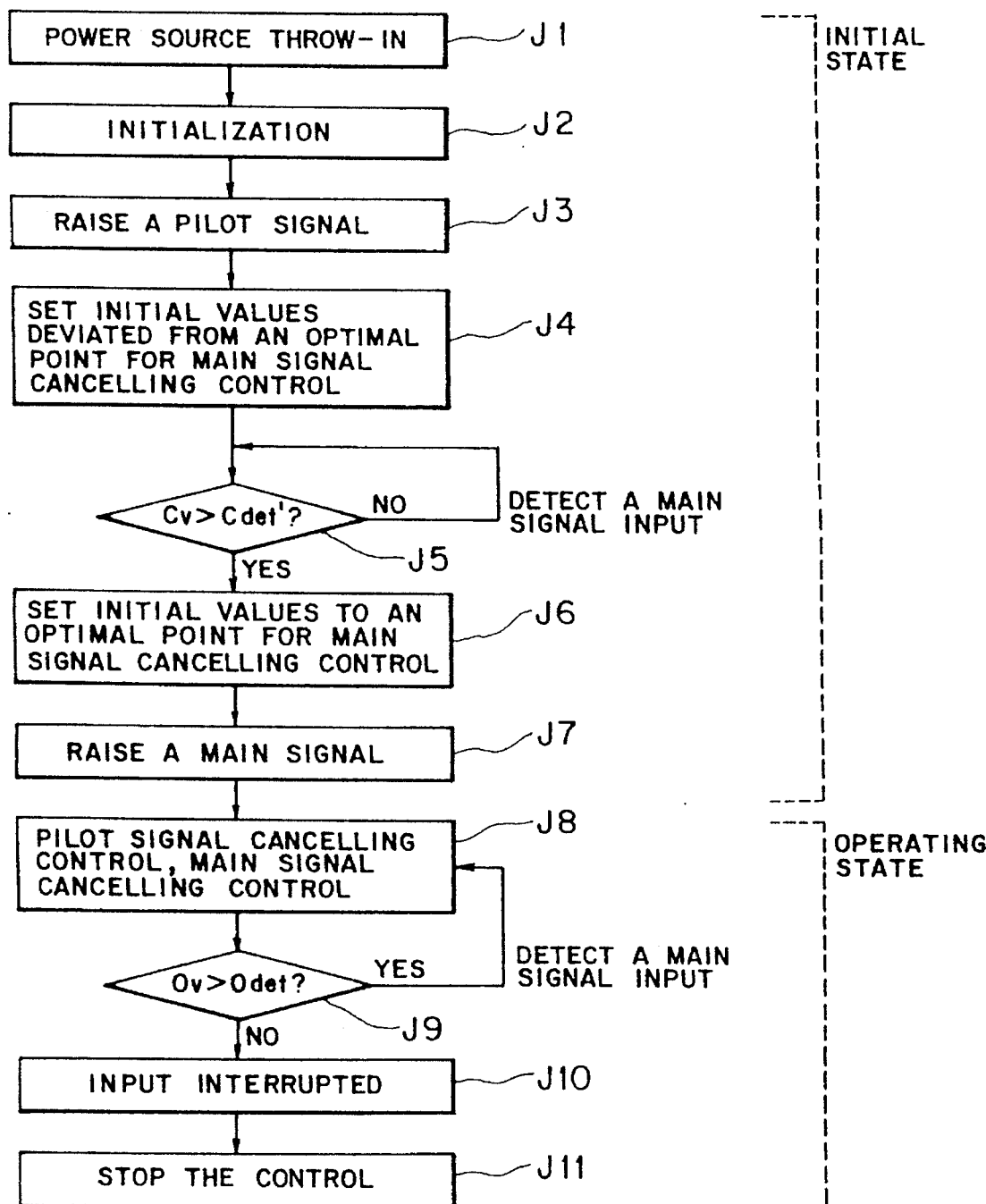
FIG. 22 is a flowchart illustrating an operation of the feed-forward amplifier according to the fifth modification of the first embodiment.

After the control by the initial operation control unit 55, the main control unit 56 controls the distortion extracting loop circuit 13 and the distortion eliminating loop circuit 14 on the basis of a result of the detection by the judging means 53d, while watching a failure condition of the main amplifier 11. The fifth modified feed-forward amplifier according to the first embodiment of this invention with the above configuration operates as shown in a flowchart in FIG. 22.

Similarly to the third modification described hereinbefore, the power source detector 16 detects a start-up of the power source of the apparatus (Step J1), then the intialization is implemented (Step J2). The pilot signal generator 12 generates the pilot signal (Step J3).

The initial operation control unit 55 sets an initial value deviating from an optimal point for the main signal cancelling control (Step J4). More specifically, the initial operation control unit 55 obtain a large main signal cancelling signal $C_U$ detected by the main signal cancelling detector 23, by setting the phase shifting value for the variable phase shifter 19 and the attenuation value for the variable attenuator 20 deviating from the respective optimal points.

The judging means 53c is applied the main signal cancelling signal $C_U$ from the main signal cancel detector 23. When the main signal cancelling signal $C_U$ exceeds the sixth reference value $C_{det}'$ that has been stably set (YES route at Step J5), the initial operation control unit 55 again sets the phase shift value for the variable phase shifter 19 and the attenuation value for the variable attenuator 20 to the respective optimal points (Step J6), judges that the main signal has been inputted, then raises the main signal (Step J7).

The inputted main signal is attenuated by the input signal attenuator 18. An attenuation quantity of the main signal to be attenuated by the input signal attenuator 18 is so controlled by the initial operation control unit 55 as to be at the maximum at the time of a rise of the main signal, then gradually decreased thereafter.

In the normal operation condition after the above control, as same as the above-mentioned third modified example, a cancelling control of the main signal and the pilot signal, that is, a feed-forward control is carried out under a control of the main control unit 56 (Step J8). Whereby, components except components of the main signal, that is, non-linear distortion components generating in the main amplifier 11 and components of the pilot signal, are cancelled so that the main signal can be outputted as an output of the apparatus in a state with less noise.

In the case where the judging means is applied with an output signal voltage $O_U$ from the output signal detector 52 while the cancelling control of the main signal and the pilot signal is being conducted, if the output signal voltage $O_U$ becomes smaller than the fifth reference value $O_{det}$ (NO route at Step J9), the judging means 53d judges that the input signal has been interrupted (Step J10). The control unit 15a stops the cancelling control of the main signal and the pilot signal above described (Step J11).

As above, in the fifth modified feed-forward amplifier according to the first embodiment of this invention, use of the main signal cancel detector 23 and the output signal detector 52 enables a detection of an input of the main signal with a noticeably high-accuracy without employing the input signal detector 17a. This further contributes a reduction in dimensions and improvement in performance of the apparatus.

(B6) Description of Sixth Modification of the First Embodiment

Figure 23:
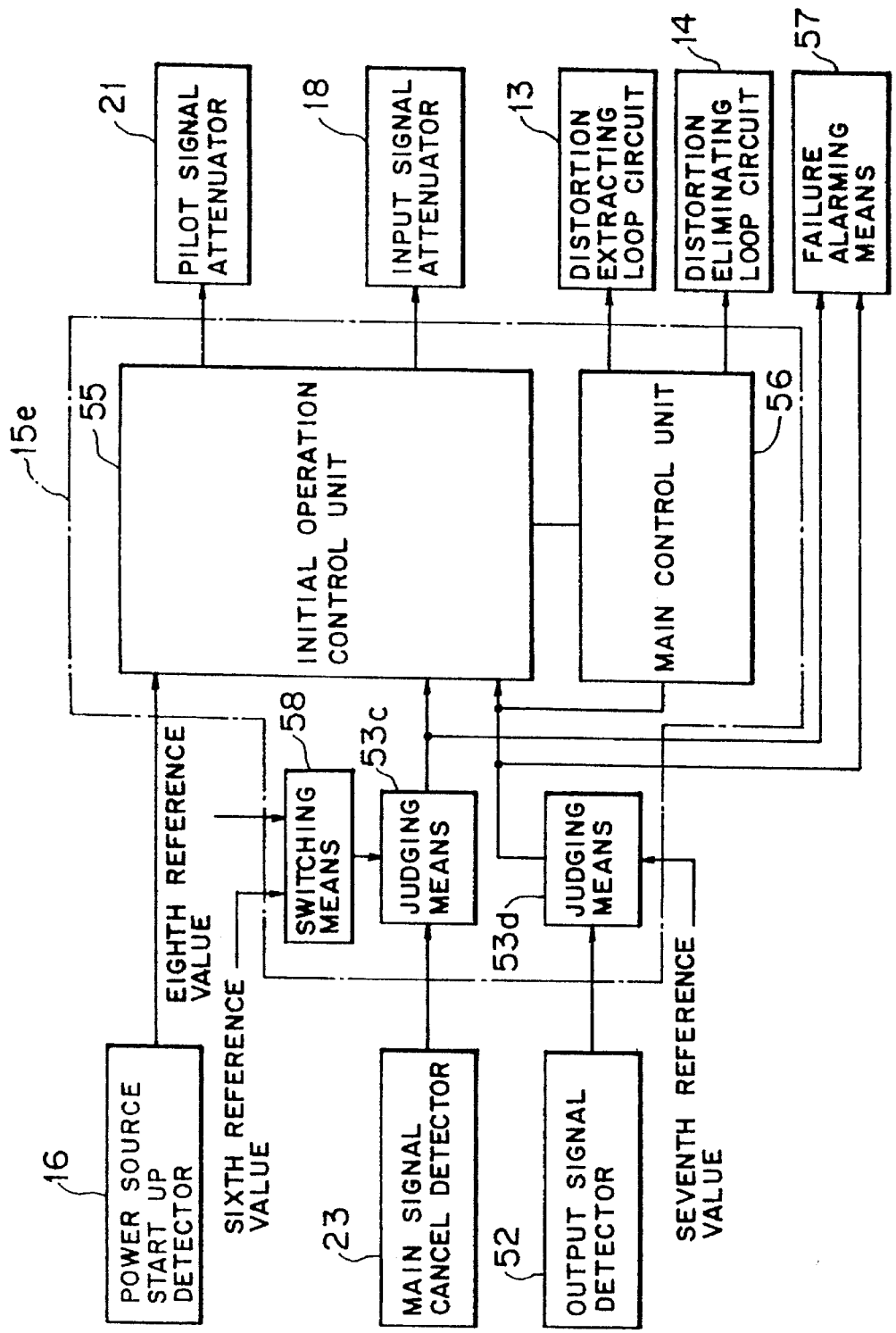
FIG. 23 is a block diagram of a control unit of a feed-forward amplifier according to a sixth modification of the first embodiment of this invention.

FIG. 23 is a block diagram of a control unit in a sixth modified example of the feed-forward amplifier according to the first embodiment of this invention. As shown in FIG. 23, the sixth modified feed-forward amplifier has basically the same configuration as the fifth modification, except that there is provided a failure alarming means which outputs information of a failure of the main amplifier according to a result of the detection by the third main signal detecting means and the fourth main signal detecting means during a control by the main control unit 56.

The judging means 53c in the control unit 15e judges whether the main signal has been inputted or not on the basis of the main signal cancelling signal supplied from the main signal cancel detector 23 if the judging means 53d does not judge an input of the main signal during an operation of the main control unit 56. The judging means 53c has a switching means 58 switching the reference value used for a reference for the above judgement between the sixth reference value and an eighth reference value.

Figure 24:
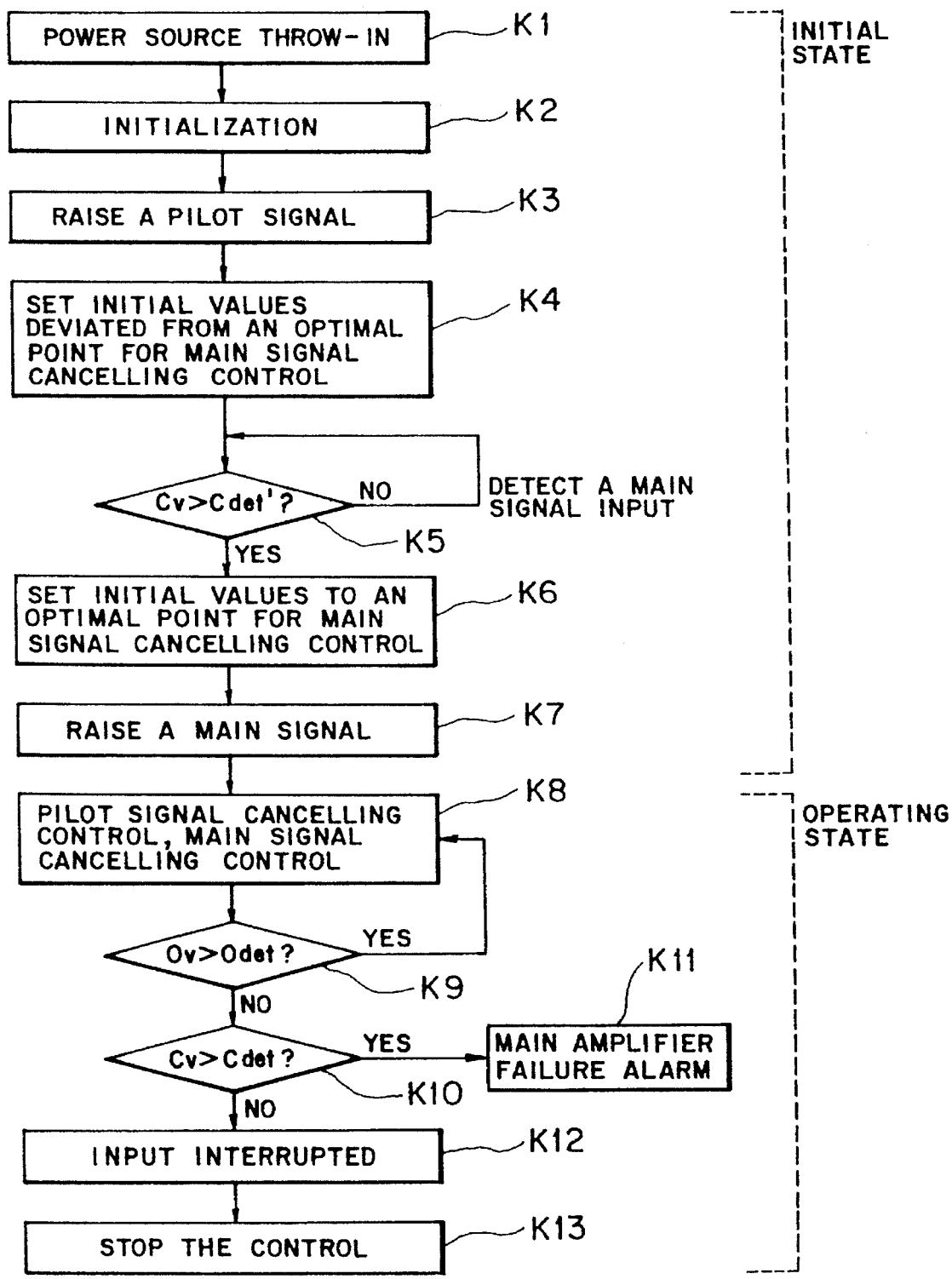
FIG. 24 is a flowchart illustrating an operation of the feed-forward amplifier according to the sixth modification of the first embodiment.

With the above configuration, the sixth modified feed-forward amplifier according to the first embodiment of this invention operates as shown in a flowchart in FIG. 24.

As same as in the fifth modification according to the first embodiment, there is executed the process from a step to detect a throw-on of the power source of the amplifier by the power source start-up detector 16 (Step K1) to a step to control cancellation of the main signal and the pilot signal under a control of the main control unit 56 in the normal operation condition (Step K8).

While the cancelling control of the main signal and the pilot signal is being conducted in the normal operation condition, when the judging means 53d judges that an output signal voltage $O_U$ is smaller than the seventh reference value $O_{det}$ (NO route in Step K9), the judging means 53c compares the main signal cancelling signal $C_U$ supplied from the main signal cancel detector 23 with the eight reference value $C_{det}$ that has been switched over from the sixth reference value by the switching means 58 (Step K10).

If the main signal cancelling signal $C_U$ becomes larger than the eighth reference value $C_{det}$ (YES route at Step K10), the judging means 53c detects an input of the main signal although the judging means 53d detects no input of the main signal. This is judged that the main amplifier 11 is in trouble so that the failure alarming means 57 outputs information of the trouble (Step K11).

If the main signal cancelling signal $C_U$ becomes smaller than the eighth reference value $C_{det}$ (NO route at Step K10), it is judged that the input signal has been interrupted (Step K12), and the control unit 15e stops an operation for the cancelling control of the main signal and the pilot signal (Step K13).

As above, in the sixth modified feed-forward amplifier according to the first embodiment, use of the main signal cancel detector 23, the output signal detector 52 and the failure alarming means 57 enables a noticeably high-accurate detection of an input of the main signal without employing the input signal detector 17a while watching a failure of the amplifier, contributing a reduction in dimensions, and improvement in reliability and performance of the apparatus.

(c) Description of Second Embodiment

A feed-forward amplifier according to a second embodiment has basically the same configuration as the feed-forward amplifier of the first embodiment, except that there is provided a control unit 15A functioning differently from the control unit 15 in the feed-forward amplifier according to the first embodiment.

Figure 25:
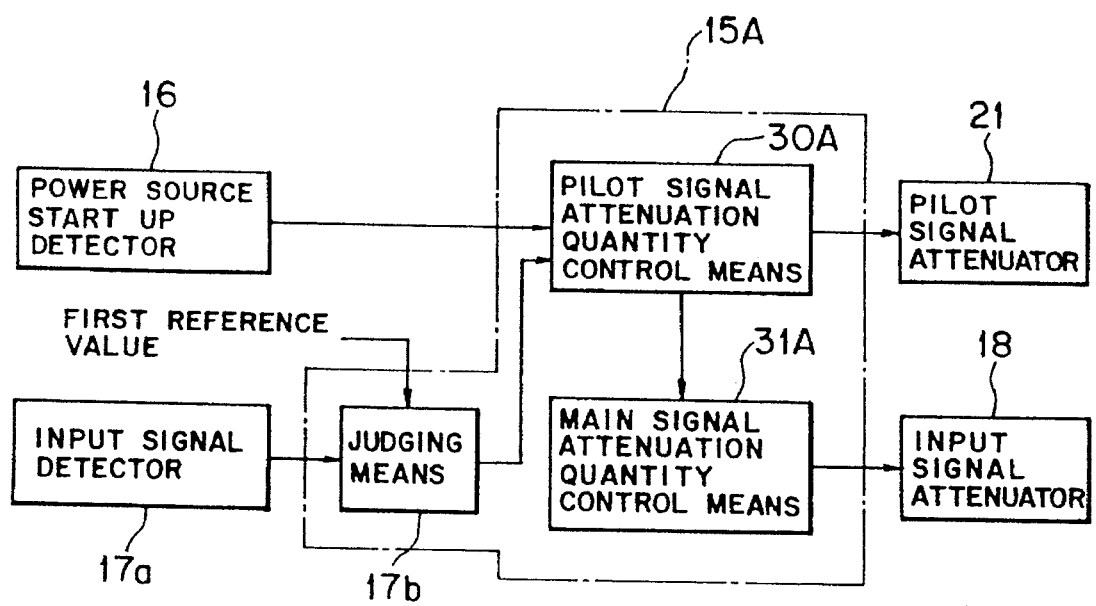
FIG. 25 is a block diagram of a control unit of a feed-forward amplifier according to a second embodiment of this invention.

FIG. 25 is a block diagram of the control unit in the feed-forward amplifier of the second embodiment. The control unit 15A shown in FIG. 25 comprises a pilot signal attenuation quantity control means 30A, a main signal attenuation quantity control means 31A and a judging means 17b having the same function as the judging means according to the first embodiment.

The pilot signal attenuation quantity control means 30A detects a start-up of the power source of the main amplifier 11. If the judging means 17b judges that the main signal has been inputted as an input signal, the pilot signal attenuation quantity control means 30A so controls the pilot signal attenuator 21 as to gradually decrease an attenuation quantity of the pilot signal.

The main signal attenuation quantity control means 31A so control the input signal attenuator 18 as to gradually decrease an attenuation quantity of the main signal after the pilot signal quantity control means 30A has decreased an attenuation quantity of the pilot signal.

An operation of the feed-forward amplifier of a type preventing unwanted waves from generating in the initial operation with the above configuration according to the second embodiment will be described, referring to a timing chart shown in FIGS. 27A through 27E and a flowchart shown in FIG. 26.

When the power source start-up detector 16 throws a power source of the main amplifier 11 to 'on' (referring to time A in FIGS. 27A through 27C at Step B1 in FIG. 26), the control unit 15 carries out an intialization to set control information for a feed-forward control for the apparatus (Step B2). More specifically, in order to prevent unwanted waves from generating in a transient condition of the apparatus immediately after the throw-on of the power source, the control unit 15 sets attenuation quantities for the input signal attenuator 18 and the pilot signal attenuator 21 to respective large values (referring to time A in FIGS. 27A through 27C).

At the time of throw-on of the power source of the main amplifier 11, a pilot signal generator 12 is outputting a pilot signal. This pilot signal is at a sufficiently lower level than, for example, a spurious tolerable level allowed by the Wireless Telegraphy Act, since an attenuation quantity for the pilot signal attenuator 21 is set sufficiently large (referring to time A in FIG. 27B).

Until the input signal detector 17a detects an input of the main signal as an input signal, the control unit 15 controls a variable phase shifter 24 and a variable attenuator 25 referring to detection information of the pilot signal supplied from the pilot signal cancel detector 28, thereby carrying out a cancelling control of the pilot signal (Step B).

When the input signal detector 17a detects an input of the main signal as an input (YES route at Step B4 in FIG. 26), an attenuation quantity of the pilot signal attenuator 21 is decreased under a control of the pilot signal attenuation quantity control means 30A (Step B5, referring to time B in FIG. 27A), and the control unit 15 controls the variable phase shifter 24 and the variable attenuator 25 to conduct a cancelling control of the pilot signal, referring to detected information about the pilot signal supplied from the pilot signal cancel detector 28 (Step B6).

When the main signal is inputted as an input signal, the operation of the pilot signal attenuator 21 causes a level of the pilot signal as an apparatus output to be increased (referring to time B in FIG. 27B), followed by a cancelling control of the pilot signal. Therefore, if an input level to the main amplifier 11 is increased, an output does not exceed the spurious tolerable level since the pilot signal is cancelled by virtue of the following cancelling control of the pilot signal. At this point of time, an attenuation quantity of the input signal attenuator 18 is set at a large value. The main signal outputted as an apparatus output is, therefore, suppressed to a low level (referring to time B in FIG. 27D).

Figure 26:
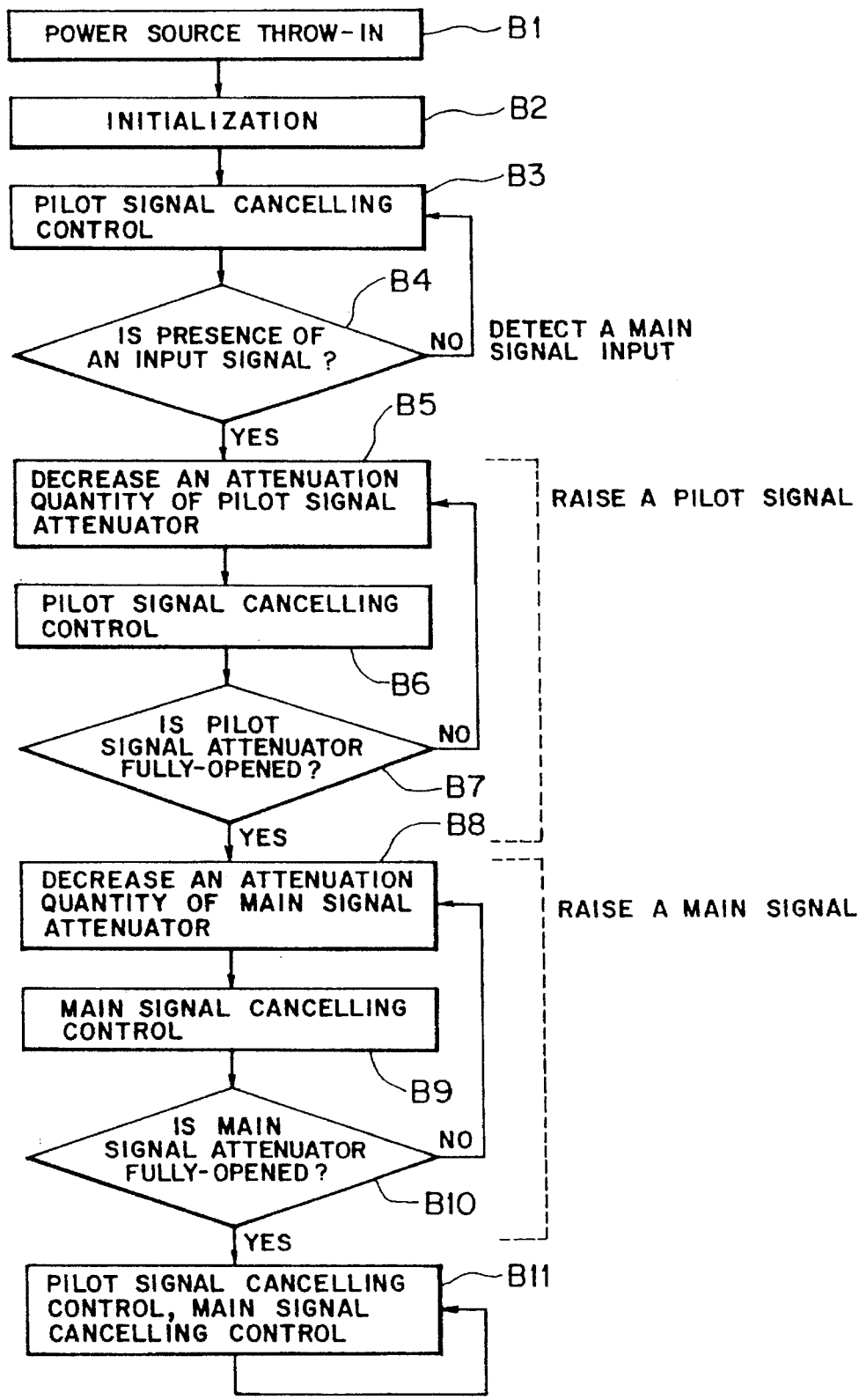
FIG. 26 is a flowchart illustrating an operation of the feed-forward amplifier according to the second embodiment of this invention.
Figure 27A:
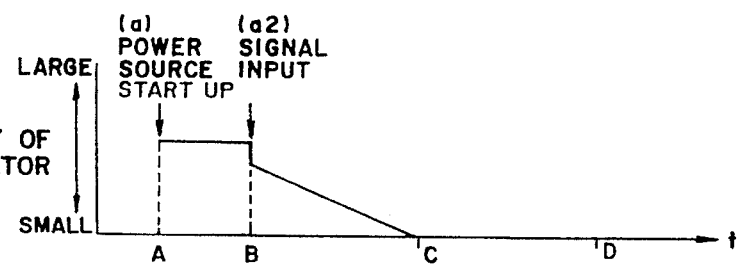
FIGS. 27A through 27E are a timing chart illustrating the operation of the feed-forward amplifier according to the second embodiment.

The cancelling control of the pilot signal is continued by gradually decreasing an attenuation quantity of the pilot signal attenuator 21 until an attenuation quantity of the pilot signal attenuator 21 reaches the minimum (from NO route at Step B7 to Steps B5–B6 in FIG. 26, referring to time B–C in FIG. 27A).

Figure 27B:
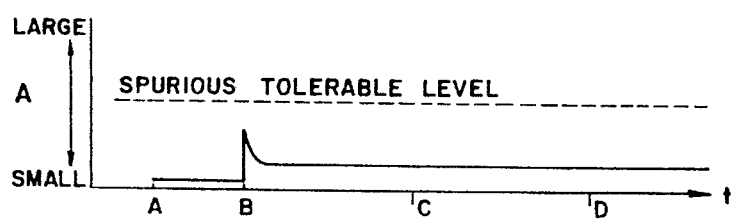
Figure 27C:
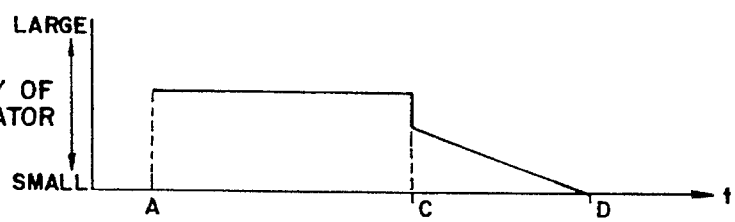

If an attenuation quantity of the pilot signal attenuator 21 reaches the minimum thereafter (YES route at Step B7), control of the main signal attenuation quantity control means 31A causes an attenuation quantity of the input signal attenuator 18 to be decreased (Step B8 in FIG. 26, referring to time C in FIG. 27C). The control unit 15 controls the variable phase shifter 19 and the variable attenuator 20 to cancel the main signal, referring to detection information about the main signal supplied from the main signal cancel detector 23 (Step B9).

Figure 27D:
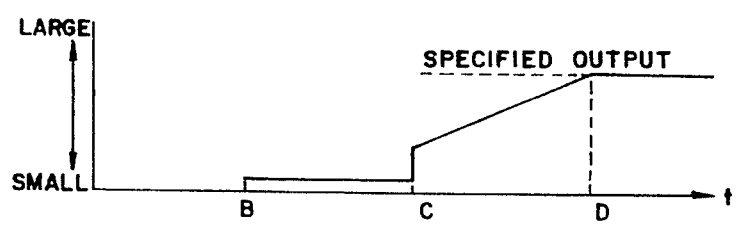
Figure 27E:
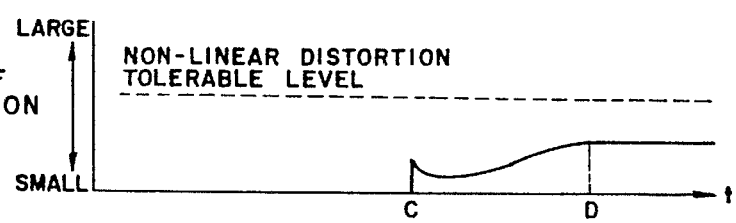

As a result, the level of the main signal to be outputted as an apparatus output may be increased (referring to time C in FIG. 27D). On the other hand, components of non-linear distortion contained in the apparatus output may be suppressed to a sufficiently lower level than the tolerable level by virtue of the cancelling control of the main signal (referring to time C in FIG. 27E).

Next, a cancelling control on the main signal is carried out by gradually decreasing an attenuation quantity of the input signal attenuator 18 until an attenuation quantity of the input signal attenuator 18 reaches the minimum (from NO route at Step B10 to Steps B8–B9 in FIG. 26, referring to time C-D in FIG. 27C).

If an attenuation quantity of the main signal attenuator 18 becomes the minimum thereafter (YES route at Step B10 in FIG. 26, referring to time D in FIG. 27C), the cancelling control of the pilot signal and the main signal, that is, the feed-forward control, is continuously conducted, as same as the process at Step B6 and Step B9 described before (Step B11).

Through the above steps, attenuation quantities of the pilot signal attenuator 21 and the input signal attenuator 18 become the minimum (referring to time D in FIGS. 27A and 27B). The pilot signal and the main signal as an apparatus output may be outputted in a stable state (referring to time D in FIGS. 27B and 27D). The components of the non-linear distortion contained in the apparatus output may be suppressed to a sufficiently lower level than the tolerable level (referring to time D in FIG. 27E).

As above, in the feed-forward amplifier according to the second embodiment of this invention, the output control of the pilot signal and the main signal during the initial operation is conducted in the front stage of the main amplifier 11, in other words, in a state of a small power before amplified so that it is possible to decrease a loss in the course from the output of the main amplifier 11 to the output of the apparatus, further decreasing a power consumption in the apparatus.

(d) Description of Third Embodiment

Figure 28:
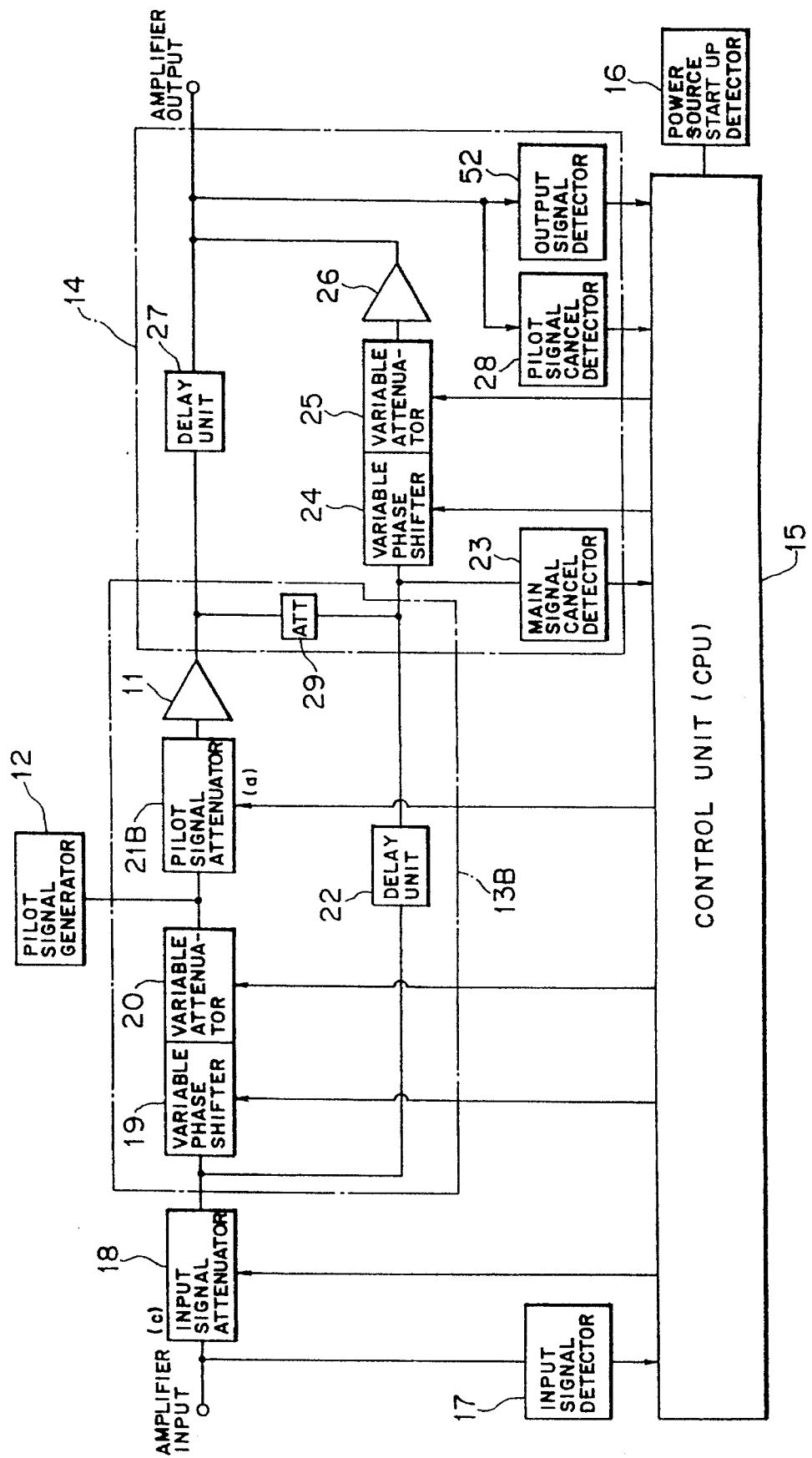
FIG. 28 is a block diagram of a feed-forward amplifier according to a third embodiment of this invention.

FIG. 28 is a block diagram of a feed-forward amplifier according to a third embodiment of this invention. In FIG. 28, the feed-forward amplifier according to the third embodiment has basically the same configuration as that of the feed-forward amplifiers according to the first and second embodiments, except that the pilot signal attenuator 21B is positioned in the main signal path in the front stage of the main amplifier 11, included in a distortion extracting loop circuit 13B.

The distortion extracting loop circuit 13B comprises a variable phase shifter 19, a variable attenuator 20, a pilot signal attenuator 21B, a main amplifier 11 and a delay unit 22.

In the feed-forward amplifier of the third embodiment with the above configuration, an output control of the pilot signal and the main signal during the initial operation is carried out in the front stage of the main amplifier 11 to reduce a loss in the course from the output of the main amplifier 11 to the apparatus output, as same as in the first and second embodiments.

According to the feed-forward amplifier of the third embodiment of this invention, the output control of the pilot signal and the main signal is carried out in the front stage of the main amplifier 11, that is, in a state of a less power before amplified so that a loss in the course from the output of the main amplifier 11 to the apparatus output, further reducing a power consumption in the apparatus.

(e) Description of Fourth Embodiment

Figure 29:
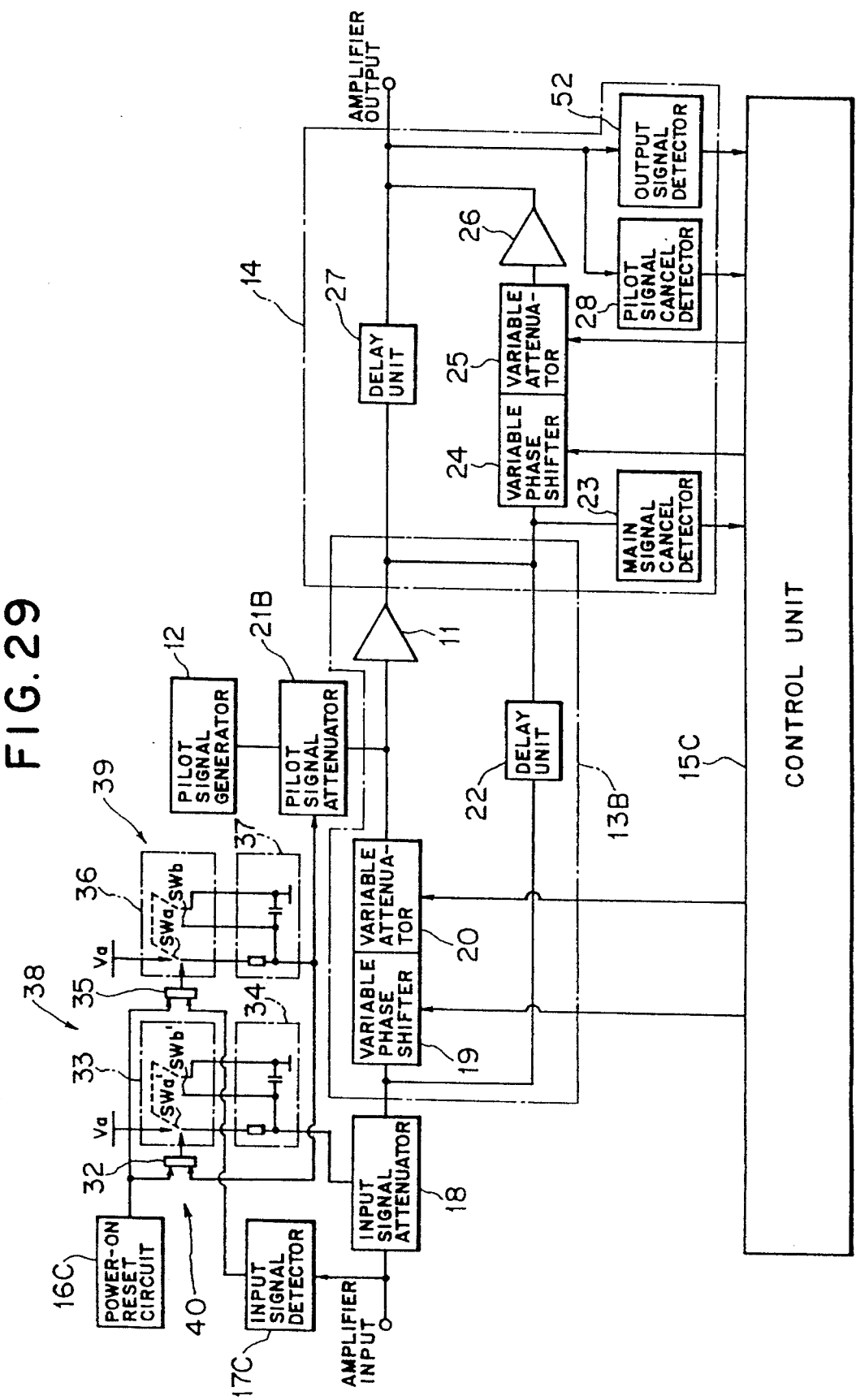
FIG. 29 is a block diagram of a feed-forward amplifier according to a fourth embodiment of this invention.

FIG. 29 is a block diagram of a feed-forward amplifier according to a fourth embodiment of this invention. The feed-forward amplifier according to the fourth embodiment of this invention has a feature that a control over the input signal attenuator 18 and the pilot signal attenuator 21 is carried out by, not a software but a hardware, when compared with the first to third embodiments.

More specifically, reference numeral 16C denotes a power-on reset circuit as a power source start-up detecting means. The power-on reset circuit 16C detects a start-up of the power source of the main amplifier 11, and outputs a signal to selectors 32 and 35, which will be described later.

Reference numeral 17C denotes a main signal detecting circuit as a main signal detecting means. The main signal detecting circuit 17C detects an input of a main signal as an input signal, and outputs a result of this detection to the selector 35.

An input signal attenuator 18 can attenuate the main signal as an input signal on the basis of control information supplied from a control circuit (control unit) 38. The input signal attenuator 18 increases an attenuation quantity when a control voltage inputted thereto is small.

A pilot signal attenuator 21B can attenuate a pilot signal on the basis of control information supplied from the control circuit 38. The pilot signal attenuator 21B increases an attenuation quantity when a control voltage inputted thereto is small.

As seen from the above description, the control circuit 38 controls the input signal attenuator 18 and the pilot signal attenuator 21B. The control circuit 38, therefore, has a pilot signal attenuation quantity control circuit 39 and a main signal attenuation quantity control circuit 40.

When the power-on reset circuit 16C detects a start-up of a power source of a main amplifier 11 and the main signal detecting circuit 17C detects an input of the main signal, the pilot signal attenuation quantity control circuit 39 so controls the pilot signal attenuator 21B as to gradually decrease an attenuation quantity of the pilot signal. The pilot signal attenuation quantity control circuit 39 includes a pilot signal control unit 36 and a first time-constant circuit 37.

When applied information of a start-up of the power source from the power-on reset circuit 16C and detected information of an input of the main signal from the main signal detecting circuit 17C through a selector 35, the pilot signal control unit (a first switch-type control circuit) 36 so controls, in coorporation with the first time-constant circuit 37, the pilot signal attenuator 21B as to gradually decrease an attenuation quantity of the pilot signal. The pilot signal control unit 36 includes two switches SWa and SWb.

When the main signal detecting circuit 17C detects an input of the main signal after the pilot signal attenuation quantity control circuit 39 has initiated an operation to decrease an attenuation quantity of the pilot signal, the main signal attenuation quantity control circuit 40 so controls the input signal attenuator 18 as to gradually decrease an attenuation quantity of the main signal. The main signal attenuation quantity control circuit 40, therefore, has an input signal control unit 33 and a second time-constant circuit 34.

The input signal control unit (a second switch-type control circuit) 33 is applied information that a attenuation quantity of the pilot signal has been decreased by the pilot signal control unit 36 and the first time-constant circuit 37 and information of a start-up of the power source from the power-on reset circuit 16C through a selector 32. The input signal control unit 33, in cooperation with the second time-constant circuit 34, so controls the input signal attenuator 18 as to gradually decrease an attenuation quantity of the main signal. The input signal control unit 33 includes two switches SWa' and SWb'. The control unit 15C does not conduct a control of an attenuation quantities of the input signal attenuator 18 and the pilot signal attenuator 21B, but does control variable phase shifters 19,24 and variable attenuators 20,25, as same as conventional feed-forward amplifiers.

The feed-forward amplifier according to the four embodiment shown in FIG. 29 also has a distortion extracting loop circuit 13B and a distortion eliminating loop circuit 14 having the same functions as those in the feed-forward amplifier of the third embodiment, whose configurations and operations are quite the same as those of the third embodiment, detailed description of which is now skipped.

Figure 30:
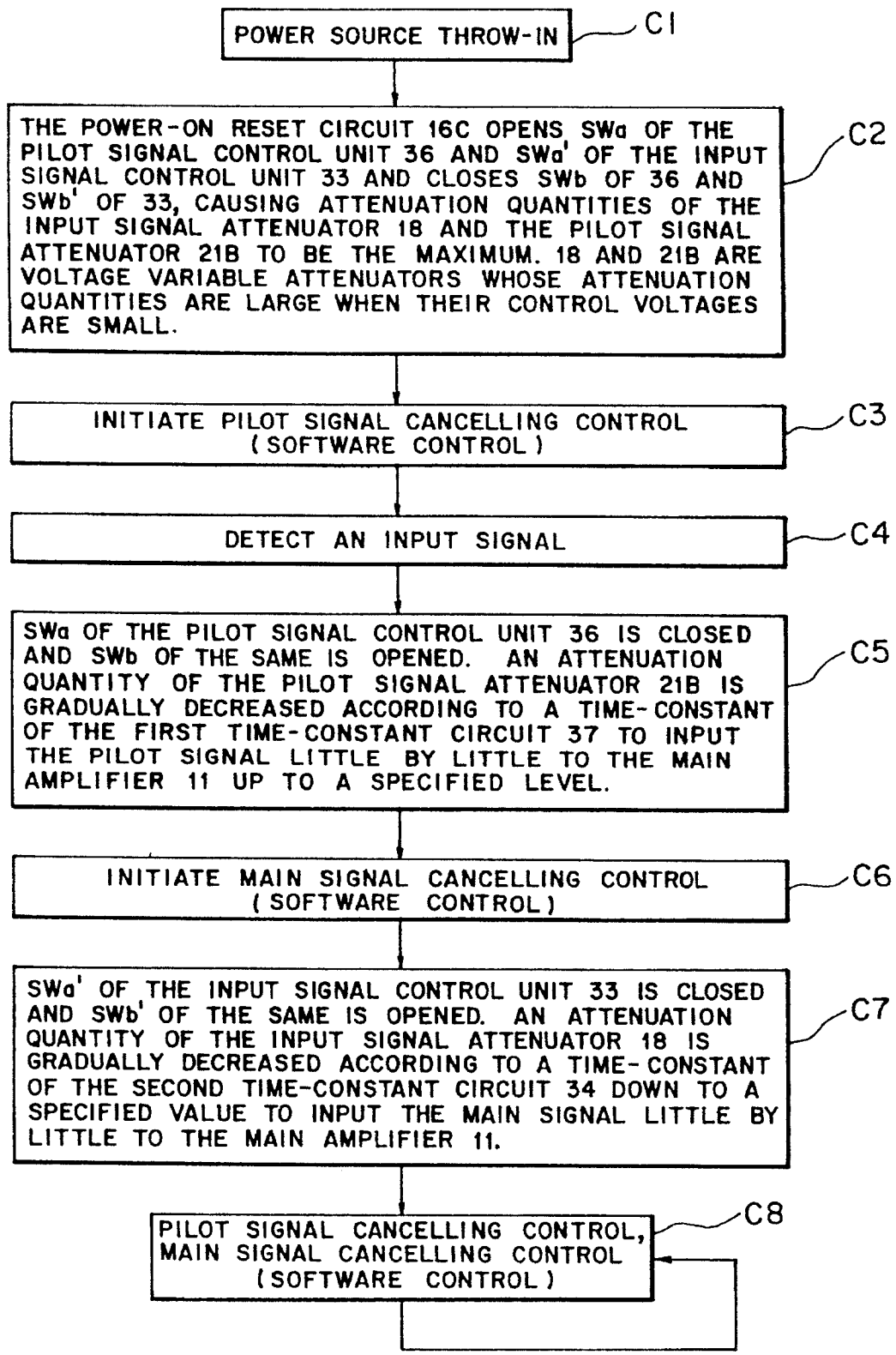
FIG. 30 is a flowchart illustrating an operation of the feed-forward amplifier according to the fourth embodiment.

Description will be next made of an operation of the feed-forward amplifier according to the fourth embodiment, referring to a flowchart shown in FIG. 30 and the timechart for the second embodiment shown in FIGS. 27A through 27E, which has been referred to in connection with the second embodiment hereinbefore.

When the power source of the main amplifier 11 is thrown-on by the power-on reset circuit 16 (Step C1 in FIG. 30, referring to time A in FIGS. 27A through 27C), the switches SWa,SWa' in the input signal control unit 33 and the pilot signal control unit 36 in the control circuit 38 are opened, while the switches SWb,SWb' are shorted (closed). A small voltage is applied to the input signal attenuator 18 and the pilot signal attenuator 21B to maximize attenuation quantities thereof (Step C2).

At a point of time when the power source of the main amplifier 11 is thrown-on, the pilot signal is being outputted from a pilot signal generator 12. However, a large attenuation quantity is set to the pilot signal attenuator 21B, an output signal of the amplifier is thus kept smaller than a spurious tolerable level (referring to time A in FIG. 27B).

Until the main signal detecting circuit 17C detects an input of the main signal, the control unit 15C controls the variable phase shifter 24 and the variable attenuator 25 to carry out a cancelling control of the pilot signal, while referring to detected information of the pilot signal supplied from the pilot signal cancel detector 28 (Step C3).

When the main signal detecting circuit 17C detects an input of the main signal as an input signal (Step C4 in FIG. 30), the switch SWa in the pilot signal control unit 36 is made shorted and the switch SWb is made opened, whereby an attenuation quantity of the pilot signal attenuator 21B is gradually decreased according to a time-constant of the first time-constant circuit 37 to input the pilot signal little by little to the main amplifier 11 up to a limit level (Step C5).

The control unit 15C controls the variable phase shifter 19 and the variable attenuator 20 to carry out the cancelling control of the main signal, referring to detected information of the main signal supplied from the main signal cancel detector 23 (Step C6).

Then, the switch SWa' in the input signal control unit 33 is made shorted while the switch SWb' is made opened, whereby an attenuation quantity of the input signal attenuator 18 is gradually decreased according to a time-constant of the second time-constant circuit 34 down to a specified value (for example, a spurious power allowed by the Wireless Telegraphy Act) to input the main signal to the main amplifier 11 little by little (Step C7).

When an attenuation quantity of the third time-constant circuit 34 reaches the specified value, the cancelling control of the pilot signal and the main signal, that is, a feed-forward control, is successively carried out, as same as in processes at Step 3 and Step 6 (Step C8).

As a result, attenuation quantities of the pilot signal attenuator 21 and the input signal attenuator 18 become minimum (referring to time C in FIGS. 27A and 27C). The pilot signal and the main signal are outputted as an apparatus output in a stable condition (referring to time C in FIGS. 27B and 27D). Non-linear distortion components contained in the apparatus output are suppressed to a level sufficiently smaller than the tolerable level (referring to time C in FIG. 27E).

According to the fourth embodiment, the control circuit 38 provided in the front stage in the main amplifier 11 controls outputs of the pilot signal and the main signal during the initial operation. It is, thus, possible to reduce a loss in the course from the output of the main amplifier 11 to the apparatus output, further reduce a power consumption of the apparatus. It is also possible to enable the initial operation of the feed-forward amplifier without unwanted waves above the specified value being outputted from the apparatus.

Figure 31:
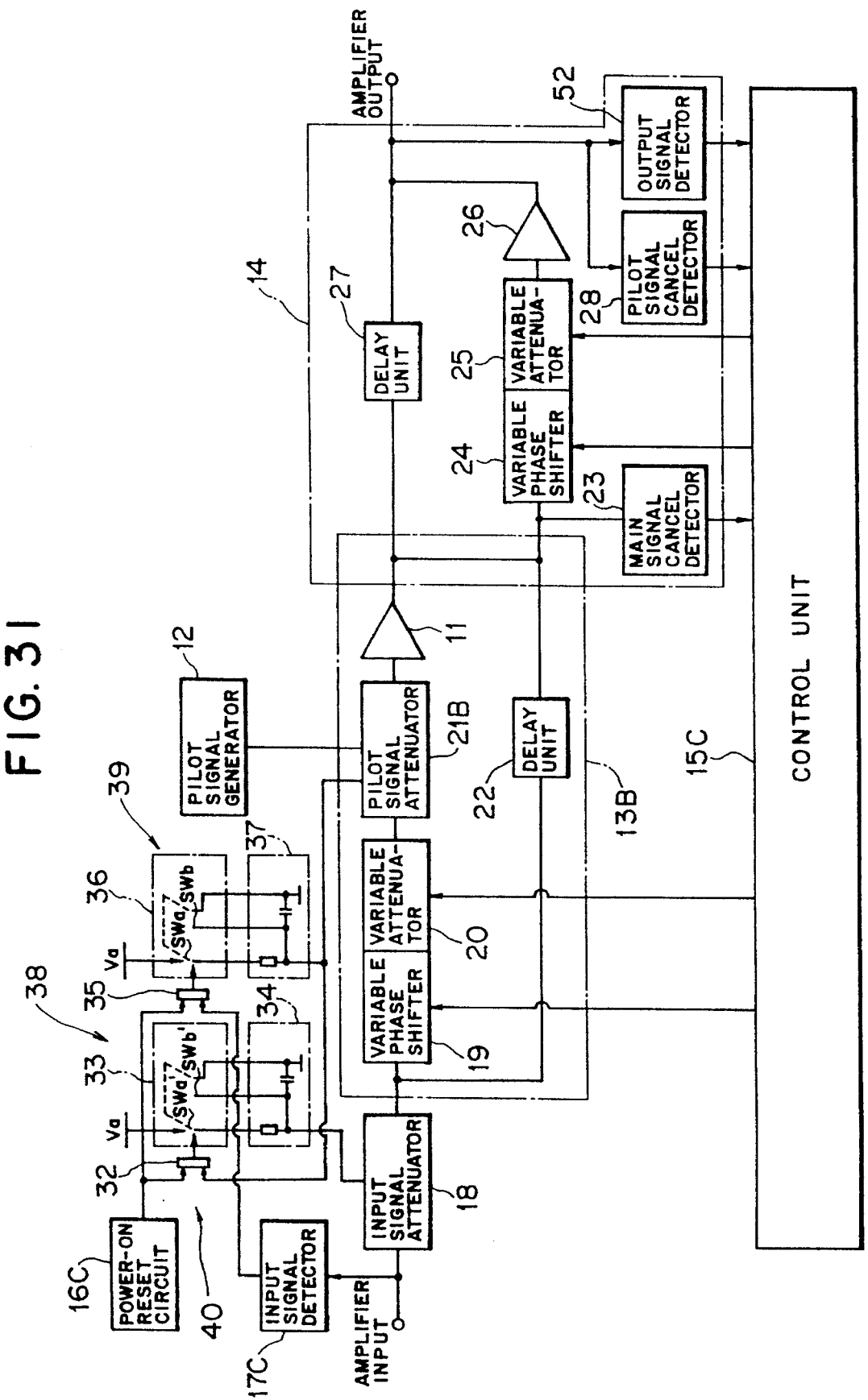
FIG. 31 is a block diagram of a feed-forward amplifier according to a modification of the fourth embodiment of this invention.

In the feed-forward amplifier according to this embodiment, the pilot signal variable attenuator 21B is positioned in the main signal system, but the present invention is not limited to this example. It is possible to position the pilot signal variably attenuator 21B, for example, somewhere on the side of the output of the pilot signal generator 12 branched from the main signal system in the front stage of the main amplifier 11, as shown in FIG. 31.

(f) Description of Fifth Embodiment

Figure 32:
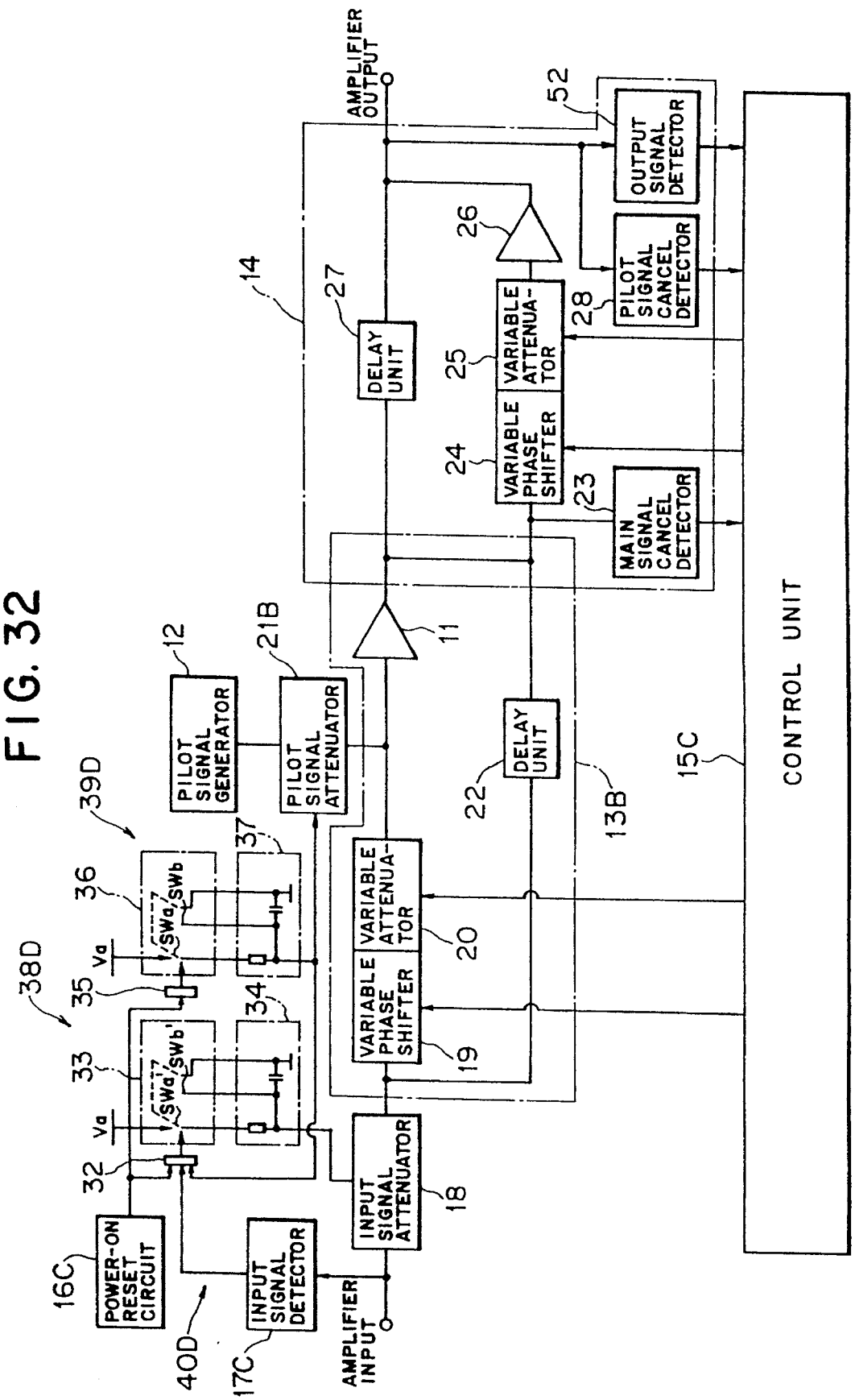
FIG. 32 is a block diagram of a feed-forward amplifier according to a fifth embodiment of this invention.

FIG. 32 is a block diagram of a feed-forward amplifier according to a fifth embodiment of this invention. The feed-forward amplifier according to the fifth embodiment shown in FIG. 32 has a feature that a control over an input signal attenuator 18 and an pilot signal attenuator 21 is carried out by, not a software but a hardware, as same as the feed-forward amplifier according to the fourth embodiment, except for the mode of the control.

Reference numeral 16C denotes a power-on reset circuit as a power source start-up detecting means. The power-on reset circuit 16C detects a start-up of the power source of a main amplifier 11, and outputs a signal to selectors 32,35, which will be described later.

Reference numeral 17C denotes a main signal detecting circuit as a main signal detecting means. The main signal detecting circuit 17C detects an input of a main signal as an input signal, and outputs it to the selector 32.

An input signal attenuator 18 can attenuate the main signal as an input signal on the basis of control information supplied from a control circuit (control unit) 38D. The input signal attenuator 18 increases an attenuation quantity of the main signal when an inputted control voltage is small.

A pilot signal attenuator 21B can attenuate an attenuation quantity of a pilot signal on the basis of the control information supplied from the control circuit 38D. The pilot signal attenuator 21B increases an attenuation quantity of the pilot signal when an input control voltage is small.

Reference numeral 38D denotes the control circuit (a control unit), as described above. The control circuit 38D controls the input signal attenuator 18 and the pilot signal attenuator 21B, including a pilot signal attenuation quantity control circuit 39D and a main signal attenuation quantity control circuit 40D.

When a power-on reset circuit 16C through the selector 35 detects a start-up of a power source of a main amplifier 11, the pilot signal attenuation quantity control circuit 39D so controls the pilot signal attenuator 21B as to gradually decrease an attenuation quantity of the pilot signal. The pilot signal attenuation quantity control circuit 39D includes a pilot signal control unit 36 and the first time-constant circuit 37.

With receipt of information of a start-up of the power source from the power-on reset circuit 16C, the pilot signal control unit (a first switch-type control circuit) 36, in cooperation with the first time-constant circuit 37, so controls the pilot signal attenuator 21B as to gradually decrease an attenuation quantity of the pilot signal. The pilot signal control unit 36 has two switches SWa and SWb.

When the main signal detecting circuit 17C detects an input of the main signal after the pilot signal attenuation quantity control circuit 39 has initiated an operation to decrease an attenuation quantity of the pilot signal, the main signal attenuation quantity control circuit 40D so controls the input signal attenuator 18 as to gradually decrease an attenuation quantity of the main signal. The main signal attenuation quantity control circuit 40D has an input signal control circuit 33 and a second time-constant circuit 34.

If the main signal detecting circuit 17C detects an input of the main signal before an attenuation quantity of the pilot signal decreased by the pilot signal attenuation quantity control circuit 39D falls below a predetermined value, the main signal attenuation quantity control circuit 40D so controls the main signal attenuator 18 as to gradually decrease an attenuation quantity of the main signal after an attenuation quantity of the pilot signal decreased by the pilot signal attenuation quantity control circuit 39D has dropped below the predetermined value.

More specifically, when applied information that an attenuation quantity of the pilot signal has been dropped by the first switch-type control circuit 36 and the first time-constant circuit 37 and information that the power source has started from the power-on reset circuit 16C through the selector 32, an input signal control unit (a second switch-type control circuit) 33 controls, in cooperation with the second time-constant circuit 34, the input signal attenuator 18 so as to gradually decrease an attenuation quantity of the main signal. The input signal control unit 33 has two switches SWa' and SWb'.

The control unit 15C does not control the input signal attenuator 18 and the pilot signal attenuator 21B, but does control variable phase shifters 19,24 and variable attenuators 20,25, as same as in the conventional amplifiers.

The feed-forward amplifier shown in FIG. 32 is provided with a distortion extracting loop circuit 13B and a distortion eliminating loop circuit 14 having the same functions as those in the feed-forward amplifier according to the third and fourth embodiment mentioned hereinbefore, whose configurations and operations are quite the same as those of the third and fourth embodiment having been described hereinbefore, detail description of which is now skipped.

Figure 33:
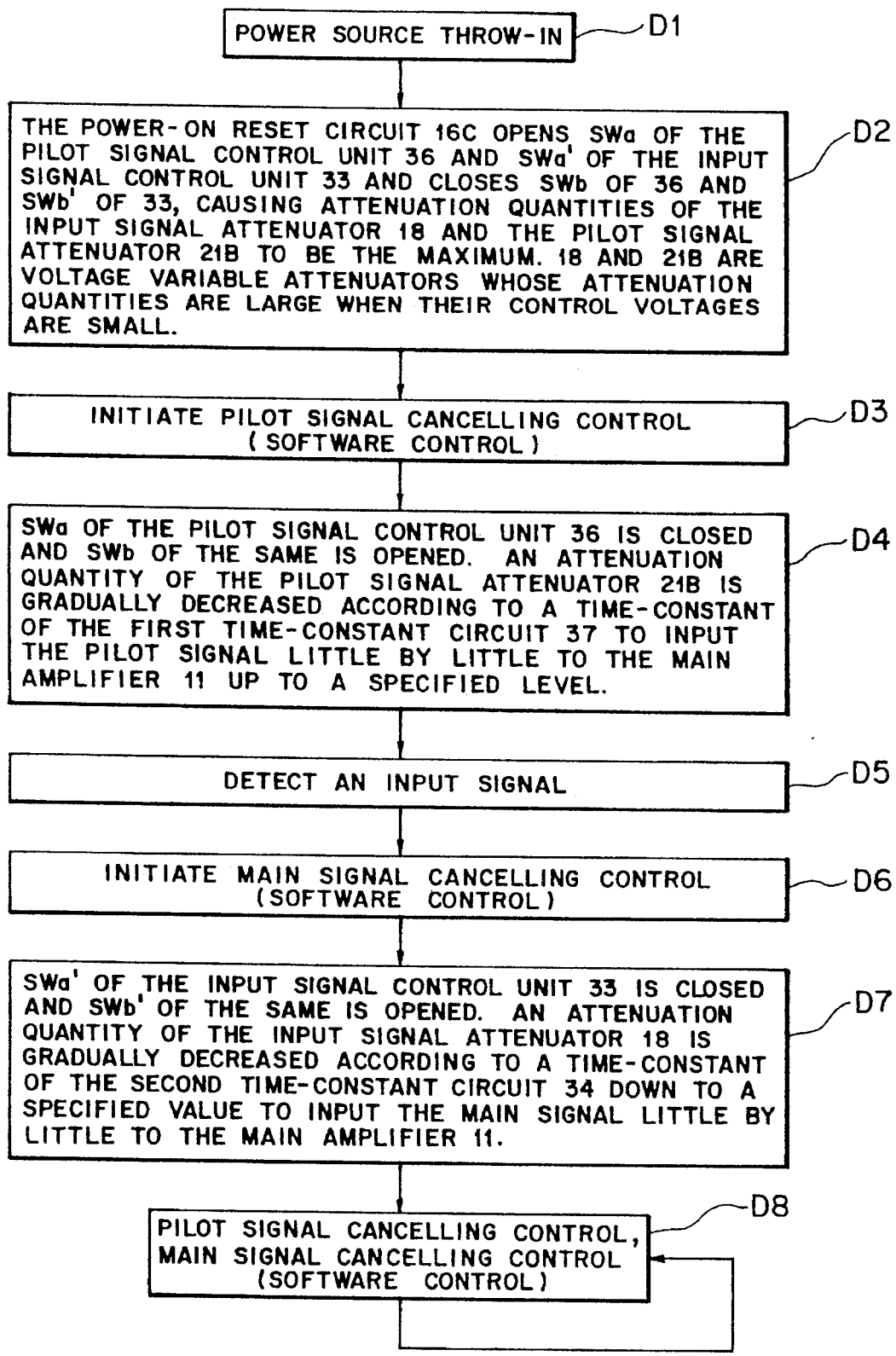
FIG. 33 is a flowchart illustrating an operation of the feed-forward amplifier according to the fifth embodiment.

The feed-forward amplifier according to the fifth embodiment of this invention with the above configuration operates as illustrated in a flowchart in FIG. 33 and the timechart in FIGS. 8A through 8E, which has been referred to in connection with the first embodiment.

When the power-on reset circuit 16 throws the power source of the main amplifier 11 to 'on' Step D1 in FIG. 33, referring to time E in FIGS. 8A through 8C), the switches SWa,SWa' of the input signal control unit 33 and the pilot signal control unit 36 in the control circuit 38D are opened, while the switches SWb,SWb' are shorted (closed) to maximize attenuation quantities of the input signal attenuator 18 and the pilot signal attenuator 21B by applying a small voltage thereto (Step D2).

Until the main signal detecting circuit 17C detects an input of the main signal as an input signal, the control unit 15C controls the variable phase shifter 24 and the variable attenuator 25 to carry out a cancelling control of the pilot signal, referring to detected information of the pilot signal supplied from the pilot signal cancel detector 28 (Step D3).

Next, the switch SWa of the pilot signal control unit 36 is shorted (closed), while the switch SWb is opened, whereby an attenuation quantity of the pilot signal attenuator 21B is gradually decreased according to a time constant of the first time-constant circuit 37 to input the pilot signal to the main amplifier 11 little by little up to a specified level (Step D4).

When the main signal detecting circuit 17C detects an input signal (Step D5), the control circuit 15C controls the variable phase shifter 19 and the variable attenuator 20 to carry out the cancelling control of the main signal, referring to detected information of the main signal supplied form the main signal cancel detector 23 (Step D6).

After that, the switch SWa' of the input signal control unit 33 is shorted (closed), while the switch SWb' is opened so as to gradually decrease an attenuation quantity of the input signal attenuator 18 according to a time constant of the second time-constant circuit 34 up to a specified value, inputting the main signal to the main amplifier 11 little by little (Step D7).

When an attenuation quantity of the second time-constant circuit 34 reaches the specified value, the cancelling control of the pilot signal and the main signal, that is a feed-forward control, is successively carried out, as same as the process at Steps C3 and C6 described hereinabove (Step D8).

As a result, attenuation quantities of the pilot signal attenuator 21 and the input signal attenuator 18 become minimum (referring to time H in FIGS. 8A and 8C). However, the pilot signal and the main signal as an apparatus output are outputted in a stable state (referring to time H in FIGS. 8B and 8D). Non-linear distortion components contained in the apparatus output are suppressed to a level sufficiently lower than a tolerable level (referring to time H in FIG. 8E).

If the main signal is inputted during the process at Step D4, that is, before the cancelling control on the pilot signal is completed, a process at Step D6 and Step D7, that is, the feed-forward process, is initiated, not immediately but after completion of the cancelling control of the pilot signal.

In the feed-forward amplifier according to the fifth embodiment, it is possible to execute the attenuation control of the pilot signal immediately after a start-up of the power source. In consequence, the feed-forward amplifier of the fifth embodiment has an advantage, in addition to the advantages of the fourth embodiment, that it is possible to reduce a time period required from the signal input to a stable feed-forward control, since an operation of only the input signal attenuator 18 is necessary when the signal is inputted.

Figure 34:
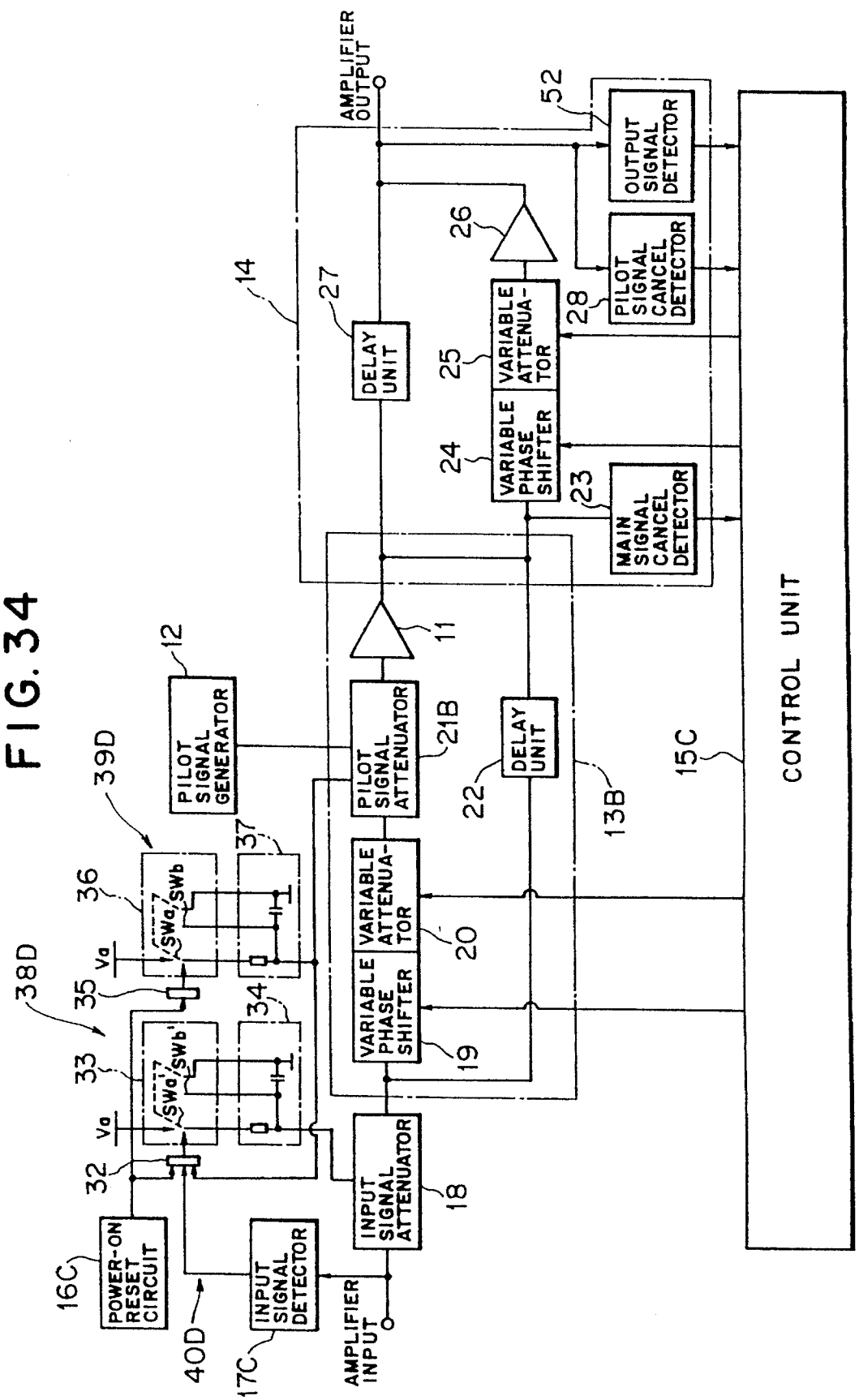
FIG. 34 is a block diagram of a feed-forward amplifier according to a modification of the fifth embodiment of this invention.

In the feed-forward amplifier according to the fifth embodiment, the pilot signal variable attenuator 21B is positioned in a part on the side of the output of the pilot signal generator 12 branched from the main signal path in the front stage of the main amplifier 11. However, the present invention is not limited to the above example, it is possible to position the pilot signal variably attenuator 21B in the main signal system as shown in FIG. 34.

(g) Others

It is possible to apply the models according to the modifications of the first embodiment described before to each model according to the second through fifth embodiments. In which case, the same effects are available.

What is claimed is:

1. A feed-forward amplifier of a type preventing unwanted waves from being outputted in an initial operation having a main amplifier amplifying a main signal in a main signal path, a distortion extracting loop circuit supplying a pilot signal fed from a pilot signal generator to said main signal path and generating a main signal cancelling signal to cancel said main signal outputted from said main amplifier, and a distortion eliminating loop circuit obtaining a signal in which components of said main signal in an output of said main amplifier have been cancelled on the basis of an output of said main amplifier and said main signal cancelling signal fed from said distortion extracting loop circuit in a rear stage of said main amplifier and outputting the components of said main signal obtained from a signal in said main signal path in the rear stage of said main amplifier using said signal in which the components of said main signal have been cancelled, said feed-forward amplifier comprising:

a pilot signal variably attenuating unit attenuating said pilot signal supplied to said main signal path in a front stage of said main amplifier;

a main signal variably attenuating unit attenuating said main signal in said main signal path in said front stage of said main amplifier;

a power source start-up detecting means detecting a start-up of a power source of said main amplifier;

a main signal detecting means detecting an input of said main signal; and a control unit controlling said pilot signal variably attenuating unit so as to gradually decrease an attenuation quantity of the pilot signal using results of detection by said power start-up detecting means and said main signal detecting means as timing information after a start-up of said power source of said main amplifier, and controlling said main signal variably attenuating unit so as to gradually decrease an attenuation quantity of the main signal after said pilot signal variably attenuating unit has decreased an attenuation quantity of the pilot signal.

2. A feed-forward amplifier of a type preventing unwanted waves from being outputted in an initial operation according to claim 1, wherein said pilot signal variably attenuating unit is disposed in said main signal path in the front stage of said main amplifier.

3. A feed-forward amplifier of a type preventing unwanted waves from being outputted in an initial operation according to claim 1, wherein said pilot signal variably attenuating unit is disposed in a part on a side of an output of said pilot signal generator branched from said main signal path in the front stage of said main amplifier.

4. A feed-forward amplifier of a type preventing unwanted waves from being outputted in an initial operation according to claim 1, wherein said control unit comprises:

a pilot signal attenuation quantity control means controlling said pilot signal variably attenuating unit so as to gradually decrease an attenuation quantity of the pilot signal when said power source start-up detecting means detects a start-up of said power source of said main amplifier and said main signal detecting means detects an input of the main signal; and a main signal attenuation quantity control means controlling said main signal variably attenuating unit so as to gradually decrease an attenuation quantity of the main signal after said pilot signal attenuation quantity control means has decreased an attenuation quantity of the pilot signal.

5. A feed-forward amplifier of a type preventing unwanted waves from being outputted in an initial operation according to claim 1, wherein said control unit comprises:

a pilot signal attenuation quantity control means controlling said pilot signal variably attenuating unit so as to gradually decrease an attenuation quantity of the pilot signal when said power source start-up detecting means detects a start-up of said power source of said main amplifier; and a main signal attenuation quantity control means controlling said main signal variably attenuating unit so as to gradually decrease an attenuation quantity of the main signal when said main signal detecting means detects an input of the main signal after said pilot signal attenuation quantity control means has initiated an operation to decrease an attenuation quantity of the pilot signal.

6. A feed-forward amplifier of a type preventing unwanted waves from being outputted in an initial operation according to claim 5, wherein if said main signal detecting means detects an input of the main signal before an attenuation quantity of the pilot signal decreased by said pilot signal attenuation quantity control means drops below a predetermined value, said main signal attenuation quantity control means controls said main signal variably attenuating unit so as to gradually decrease an attenuation quantity of the main signal after the attenuation quantity of the pilot signal decreased by said pilot signal attenuation quantity control means has dropped below the predetermined value.

7. A feed-forward amplifier of a type preventing unwanted waves from being outputted in an initial operation according to claim 1, wherein said power source start-up detecting means is formed as a power-on reset circuit detecting a start-up of said power source of said main amplifier, said main signal detecting means is formed as a main signal detecting circuit detecting an input of the main signal, and said control unit comprises:

a pilot signal attenuation quantity control circuit having a first switch-type control circuit and a first time-constant circuit, said pilot signal attenuation quantity control circuit controlling said pilot signal variably attenuating unit so as to gradually decrease an attenuation quantity of the pilot signal when said power-on reset circuit detects a start-up of said power source of said main amplifier and said main signal detecting circuit detects an input of said main signal; and a main signal attenuation quantity control circuit having a second switch-type control circuit and a second time-constant circuit, said main signal attenuation quantity control circuit controlling said main signal variably attenuating unit so as to gradually decrease an attenuation quantity of the main signal after said pilot signal attenuation quantity control circuit has decreased an attenuation quantity of the pilot signal.

8. A feed-forward amplifier of a type preventing unwanted waves from being outputted in an initial operation according to claim 1, wherein said power source start-up detecting means is formed as a power-on reset circuit detecting a start-up of said power source of said main amplifier, said main signal detecting means is formed as a main signal detecting circuit detecting an input of the main signal, and said control unit comprises:

a pilot signal attenuation quantity control circuit having a first switch-type control circuit and a first time-constant circuit, said pilot signal attenuation quantity control circuit controlling said pilot signal variably attenuating unit so as to gradually decrease an attenuation quantity of the pilot signal when said power-on reset circuit detects a start-up of said power source of said main amplifier; and a main signal attenuation quantity control circuit having a second switch-type control circuit and a second time-constant circuit, said main signal attenuation quantity control circuit controlling said main signal variably attenuating unit to gradually decrease an attenuation quantity of the main signal when said main signal detecting circuit detects an input of the main signal after said pilot signal attenuation quantity control circuit has initiated an operation to decrease an attenuation quantity of the pilot signal.

9. A feed-forward amplifier of a type preventing unwanted waves from being outputted in an initial operation according to claim 8, wherein if said main signal detecting circuit detects an input of the main signal before an attenuation quantity of the pilot signal decreased by said pilot signal attenuation quantity control circuit drops below a predetermined value, said main signal attenuation quantity control circuit controls said main signal variably attenuating unit so as to gradually decrease an attenuation quantity of the main signal after the attenuation quantity of the pilot signal decreased by said pilot signal attenuation quantity control circuit has dropped below the predetermined value.

10. A feed-forward amplifier of a type preventing unwanted waves from being outputted in an initial operation according to claim 1, wherein said main signal detecting means comprises:

an input signal detecting means detecting an input signal to the front stage of said main amplifier; and a judging means judging an input of the main signal when the input signal detected by said input signal detecting means exceeds a first reference value set to a level smaller than a level of the input signal at the time of a minimum input.

11. A feed-forward amplifier of a type preventing unwanted waves from being outputted in an initial operation according to claim 1, wherein said main signal detecting means comprises:

an output signal detecting means detects an output signal from a rear stage of said main amplifier; and a judging means judging an input of the main signal when the output signal detected by said output signal detecting means exceeds a reference value which is set to a level smaller than a level of the output signal at the time of a minimum input.

12. A feed-forward amplifier of a type preventing unwanted waves from being outputted in an initial operation according to claim 1, wherein said main signal detecting means comprises:

a main signal cancelling signal detecting means detects a main signal cancelling signal fed from said distortion extracting loop circuit; and a judging means judging an input of the main signal when the main signal cancelling signal detected by said main signal cancelling signal detecting means exceeds a reference value which is set to a level smaller than a signal cancelling marginal level at the time of a minimum input.

13. A feed-forward amplifier of a type preventing unwanted waves from being outputted in an initial operation having a main amplifier having a front stage and a rear stage and amplifying a main signal in a main signal path, a distortion extracting loop circuit supplying a pilot signal fed from a pilot signal generator to said main signal path and generating a main signal cancelling signal to cancel said main signal outputted from said main amplifier, and a distortion eliminating loop circuit obtaining a signal in which components of said main signal in an output of said main amplifier have been cancelled on the basis of an output of said main amplifier and said main signal cancelling signal fed from said distortion extracting loop circuit in the rear stage of said main amplifier and outputting the components of said main signal obtained from a signal in said main signal path in the rear stage of said main amplifier using said signal in which the components of said main signal have been cancelled, said feed-forward amplifier comprising:

- a pilot signal variably attenuating unit attenuating said pilot signal supplied to said main signal path in the front stage of said main amplifier;
- a main signal variably attenuating unit attenuating said main signal in said main signal path in said front stage of said main amplifier;
- a power source start-up detecting means detecting a start-up of a power source of said main amplifier;
- a first main signal detecting means having a main signal cancelling signal detecting means detecting a main signal cancelling signal fed from said distortion extracting loop circuit and a judging means judging an input of the main signal when the main signal cancelling signal detected by said main signal cancelling signal detecting means exceeds a reference value which is set to a level smaller than a signal cancelling marginal level at the time of a minimum input;
- a second main signal detecting means having an output signal detecting means detecting an output signal from the rear stage of said main amplifier and a judging means judging an input of the main signal when the output signal detected by said output signal detecting means exceeds a reference value which is set to a level smaller than a level of the output signal level at the time of a minimum input;
- an initial operation control unit controlling said pilot signal variably attenuating unit so as to gradually decrease an attenuation quantity of the pilot signal using results of detection by said power source start-up detecting means and said first main signal detecting means as timing information after a start-up of said power source of said main amplifier, and controlling said main signal variable attenuating unit so as to gradually decrease an attenuation quantity of the main signal after said pilot signal variably attenuating unit has decreased the attenuation quantity of the pilot signal; and
- a main control unit controlling said distortion extracting loop circuit and said distortion eliminating circuit on the basis of a result of detection by said second main signal detecting means after a control by said initial operation control unit while watching a failure condition of said main amplifier.

14. A feed-forward amplifier of a type preventing unwanted waves from being outputted in an initial operation according to claim 13, wherein said feed-forward amplifier further comprises a failure alarming means outputting information that the main amplifier is in trouble depending on results of detection by said first main signal detecting means and said second main signal detecting means during a control by said main control unit.

15. A feed-forward amplifier of a type preventing unwanted waves from being outputted in an initial operation having a main amplifier having a front stage and a rear stage and amplifying a main signal in a main signal path, a distortion extracting loop circuit supplying a pilot signal fed from a pilot signal generator to said main signal path and generating a main signal cancelling signal to cancel said main signal outputted from said main amplifier, and a distortion eliminating loop circuit obtaining a signal in which components of said main signal in an output of said main amplifier have been cancelled on the basis of an output of said main amplifier and said main signal cancelling signal fed from said distortion extracting loop circuit in said rear stage of said main amplifier and outputting the components of said main signal obtained from a signal in said main signal path in said rear stage of said main amplifier using said signal in which the components of said main signal have been cancelled, said feed-forward amplifier comprising:

- a pilot signal variably attenuating unit attenuating said pilot signal supplied to said main signal path in said front stage of said main amplifier;
- a main signal variably attenuating unit attenuating said main signal in said main signal path in said front stage of said main amplifier;
- a power source start-up detecting means detecting a start-up of a power source of said main amplifier;
- a first main signal detecting means having a main signal cancelling signal detecting means detecting a main signal cancelling signal fed from said distortion extracting loop circuit and a judging means judging an input of the main signal when the main signal cancelling signal detected by said main signal cancelling signal detecting means exceeds a reference value which is set to a level smaller than an initial operation level set larger than a signal cancelling marginal level at the time of a minimum input;
- a second main signal detecting means having an output signal detecting means detecting an output signal from the rear stage of said main amplifier and a judging means judging an input of the main signal when the output signal detected by said output signal detecting means exceeds a reference value which is set to a level smaller than a level of the output signal level at the time of the minimum input;
- an initial operation control unit altering a control setting mode in said distortion extracting loop circuit so that said initial operation level is a signal cancelling marginal level after said first main signal detecting means has detected an input of the main signal with use of results of detection by said power source start-up detecting means and said first main signal detecting means, under such condition, said initial operation control unit controlling said pilot signal variably attenuating unit so as to gradually decrease an attenuation quantity of the pilot signal, and controlling said main signal variably attenuating unit so as to gradually decrease an attenuation quantity of the main signal after said pilot signal variably attenuating unit has decreased the attenuation quantity of the pilot signal; and
- a main control unit controlling said distortion extracting loop circuit and said distortion eliminating loop circuit on the basis of a result of detection by said second main signal detecting means after a control by said initial operation control unit, while watching a failure condition of said main amplifier.

16. A feed-forward amplifier of a type preventing unwanted waves from being outputted in an initial operation according to claim 15, wherein said feed-forward amplifier further comprises:

- a third main signal detecting means having a main signal cancelling signal detecting means detecting a main signal cancelling signal fed from said distortion extracting loop circuit and a judging means judging an input of the main signal when the main signal cancelling signal detected by said main signal cancelling signal detecting means exceeds a reference value which is set to a level smaller than the signal cancelling marginal level at the time of a minimum input; and a failure alarming means outputting information that said main amplifier is in trouble depending on results of detection by said second main signal detecting means and said third main signal detecting means during a control by said main control unit.

* * * * *